United States Patent [19]

Marsland

[11] Patent Number: 5,121,067
[45] Date of Patent: Jun. 9, 1992

[54] DIRECTIONAL SAMPLING BRIDGE

[75] Inventor: Robert A. Marsland, Stanford, Calif.

[73] Assignee: Board of Regents of Leland Stanford University, Stanford, Calif.

[21] Appl. No.: 501,695

[22] Filed: Mar. 29, 1990

Related U.S. Application Data

[63] Continuation-in-part of Ser. No. 259,027, Oct. 12, 1988, which is a continuation-in-part of Ser. No. 106,554, Oct. 6, 1987, Pat. No. 5,014,018.

[51] Int. Cl.$^5$ .................................................. G01R 27/02
[52] U.S. Cl. ..................................... 324/637; 324/638; 324/648
[58] Field of Search ............... 324/647, 648, 637, 638, 324/646

[56] References Cited

U.S. PATENT DOCUMENTS

| 3,268,807 | 8/1966 | Shively | 324/648 X |
| 4,758,776 | 7/1988 | Griffin | 324/638 |
| 4,896,096 | 1/1990 | Ewart | 324/637 X |
| 4,962,359 | 10/1990 | Dunsmore | 324/637 X |

FOREIGN PATENT DOCUMENTS 0219991 9/1986 European Pat. Off.
0311406 10/1988 European Pat. Off.

OTHER PUBLICATIONS

Soviet Inventions Illustrated, section E1: Electrical, week 8803, Mar. 2, 1988, Derwent Publications Ltd., London S01.

Primary Examiner—Kenneth A. Wieder
Assistant Examiner—Glenn W. Brown
Attorney, Agent, or Firm—Skjerven, Morrill, MacPherson, Franklin & Friel

[57] ABSTRACT

A floating sampler and directional bridge for use in characterizing the impedance of an integrated device under test from D.C. up to frequencies above 100 GHz. The directional bridge has the structure of a Wheatstone bridge with resistor values selected such that when the input impedance of the device under test matches the output impedance of the source, no voltage develops across two nodes of the bridge. When no impedance match exists, a floating diode/capacitor sampler comprised of two diode/capacitor pairs driven by local oscillator strobe pulses samples the voltage difference between the two nodes of the bridge and outputs an IF signal proportional to the difference. Another pair of diode/capacitor samplers outputs an IF signal proportional to the amplitude of the RF excitation waveform.

10 Claims, 23 Drawing Sheets

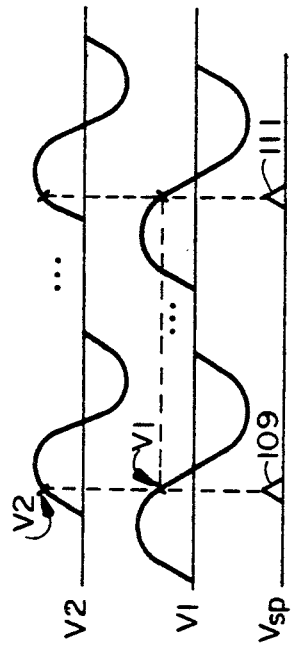
| NODE | VOLTAGE $V_{sp}$ ON $V1$ ON $V2$ ON |
|---|---|
| (A) 91 | $V1$ |
| (B) 97 | $\frac{V_{sp}+V1-V2}{2}$  DC = 0  AC = $\frac{-V_{sp}+V2}{2}$ |
| (C) 87 | $\frac{-V_{sp}}{2}+V1-V2$ |
| (D) 99 | $\frac{V_{sp}+V2}{2}$ |
| (E) 89 | $2(V1-V2)$ |
| (B)+(D) | |
FIG. 7D
FIG. 7C
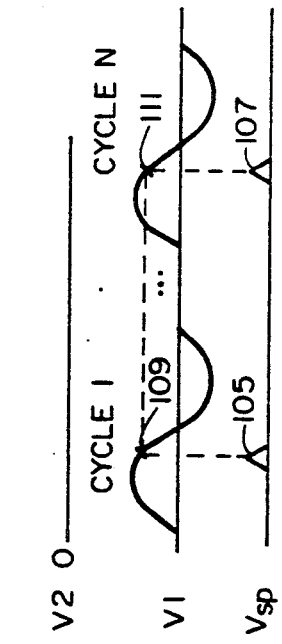
| NODE | VOLTAGE $V_{sp}$ ON $V1$ ON $V2$ OFF |
|---|---|
| (A) 91 | $V1$ |
| (B) 97 | $\frac{V_{sp}+V1}{2}$  DC = 0  AC = $\frac{-V_{sp}}{2}$ |
| (C) 87 | $\frac{-V_{sp}}{2}+V1$ |
| (D) 99 | $\frac{V_{sp}}{2}$  DC = 0  AC = $\frac{+V_{sp}}{2}$ |
| (E) 89 | |
FIG. 7B
FIG. 7A

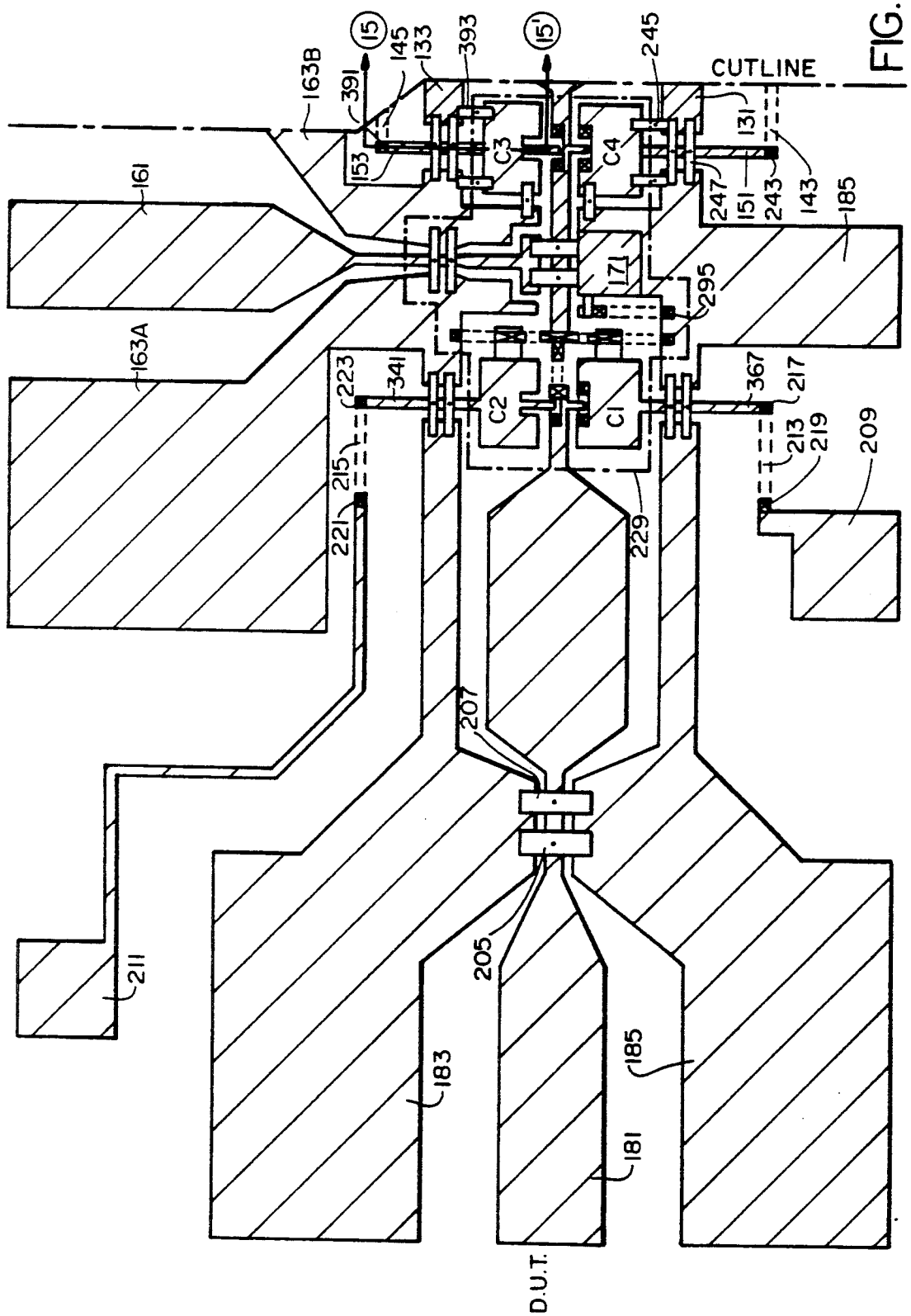

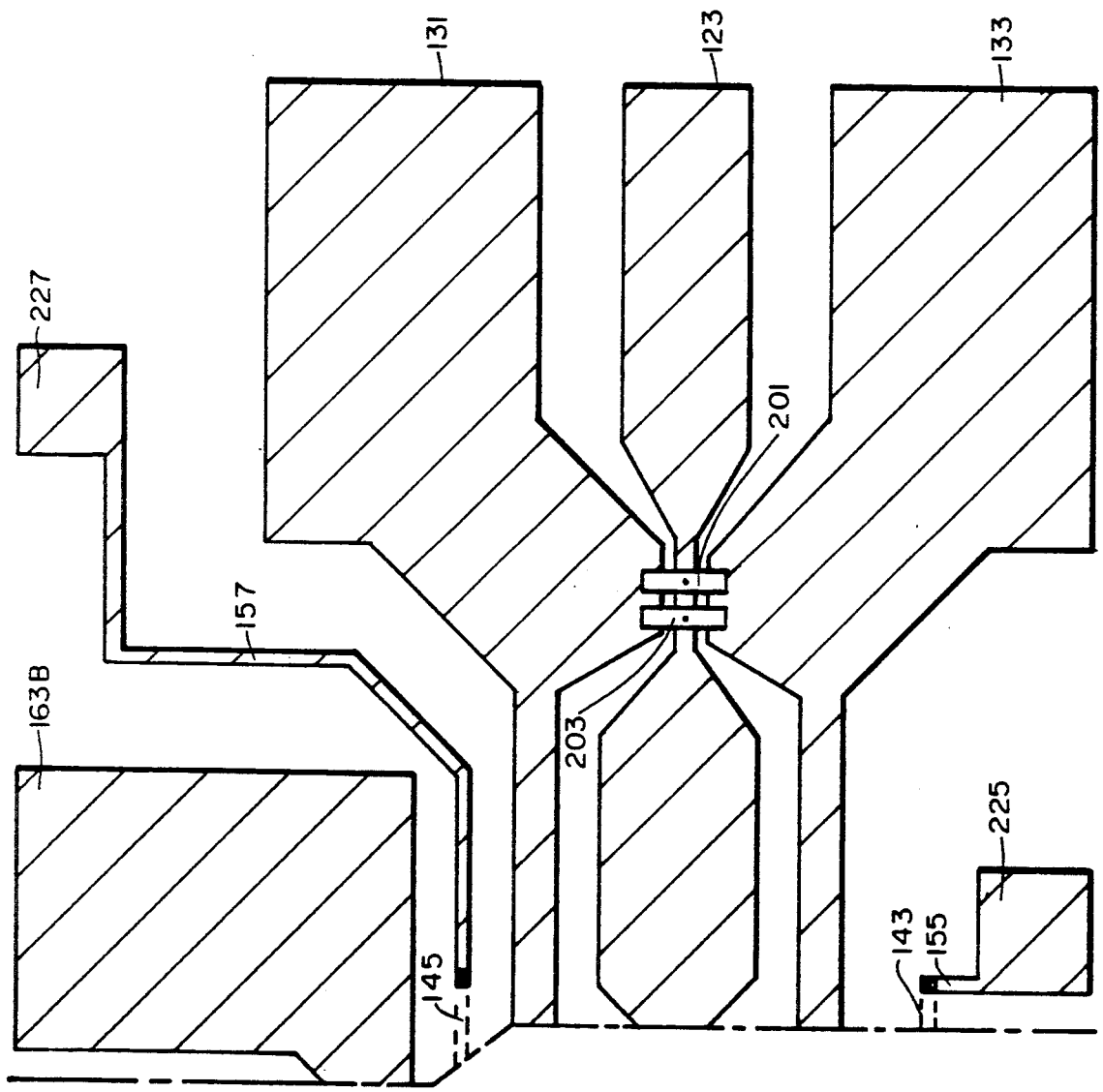

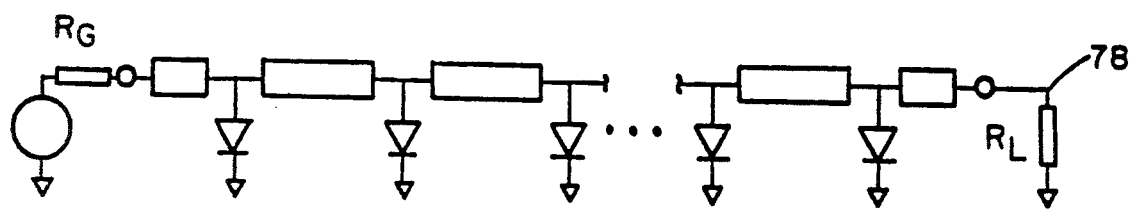
FIG. 18
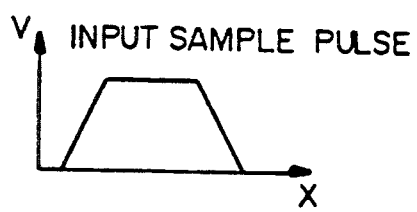
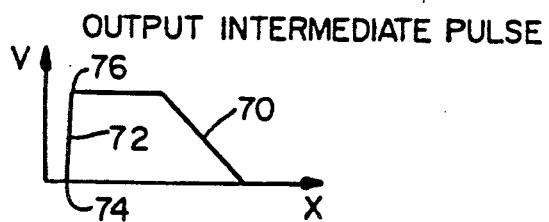
FIG. 19A             FIG. 19B

DIRECTIONAL SAMPLING BRIDGE

This work was funded by the United States Government, Office of Naval Research under contract No. N00014-89-J-1842. The United States Government has a paid up license in this technology.

This is a continuation-in-part of a U.S. patent application entitled "100 GHz Gallium Arsenide Monolithically Integrated Sampling Head Using Equivalent Time Sampling", Ser. No. 07/259,027, filed Oct. 17, 1988 (M-1040-2P), currently copending, which is incorporated by reference herein, which was a continuation-in-part of a United States patent application entitled "Nonlinear Transmission Line for Generation of Picosecond Electrical Transients", Ser. No. 07/106,554, filed Oct. 6, 1987, currently copending which is incorporated by reference herein.

BACKGROUND OF THE INVENTION

The performance of linear and many nonlinear circuits is most commonly characterized in terms of the circuit's transfer function and its input and output impedances as a function of frequency. Measuring these network parameters is therefore of critical importance to circuit and device designers, as well as to manufacturers.

Unfortunately, at frequencies above approximately 1 to 2 GHz, it becomes very difficult to measure both voltage and current at a given point. However, it is still possible to measure an impedance without measuring the current if the voltage measured can be separated into forward and reverse traveling wave components. Knowing the relative amplitude of the forward and reverse traveling waves is sufficient to determine the impedance.

In the prior art, and specifically, in existing Hewlett-Packard and Wiltron network analyzers, a directional device was used to feed RF excitation energy to the device under test and to guide any reflected energy to a sampler. This sampler generated an intermidiate frequency (hereafter IF) output which was indicative of the amount of power in the reflected wave. Another sampler sampled the excitation energy and generated an IF output signal proportional to the power in the excitation signal. Typically, the directional device used in the prior art was a Wheatstone directional bridge. This directional bridge used, a voltage measuring circuit between two nodes of the bridge such that power in the reflected wave from the device under test would register as a voltage in the voltage measuring circuit.

The Wheatstone directional bridge approach of the prior art can conceivably work at all frequencies, provided the resistors and interconnections can be made relatively free of parasitic inductance and capacitance. However, there is a limitation in using this Wheatstone bridge technique which is imposed by the coupling of a voltage measuring circuit across the bridge with neither terminal tied to ground, i.e., the voltage measuring circuit is "floating". In the prior art before the invention described herein, there were no suitable floating sampler designs which could work in the very high frequency region to measure the voltage difference between two nodes neither of which was ground. Specifically, in the prior art it was necessary to convert the floating sampler design to a single ended sampler design wherein one end of the sampling circuit could be grounded. This required the construction of a transformer balun to adapt the directional bridge for use with a "single-ended" voltage meter, i.e., one terminal grounded. This use of a transformer balun created a deficiency in the design because the transformer limited the range of frequencies over which the prior art design was useful. Further, it was and still is very difficult to make a transformer which operates efficiently at low frequencies, as well as at high frequencies.

Some workers in the prior art, specifically Donecker, et al. as shown by U.S. Pat. No. 4,588,970, went to extreme lengths in an attempt to get around this frequency limitation problem of the prior art balun design. FIGS. 7B and 7C of that patent illustrate the complexity of the structures which were built by Donecker, et al to achieve acceptable high frequency and low frequency performance in the transformer design. The structure of FIG. 7B of Donecker, et al. is a high end balun, and is very elaborate and difficult to manufacture. The low frequency balun is provided by the structure of FIG. 7C. Using these two baluns, the Donecker device had an operational frequency of from 0.045 to 26.5 GHz.

Another method of providing the directionality required to separate the forward and reverse traveling waves is through use of coupled transmission lines. This method, being fully distributed, has the potential for higher frequency operation. However, it is nearly impossible to simultaneously achieve high directivity, i.e., (greater than 40 dB) and ultra-broad bandwidth, i.e., (greater than 3 decades).

Accordingly, a need has arisen for a directional system which can separate the forward and reverse traveling waves from a device under test which has both high directivity and ultra-broad bandwidth and which is easy to manufacture and which will have the capability of operating above 26.5 GHz as well as at low frequencies. Preferably this device should be integrated and compatible with current gallium arsenide processing technology.

SUMMARY OF THE INVENTION

According to the teachings of the invention, there is disclosed herein a monolithic, integrated, floating, directional sampling bridge sometimes also called herein a directional sampler. This integrated device is simple, compact easy to manufacture and has a bandwidth from D.C. into the gigahertz range. The directional sampler provides the means for separating the forward and reverse waves traveling to and from a device under test as well as provides means for down-conversion of higher frequency excitation and reflected waves of to a lower IF frequency. The device can be used for RF network measurements from arbitrarily low frequencies up to frequencies well above 100 GHz.

The directional sampler according to the teachings of the invention is a single integrated circuit which replaces two discreet sampling circuit assemblies and the intricately machined triaxial bridge or directional coupler of the prior art. Further, since the directional sampler is compatible with existing gallium arsenide fabrication processes, it offers the potential of dramatically reduced cost as well as increased performance in RF network analyzer test sets. The directional sampler generates two sampled IF output signals, the ratio of which provides a measure of the complex reflection coefficient of the device under test.

The directional sampler is comprised of a resistive directional bridge which is also referred to as a "bridge" or a "directional bridge" and two sampling circuits. A first sampling circuit samples the radio frequency (RF) voltage at the top of the bridge at a sampling rate which is substantially synchronous with the exciting RF voltage. An IF output signal is generated which is proportional to the RF voltage at the top of the bridge. A second sampler referred to in the claims as a "floating sampling means" samples the RF voltage across the middle of the bridge. This sampling is done at a sampling rate which is also substantially synchronous with the exciting RF voltage. The floating sampling means generates an IF output signal which is proportional to the difference in voltage across the directional bridge.

In the preferred embodiment, the first sampling means samples the RF voltage at the top of the bridge and generates an IF output signal. The first sampling means is comprised of a pair of series coupled diode/capacitor combinations with the cathode of first diode coupled to the anode of the second diode. The RF excitation energy, i.e., the incident wave, is coupled to the node between the cathode of the first diode and the anode of the second diode. One capacitor has a first plate coupled to the anode of the first diode and the other plate coupled to the return line for the RF incident wave, i.e., the ground plane. The other capacitor has one plate coupled to the cathode of the second diode and the second plate coupled to the ground plane.

The floating sampling circuit is comprised of a pair of diode/capacitor combinations and a series of four resistors, serially connected, with both ends of the series of four resisters coupled to the ground plane conductors of an integrated coplanar wave guide (CPW) These four resistors will be referred to as the first, second, third, and fourth resistors herein The RF incident wave excites the node between the middle two resistors. A local oscillator strobe pulse generator is coupled to the ends of the series of four resistors at the nodes which are coupled to the ground plane CPW conductors One output line of the local oscillator strobe pulse generator is coupled to the CPW ground plane through a capacitor. A parallel resistor shunting the capacitor to the CPW ground plane provides a termination in the reference impedance (usually 50 ohms). This gives the local oscillator a better impedance match with the input impedance of the floating sampler. The nodes between the first and second resistors are coupled to one plate of a first capacitor in the first diode/capacitor combination. The other plate of this capacitor is coupled to the anode of a first diode. The cathode of this first diode is coupled by a fifth resistor to the RF incident wave input port, i.e , the CPW center conductor and the node between the second and third resistors in the series of four resistors. The cathode of the first diode is also coupled to the input terminal of the device under test. The other input terminal of the device under test is coupled to the CPW ground plane. The cathode of the first diode is also coupled to the anode of the diode of the second diode/capacitor combination. The second diode has its cathode coupled to one plate of a second capacitor. The other plate of this second capacitor is coupled to the node between the third and fourth resistors in the series of four resistors. The nodes between the capacitors and diodes in the floating sampling means are coupled to a summing junction through a pair of matched resistors. The summing junction is the IF output node. The IF output signal has an amplitude which is proportional to the difference in voltage across the bridge.

Likewise, in the first sampling means, the nodes between the diode/capacitor combinations are coupled to a summing junction through a pair of matched resistors. This summing junction develops an IF output signal which is proportional to the voltage at the top of the bridge.

Preferably, the directional sampler is integrated on a gallium arsenide substrate using coplanar waveguide and integrated Schottky diodes. The capacitors are integrated metallic plates separated by nitride insulation layers, and the resistors are buried layer N+ type constructions with ohmic contacts at each end.

BRIEF DESCRIPTION OF THE DRAWINGS

FIGS. 7A and 7B are depictions of the waveforms and voltages at various modes in the circuit of FIG. 6 for Vsp on, V1 on V2 off.

FIGS. 7C and 7D are depictions of the waveforms and voltages at various nodes in the circuit of FIG. 6 for Vsp on; V1 and V2 on.

FIGS. 9A and 9B are a plan view of an exemplary integrated circuit layout for the circuit of FIG. 8.

FIG. 18 is a block diagram of a nonlinear transmission line.

FIGS. 19(a) and 19(b) are illustrations of the sample pulse to the nonlinear transmission line and the output intermediate pulse therefrom.

DETAILED DESCRIPTION OF THE PREFERRED EMBODIMENT

Figure 1:
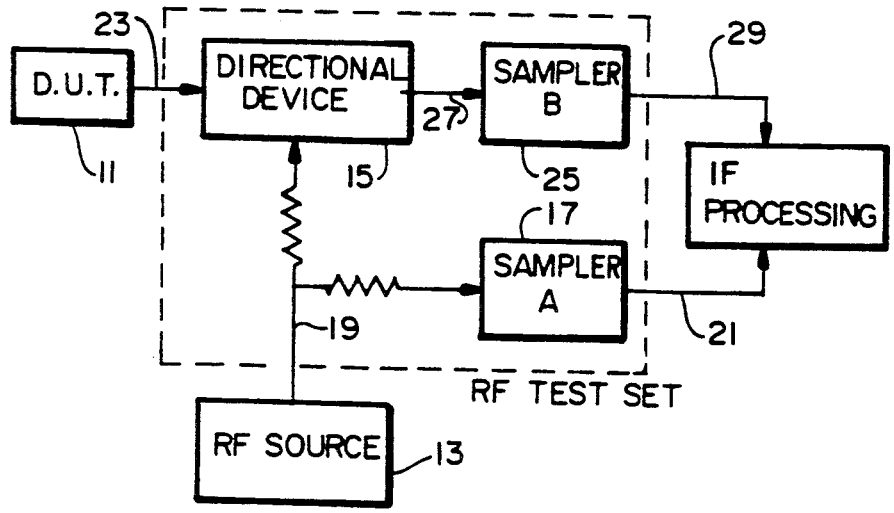
FIG. 1 is a block diagram of a typical prior art network analyzer.

For better understanding of the invention, a short discussion of the prior art is necessary. Referring to FIG. 1, there is shown a block diagram of a typical prior art network analyzer such as the Hewlett Packard 8510. A device under test 11 is excited by an RF source 13 through a directional device 15. Sampler A 17 samples the incident wave on line 19 and generates an intermediate frequency output signal on line 21.

The directional device 15 guides the incidence wave on line 19 into the device under test 11. The reflected wave from the device under test travels back toward the directional device in the direction of the arrow at 23. The directional device guides this reflected wave to sampler B 25 via line 27. Sampler B samples the reflected wave on line 27 and generates an IF output signal on line 29.

The function of sampler A in FIG. 1 is to monitor the source or excitation energy so that the reflected wave can be normalized to the wave incident on the device under test. Both Samplers A and B convert their sampled RF signals to the lower frequency IF signals on lines 21 and 29 where vector voltage measurements may be made accurately to assess various characteristics of the device under test 11.

The directional device 15 in the prior art structure of FIG. 1 is either a triaxial directional bridge or a coaxial directional coupler. Because the teachings of the invention contemplate use of monolithic circuit elements, only the package in which the circuit resides needs to be machined. Furthermore, the single package incorporating the teachings of the invention replaces both the directional device and both samplers A and B.

Figure 2:
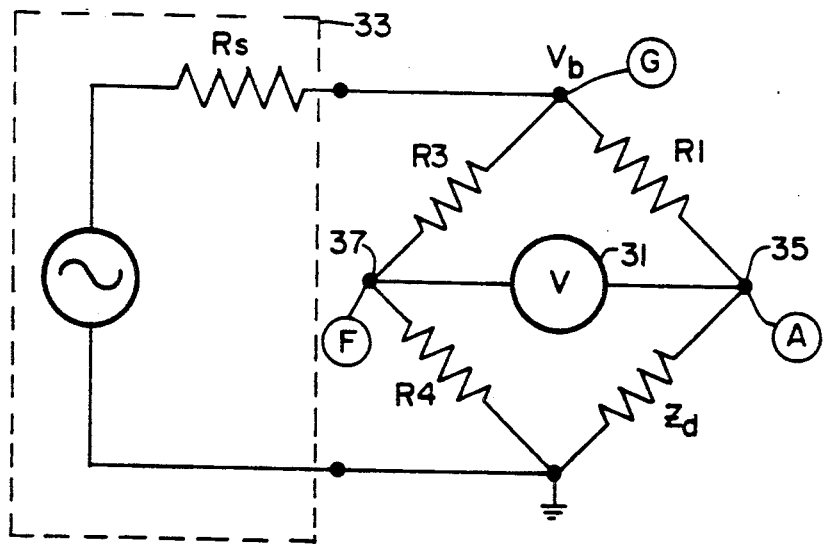
FIG. 2 is a prior art directional bridge with theoretical floating sampler.

Referring to FIG. 2, there is shown a typical prior art Wheatstone directional bridge which could be used as the directional device 15 in the device of FIG. 1. In the bridge of FIG. 2, the voltage sampling circuit 31 measures the voltage of the reflected wave from the device under test if certain conditions for the values of resistors R1, R3 and R4 are met. The input impedance of the device under test is represented by the impedance $Z_d$. Circuit 31 measures the voltage of the reflected wave only when the product of the resistors R4 and R1 is equal to the product of the resistances of the resistor R3 and a reference impedance Zd (which is typically 50 ohms). Ideally, $Z_d$ matches the output impedance Rs of the RF excitation source 33 of FIG. 2.

This can best be understood by thinking of the bridge of FIG. 2 as a pair of voltage dividers with the voltage sampling circuit 31 coupled between the middle nodes of each voltage divider The first voltage divider is the series combination of resistors R3 and R4. The second voltage divider is the series combination of the resistors R1 and the impedance Zd of the device under test. When the ratio of R4 to R3 is equal to the ratio of Zd to R1, then the bridge is perfectly balanced and the voltages at nodes 35 and 37 will be equal. The bridge of FIG. 2 is designed to be balanced when the input impedance of the device under test $Z_d$ is equal to the output impedance $R_s$ of the RF source 33. In such a state, all power output from the RF source 33 will be absorbed by the load, and no power will be reflected. To provide directionality, the bridge impedances R1, R3, and R4 are selected such that when $Z_d$ is equal to the output impedance of the RF source, no voltage difference will exist between nodes 35 and 37.

If the values for the resistors R1, R3 and R4 are selected so as to meet the criteria R4 times R1=R3 times $R_s$, then the voltage measured by the voltage sampling circuit 31 will be a single-valued function of the voltage reflected by the device under test. The reflection coefficient or the impedance of the device under test can then be determined by a simple mathematical computation. The accuracy of the computation is enhanced by the fact that the voltage measured by sampling circuit 31 approaches zero as the reflection coefficient of the device under test approaches zero. If R1 is chosen to be equal to the reference impedance, then sampling circuit 31 will measure a voltage which is directly proportional to the voltage reflected by the device under test. When the input impedance of the load does not match the output impedance of the driver, then power will be reflected from the load back toward the driver. If such a condition exists, then the voltage dividers comprised of the series combinations of resistors R3 and R4 and R1 and Zd have different relative ratios of impedance in the top half versus impedance in the bottom half. This will result in a voltage difference between the nodes 35 and 37.

Figure 3:
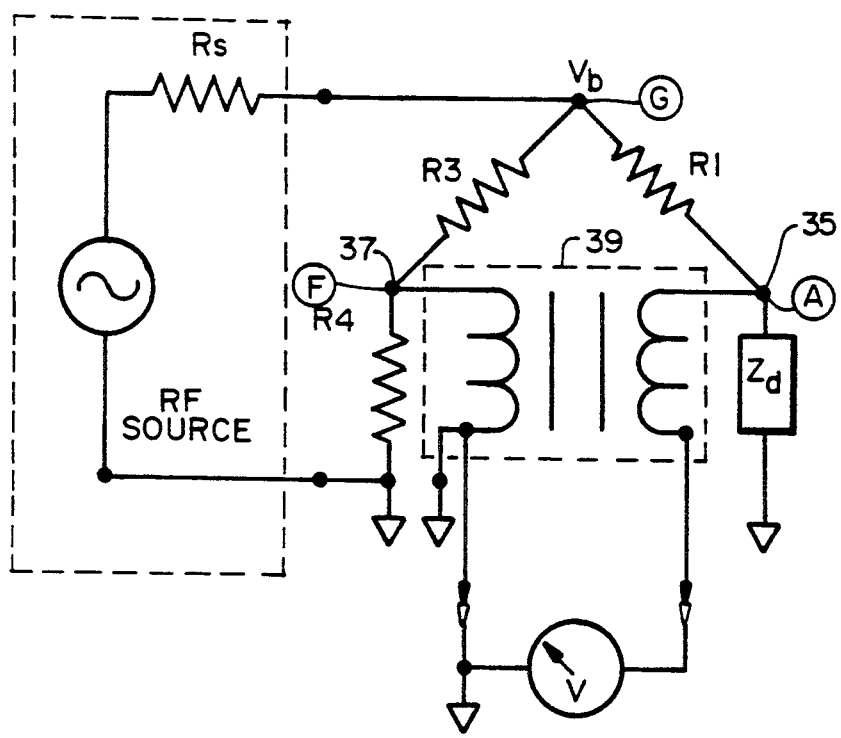
FIG. 3 is a prior art directional bridge with a balun and single ended sampler.

The difficulty with the structure of FIG. 2 is that the voltage sampling circuit 31 is floating in that neither terminal is connected to ground. Because the prior art heretofore did not contain a floating type voltage sampling circuit which could convert RF signals to intermediate frequency signals the circuit of FIG. 2 was heretofore only theoretical. To get around this problem, workers in the art devised structures whereby the floating sampling circuit 31 in FIG. 2 is replaced by a balun and single ended voltage sampling circuit. This structure is shown in FIG. 3 and is typified by the disclosure of the Donecker U.S. Pat. No. 4,588,970. The structure of FIG. 3 was necessitated by the belief of workers in the art that samplers, which are commonly used for measuring broad band RF signals, could only be designed to measure a voltage with respect to ground. Accordingly, these workers devised the circuit of FIG. 3 using the balun 39 to convert the voltage difference between nodes 35 and 37 to a voltage referenced to ground. If a floating sampler had existed in the prior art, then balun 39 would have been superfluous.

Figure 4:
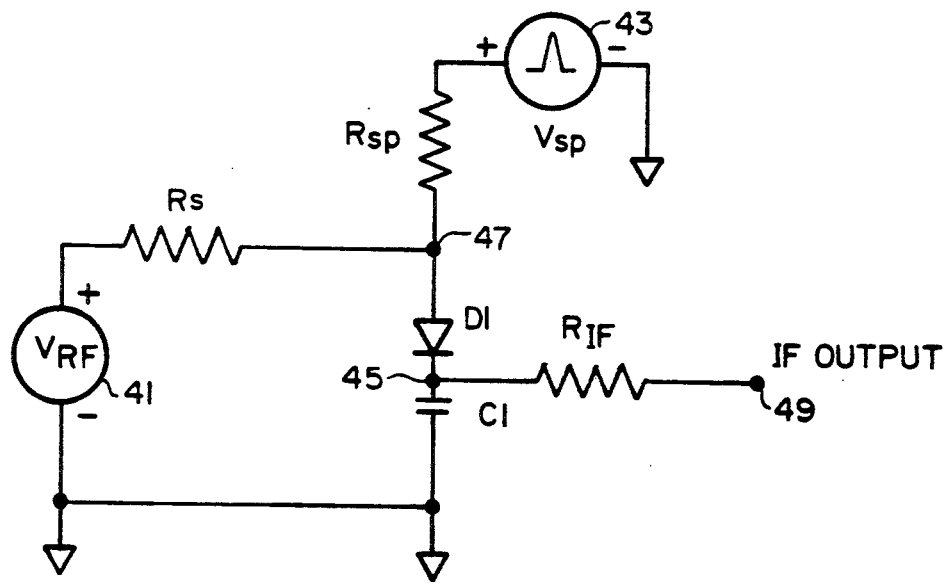
FIG. 4 is a prior art diode/capacitor sampler using a local oscillator.

Referring to FIG. 4, there is shown the structure of a typical prior art single diode sampler which is useful in understanding the construction and operation of a floating sampler constructed in accordance with the teachings of the invention.

The way in which the sampler of FIG. 4 works is as follows. Assume that the RF excitation source 41 is turned off. A local oscillator strobe pulse generator 43 generates strobe pulses at a frequency which is synchronous with the frequency of the RF signal generated by RF excitation source 41. The local oscillator strobe pulse forward biases the diode D1 and causes current to flow through resistor Rsp, diode D1 and capacitor C1 to ground. When the strobe pulse ends, the diode D1 turns off and current stops flowing. However, during the duration of the strobe pulse, the capacitor C1 stores charge. This stored charge raises the voltage at node 45 somewhat. During the next local oscillator pulse, diode D1 turns on again, but the amount of current that flows is less since the voltage difference between nodes 45 and 47 is now less than during the previous local oscillator strobe pulse. The current which flows through diode D1 during the second local oscillator pulse stores additional charge on capacitor C1 thereby raising the voltage of node 45 higher. Each time a local oscillator pulse occurs, the diode D1 is forward biased, current flows through the diode D1 into capacitor C1 and more charge is stored. Eventually, the voltage on node 45 rises to the peak level of the strobe pulse. When this condition occurs, the diode D1 becomes essentially an open circuit since it is reverse biased by the voltage on node 45 between local oscillator strobe pulses and during strobe pulses, the voltage at nodes 47 and 45 is equal or less than the cutoff forward bias voltage of the diode thereby preventing the diode from turning on. Because there is some leakage through capacitor C1 to ground, the voltage at node 45 eventually falls somewhat thereby requiring the diode D1 to turn on slightly during some local oscillator (LO) pulses to replace the lost charge. However, this leakage will be ignored for purposes for this description of the functioning of the invention since it is quite small.

Now assume in FIG. 4 that the Rf excitation source 41 is turned on. If the instantaneous voltage of source 41 is positive at the instant of occurrence of the local oscillator strobe pulse, diode D1 will conduct more heavily than previous to source 41 being activated. This will result in additional charge being stored on capacitor C1 until finally node 45 has charged up to a dc voltage equal to the superposition of the local oscillator strobe pulse amplitude and the instantaneous value of source 41 at the instant of the local oscillator strobe pulse. This is the same voltage that would be measured with a high impedance voltage probe in the absence of the sampling diode if both the local oscillator and source 41 were frozen in time at the instant of occurrence of a local oscillator strobe pulse.

In a similar manner, if the instantaneous voltage of source 41 is negative at the instant of occurrence of the local oscillator strobe pulse, the diode D1 will conduct less heavily than previous to source 41 being activated. In this case, charge will eventually "leak" off of capacitor C1 until node 45 reaches the dc voltage described above. If too much charge leaks off, diode D1 will conduct on the next strobe pulse and compensate for the lost charge. In actual operation, current will be drawn from node 45 to drive the IF circuitry that is connected to node 49. In this case, the diode must conduct on every sample pulse to supply such current and the voltage at node 45 will not be precisely equal to the dc voltage described above but will be multiplied by a factor approximately equal to R1 divided by the quantity R1 plus Req plus Rif where R1 is the resistance to ground from node 49 and Req is the equivalent impedance looking into the sampler from node 45. Req is typically on the order of 20,000 ohms.

Note that if the local oscillator strobe pulses occur at a frequency which is slightly less or more than the frequency of the RF excitation wave form generated by the RF source 41, but each strobe pulse occurs at "substantially" the same point or phase of a cycle of the RF excitation waveform but offset slightly from the phase of the previous LO pulse, it is then possible to generate an IF output signal at node 49 having a substantially lower frequency than the frequency of the RF excitation source but which tracks the voltage of the RF excitation source waveform. In other words, by offsetting the LO pulses in time by a very slight amount, the RF waveform can be traced. By offsetting the timing of the strobe pulses in this manner, samples of the RF excitation source wave form are taken at many sample points in the cycle such that the entire RF excitation waveform cycle may be reproduced from the plurality of samples which occur at IF output node 49 after the timing of the local oscillator strobe pulses has been adjusted to move through 360° of phase. Note however, that the samples which occur at node 49 have the peak voltage of the local oscillator strobe pulses superimposed thereon. To remove this characteristic, the circuit of FIG. 5 can be used.

Figure 5:
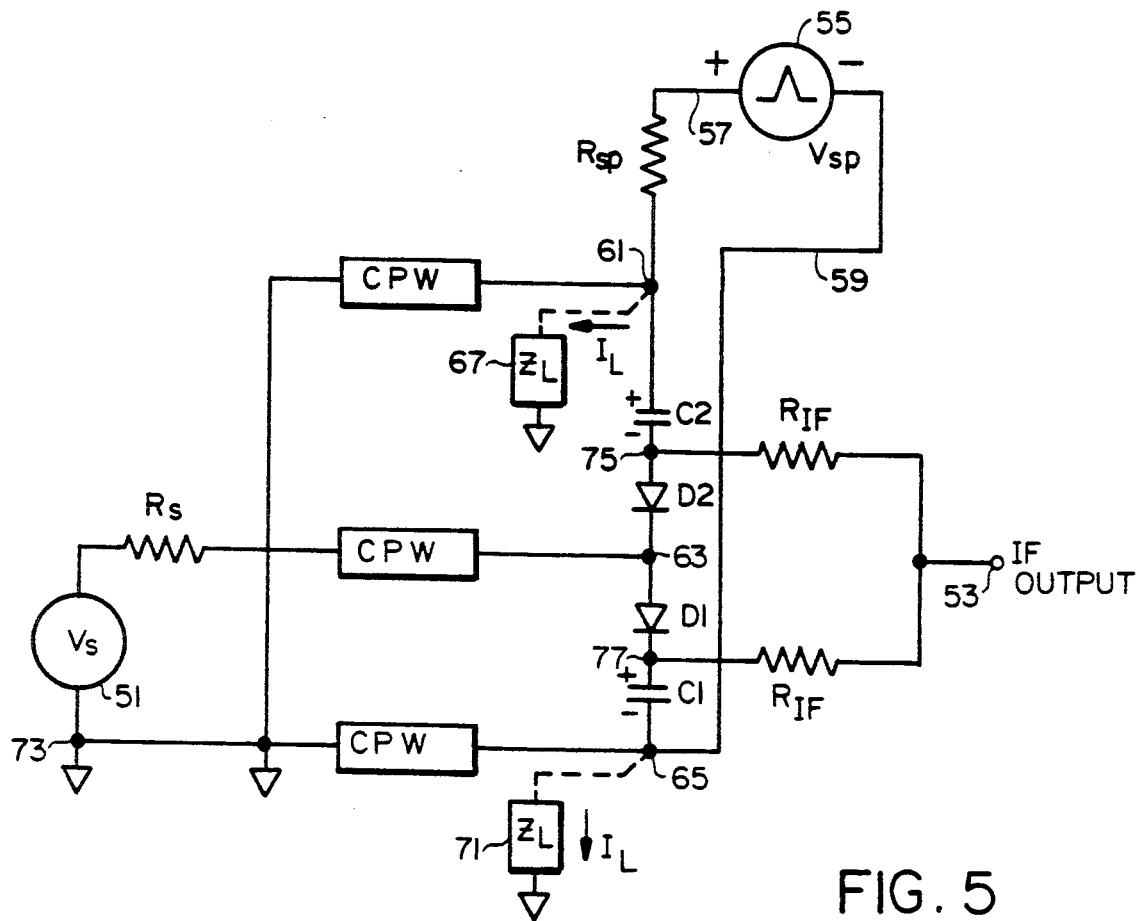
FIG. 5 is a two diode/capacitor sampler for sampling a single RF source.

Referring to FIG. 5, there is shown a two diode sampler which generates samples of the RF excitation waveform generated by RF excitation source 51 at an IF output node 53. These samples do not have superimposed thereon the peak voltage of the local oscillator strobe pulses. Note in the circuit of FIG. 5, that the local oscillator strobe pulse generator 55 is floating. Thus, all current exciting the diodes D1 and D2 on line 57 returns on line 59. This assumes that there is no leakage current to ground from nodes 61, 63 and 65. There actually is some leakage from nodes 61 and 65 but it can be ignored for reasons explained below. With the RF excitation source 51 turned off, node 61 will rise in voltage to +Vsp/2 and the voltage at node 65 will fall to −Vsp/2. This puts node 63 at ground potential by Kirkoff's voltage law. This assumes that the current through diodes D1 and D2 is the same. This is a valid assumption even if there is leakage to ground from nodes 61 and 65. The leakage impedances to ground are shown symbolically at 67 and 71. The leakage currents to ground are shown by the arrows labeled I1. The leakage impedances 67 and 71 and the leakage currents I1 are equal because of the symmetry of the circuit. There is no leakage to ground from node 63, because this node is at ground potential. Accordingly, the current through diodes D1 and D2 is equal for a perfectly symmetrical circuit even at very high operating frequencies.

To understand how the circuit of FIG. 5 operates, first imagine the RF excitation voltage source 51 is off. A perfect voltage source 51, when turned off, has zero impedance thereby coupling node 63 to ground at node 73 through the source resistance Rs. Instantaneously, the voltages at nodes 61 and 65 become +Vsp/2 and −Vsp/2, respectively, because the total voltage drop from nodes 61 to 65 must be equal to the peak voltage of the local oscillator strobe pulses by Kirkhoff's voltage law and ignoring the voltage drop across the very small source resistance Rsp. This forward biases each diode D1 and D2 during each local oscillator pulse thereby causing current to flow into each of the capacitor C1 and C2 and storing charge therein during each local oscillator strobe pulse. The polarity of the stored charge and the voltage drop across the capacitors C2 and C1 is as labeled in FIG. 5 since the direction of current flows from node 61 to node 65. The charging mechanism is the same as described with reference to FIG. 4. During each local oscillator pulse, each of diodes D1 and D2 turns on and more charge is stored in capacitors C1 and C2, respectively. Eventually, the charge stored on each of the capacitors C1 and C2 rises to the level such that the voltage drop across the capacitors C1 and C2 causes the diodes D1 and D2 to be cut off during local oscillator strobe pulses and reverse biased between local oscillator strobe pulses. When the capacitors C1 and C2 are fully charged in the steady state, the node 75 is at −Vsp/2 and the node 77 is at +Vsp/2. Thus, during every local oscillator strobe pulse, no current flows through either of diodes D1 and D2 (ignoring leakage from the capacitor C1 and C2 between local oscillator strobe pulses). Specifically, the voltage drop from node 75 to ground potential at node 63 is −Vsp/2 (traveling across capacitor C2 toward node 61) plus +Vsp/2 (traveling from node 61 to ground potential at node 63) or zero volts. Therefore, no current flows through diode D2. Likewise, the voltage difference between node 77 and node 63 is +Vsp/2 (traveling across capacitor C1 toward node 65) plus −Vsp/2 (traveling from node 65 to ground potential at node 63) or zero. Therefore, zero voltage drop exists across diode D1 during a local oscillator strobe pulse when the capacitors C1 and C2 are fully charged. Both diodes D1 and D2 are reverse biased in between local oscillator strobe pulses. Diodes D1 and D2 are effectively open circuits under these circumstances.

Now, to understand how the IF output signal is generated, turn the RF excitation source 51 on. First assume that the timing of the occurrence of the strobe pulses and frequency thereof is such that the local oscillator strobe pulse occurs at the same point in a cycle of the RF excitation waveform for any cycle in which a local oscillator strobe pulse occurs. This allows us to replace the RF excitation source 51 with a DC source having a voltage equal to the instantaneous voltage of the RF excitation waveform at the time of occurrence of each local oscillator strobe pulse. This forces the voltage at node 63 to be equal to the voltage Vrf which is the voltage of the RF excitation waveform at the instant of occurrence of the local oscillator strobe pulse. By the same charging mechanism as described above, the voltage Vrf at node 63 forward biases diode D1 and causes the voltage at node 77 eventually to reach the value of Vrf. Similarly, the diode D2 is reverse biased, but a small reverse leakage current flows into capacitor C2. The capacitor C2 stores charge from this leakage current and the voltage on node 75 therefore rises as the capacitance C of capacitor C2 times the integral of the reverse bias leakage current over time until the voltage at node 75 also reaches Vrf.

Nodes 75 and 77 are coupled to the intermediate frequency output node 53 through equal resistors $R_{IF}$. Since the voltage at node 75 is Vrf−Vsp/2 and the voltage at node 77 is Vrf+Vsp/2, by summing these two voltages at the summing node 53, the resultant intermediate frequency output signal voltage is Vrf (the instantaneous value of the RF excitation waveform at the time of occurrence of the local oscillator strobe pulses) if the value for $R_{IF}$ in each case is equal to the input impedance of whatever IF input stage is copled to port 53 by taking into account the voltage divider effect of the input impedance of the IF output stage (not shown). This is because the voltage divider formed by each resistor $R_{IF}$ and the input impedance of the IF stage coupled to port 53 divides the voltage at each of node 75 and 77 in half at node 53 so by the principle of superposition as understood by those skilled in the art, the output voltage at IF port 53 is $V_{RF}$. Any other value for the resistors $R_{IF}$ will also work, but some scaling may be needed if an IF output signal exactly equal to the value of $V_{RF}$. None of the details of exactly what the voltage at port 53 is for given values of $R_{IF}$ is critical to the teachings of the invention.

Now if the timing of the local oscillator strobe pulse occurrence is altered slightly on each occurrence of the strobe pulse, an intermediate frequency output signal is generated at node 53 which traces out the amplitude of the RF excitation waveform at a frequency which is much lower than the RF frequency. How much lower the IF frequency is depends upon the frequency of the local oscillator strobe pulse generator 55 relative to the frequency of the RF source 51.

The apparatus of FIG. 5 represents a single ended sampler wherein the voltage of a single source having one terminal coupled to ground is measured. It is useful to be able to measure the voltage difference between two different nodes in a circuit, i.e., two different voltage sources where neither is coupled to ground. To do this, a floating sampler is required.

Figure 6:
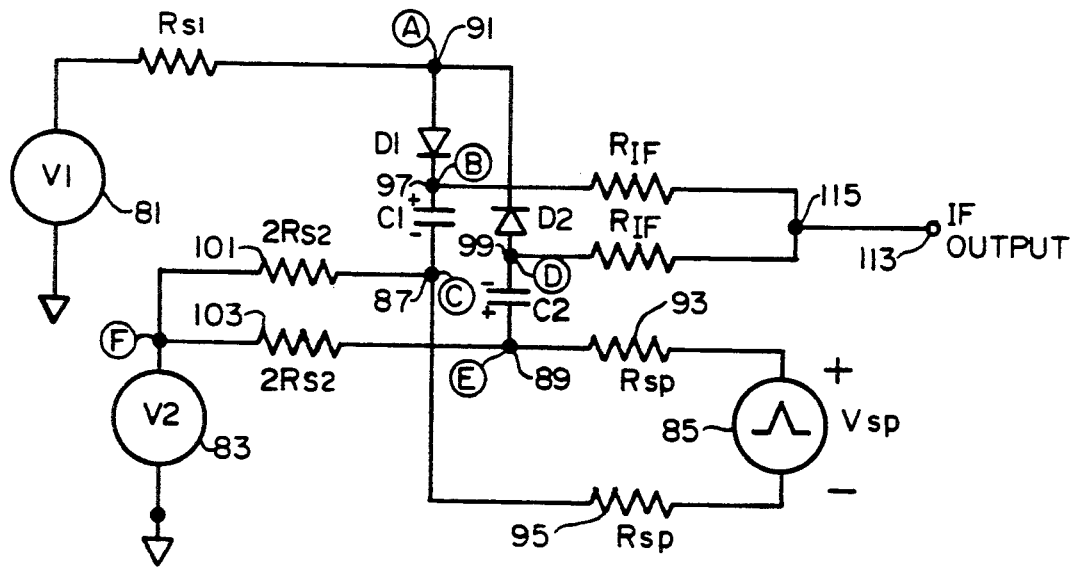
FIG. 6 is a floating voltage sampler according to the teachings of the invention.

FIG. 6 shows a floating sampler according to the teachings of the invention. To understand the operation of the circuit of FIG. 6, we first turn off the two voltage sources 81 and 83 (sometimes hereafter called V1 and V2). In an application wherein the sampler of FIG. 6 is used to sample the voltage across a directional bridge, voltage source V1 represents the voltage on the left side of the bridge while voltage source V2 represents the voltage on the right side of the bridge. Both V1 and V2 must be operating at the same frequency as would be the case for two voltages arising from excitation by the same source. With V1 and V2 off, and the LO strobe pulse generator 85 on, node 89 (also identified as node E for correlation with the nodes of the tables of FIGS. 7B and 7D and the circuit of FIG. 8) will have a DC voltage level at ground and an AC voltage level at $+Vsp/2$. Likewise, node 87 (node C) will have a DC voltage of zero and a AC voltage of $-Vsp/2$. Node 91 will have ground potential for both DC and AC cases. These voltage conditions arise because of the operation of the diode/capacitor sampling circuits as described above. That is, when a local oscillator strobe pulse occurs, diode D2 turns on and capacitor C2 begins to store charge as current flows through C2 and the diode D2. This process continues for every local oscillator pulse until C2 has stored sufficient charge to charge node 89 to $Vsp/2$. The same holds true for the diode/capacitor combination D1/C1. There, the diode D1 is forward biased by each local oscillator strobe pulse thereby allowing current to flow into capacitor C1 and charging it. This process continues for each local oscillator strobe pulse until the capacitor C1 builds up a charge on node 87 which holds the voltage there at $-Vsp/2$.

The total voltage drop traveling from node 89 to node 87 through C2, D2, D1 and C1, respectively, is $+Vsp$. During each local oscillator strobe pulse, the voltage drop from node 89 to node 87 travelling through resistor 93, voltage source 85 and resistor 95 is $+Vsp$. Because these voltage drops are equal, and in opposition to each other, no current flows through the diode capacitor combinations during a local oscillator strobe pulse (after the capacitor C1 and C2 have reached their full charges). This of course ignores the leakage currents between local oscillator strobe pulses which tend to discharge capacitor C1 and C2 slightly. In reality, diodes D1 and D2 turn on slightly during each local oscillator strobe pulse which causes this lost charge to be replaced.

As in the case of the circuit shown in FIG. 5, node 91 (node A) will be at ground potential since it is centrally located between the two terminals of the floating local oscillator strobe pulse generator 85. Comparing the circuit of FIG. 6 to the circuit of FIG. 5, it is apparent that node 65 in the circuit of FIG. 5 corresponds to node 87 in the circuit of FIG. 6, and node 61 in the circuit of FIG. 5 corresponds to node 89 in the circuit of FIG. 6. As in the case of the circuit of FIG. 5, nodes 87 and 89 are loaded with parasitic impedances to ground. However these impedances are equal and are in parallel with the source impedances 101 and 103 of the V2 source. Thus, the leakage current from nodes 87 and 89 to ground is equal thereby rendering the current through diodes D1 and D2 and capacitor C1 and C2 equal as in the case of the circuit of FIG. 5.

With the local oscillator strobe pulse generator 85 on and voltage sources V1 and V2 off, nodes 97 and 99 charge to $+Vsp/2$ and $-Vsp/2$, respectively.

Now assume that the local oscillator strobe pulse generator 85 remains on and V1 is turned on while V2 remains off. In this case the voltage waveforms are as shown in FIG. 7A and the voltage conditions at the various nodes are as shown in FIG. 7B. Note in FIG. 7A that the local oscillator strobe pulses 105 and 107 occur at the same relative phase points for cycles 1 and N of the V1 voltage waveform. Therefore, the RF voltage source V1 can be effectively replaced with a DC voltage source having a voltage equal to the instantaneous value of the V1 voltage waveform at the instant of occurrence of the local oscillator strobe pulse, i.e., the voltage at either of points 109 or 111. It is the voltage at point 109 which will be referred to as voltage V1 in the expressions of the table given in FIG. 7B. The charge on capacitor C1 and C2 hold the diodes D1 and D2 in a reverse biased state between local oscillator strobe pulses. Accordingly, the diodes D1 and D2 are only turned on during the local oscillator strobe pulse itself thereby allowing the voltage of the V1 source at node 91 at that instant in time to have any effect at all on the charge of capacitor C1 and C2 by way of current flowing through the diodes D1 and D2. Since diodes D1 and D2 do not turn on enough for significant current flow therethrough during local oscillator strobe pulses, the voltage V1 at node 91 cannot drastically effect the charge on the capacitor C1 and C2 or the voltage at nodes 97 or 99 during local oscillator strobe pulses. However the charge is somewhat effected by currents through diodes D1 and D2 caused by the voltage V1 at node 91 such that the voltage at node 97 eventually rises to $+Vsp/2 +V1$. Likewise, the voltage at node 99 changes to $-Vsp/2 +V1$. The voltages at nodes 87 and 89 are zero in the DC case and $-Vsp/2$ and $+Vsp/2$ in the AC case, respectively, as shown in FIG. 7B.

Now source V2 is turned on. Note that in FIG. 7C, the voltage waveform for the RF signal generated by voltage source 81 is out of phase with but of the same frequency as the voltage waveform for the RF wave generated by the voltage source 83. Note also that at the time of occurrence of the local oscillator strobe pulses 109 and 111, the instantaneous voltages of the V1 voltage source waveform and the V2 voltage source waveform can be slightly different. It is the instantaneous voltages of the V1 and V2 waveforms which are referred to as V1 and V2 in the expressions of the table given in FIG. 7D.

Since C1 and C2 are large compared with the capacitance of diodes D1 and D2, the RF voltage V2 will appear at nodes 97 and 99. If the instantaneous voltage of V2 is positive at the moment of occurrence of the strobe pulse, diode D1 will conduct less and diode D2 will conduct more heavily than before V2 was activated. C1 and C2 will then acquire charge which opposes this current flow as described above. This means that the dc voltage at nodes 97 and 99 will increase by V2. The net effect is that the total instantaneous RF voltage appearing across nodes 97 and 91 is $-V1+V2-Vsp/2$ so the dc voltage across 97 and 91 must equal $V1-V2+Vsp/2$ so that the total voltage including dc across diode D1 is equal to zero at the instant of the LO strobe pulse in the case of no IF load. Similarly, the dc voltage appearing across nodes 99 and 91 must equal $V1-V2-Vsp/2$. If source V1 has a dc bias of zero volts, the absolute dc voltage at node 97 is $V1-V2+Vsp/2$, and the voltage at node 99 is $V1-V2-Vsp/2$. So, when nodes 97 and 99 are connected through resistors $R_{IF}$, the output voltage at node 113 is simply V1-V2, the desired result. If V2 has a negative instantaneous voltage at the time of the strobe pulse, D2 will conduct less and D1 will conduct more heavily than before V2 was activated However, the end result will still be as described above.

Figure 8:
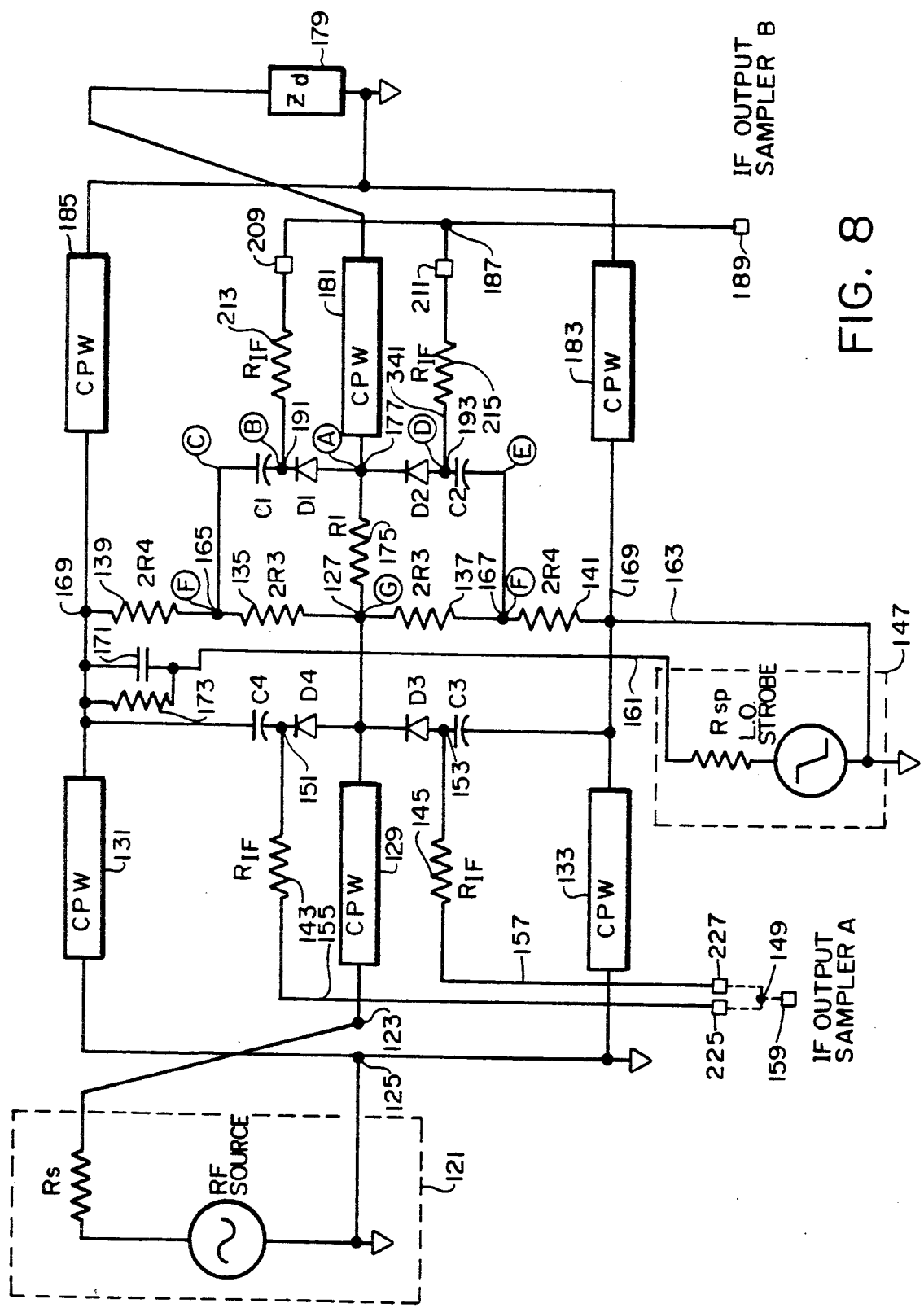
FIG. 8 is a circuit diagram of the preferred embodiment of the invention.

Referring to FIG. 8, there is shown an embodiment of a directional sampler according to the teachings of the invention. Preferably, the circuitry shown in FIG. 8 is integrated on a gallium arsenide substrate. A source of RF excitation energy 121 having source impedance Rs is coupled to an RF input port 123. The ground terminal of the RF source 121 is coupled to the ground plane pad 125 of coplanar waveguide conductors 131 and 133.

The RF excitation energy is guided to a node 127 by the CPW center conductor 129 and ground plane conductors 131 and 133. Preferably, the excited node in the CPW has the CPW ground plane conductors 131 and 133 at ground potential.

Node 127 has also been labeled node G for orientation purposes and corresponds to node G in the directional bridge of FIG. 2. The resistor R3 in the bridge of FIG. 2 corresponds to the resistors 135 and 137 in FIG. 8. The resistor R4 in FIG. 2 corresponds to the resistors 139 and 141 in FIG. 8.

Sampler A in FIG. 1 corresponds to the two diode/capacitor combinations D3/C3 and D4/C4 in FIG. 8 and the corresponding IF output resistors 143 and 145. This pair of diode/capacitor circuits acts as a standard diode sampler under the influence of the local oscillator strobe pulse generator 147 to sample the voltage of the RF excitation waveform applied to node 127. The IF output signal from sampler A on line 21 in FIG. 1 corresponds to the voltage developed at an off chip summing junction 149 equal to the sum of the voltages at node 151 and 153. The two resistors 143 and 145 couple the nodes 151 and 153 respectively, to the summing junction 149 via leads 155 and 157 which couple to contact pads at the edge of the integrated circuit substrate die. External connections to these contact pads join them together to form the summing junction 149. Generally the IF output port of 159 sampler A is loaded with a 20,000 ohm load so as to form a voltage divider with the input impedance of sampler A which is approximately 20,000 ohms. Therefore, the sum of the voltages at nodes 151 and 153 divided by four appears from IF output port 159 to ground. This voltage is equal to one-half the instantaneous voltage of the RF excitation waveform at node 127 at the instant of occurrence of each local oscillator strobe pulse on lines 161 and 163.

The values of the resistors 135 and 137 are double the value of the resistor R3 in FIG. 2 because there are two of these resistors in parallel leading from node 127 to the nodes 165 and 167 which correspond to the node F in FIG. 2. Likewise, the resistors 139 and 141 are double the value of the resistor R4 in FIG. 2 since these two resistors are in parallel from the nodes 165 and 167 (node F) to the CPW ground plane 169.

The local oscillator strobe pulse line 161 is coupled to the ground plane 169 through a capacitor 171 and a resistor 173. The capacitor 171 provides a low impedance connection for the high frequency components of the local oscillator strobe pulse to the ground plane 169. The resistor 173, which is typically set equal to the characteristic impedance, usually 50 ohms, provides a termination for the local oscillator strobe pulse lines 161 and 163. This provides a better match between the output impedance Rsp of the local oscillator strobe pulse generator 147 and the input impedance of the floating diode sampler. The floating diode sampler corresponding to circuit 31 in FIG. 2 is comprised of the diode/capacitor combinations D2/C2 and D1/C1. Note that resistor 175 corresponds to the resistor R1 in the bridge of FIG. 2.

The RF excitation energy at node 127 is applied through resistor 175 to node 177 which corresponds to node A in the circuits of FIGS. 2 and 6. From there, the RF excitation energy is applied to the load impedance Zd, i.e., the device under test 179, through the center conductor 181 and the ground plane conductors 183 and 185 of an integrated coplanar wave guide.

If the load impedance Zd does not match the output impedance of the RF source 121, and the resistors of the bridge are selected as discussed earlier herein, then a reflected voltage waveform propagates back toward node 177 through the coplaner waveguide segments 181, 183 and 185. The reflected energy waveform is sampled by the diode/capacitor combinations D2/C2 and D1/C1 in the manner described above with the reference to the circuit shown in FIG. 6. An intermediate frequency output signal is then formed at summing junction 187 and output at the IF output for Sampler B at 189. The voltages developed at nodes 191 and 193, corresponding, respectively, to nodes B and D in the circuit of FIG. 6, are as given in the table of FIG. 7D. The IF output voltage at the node 189 is the sum of the voltages at nodes 191 and 193. However, it is preferred that a 20,000 ohm impedance be coupled to the IF output node 189 for the reasons discussed earlier. This approximately halves the voltage appearing from node 189 to ground thereby generating an IF output signal which is equal to half the voltage appearing across the directional bridge at times of occurrence of the LO strobe pulses. This voltage difference essentially is the difference in voltage between, node 177, i.e., node A in the circuits of FIGS. 8 and 2 and nodes 165/167, i.e., node F in the circuits of FIGS. 8 and 2. Therefore, the circuit of FIGS. 6 and 8 are a floating voltage sampler which can perform the function of the hypothetical floating voltage measuring circuit 31 in FIG. 2.

Referring to FIGS. 9A and 9B, there is shown a layout for an integrated circuit embodiment according to the teachings of the invention. In the layout of FIGS. 9A and 9B, structures which correspond to structures shown in the circuit diagram of FIG. 8 will be given the same reference numerals.

The RF excitation waveform is applied to the center conductor 123 and ground plane conductors 131 and 133 of an integrated coplanar waveguide (hereafter sometimes referred to as CPW). Air bridges 201 and 203 equalize the potential of the ground plane segments 131 and 133 to suppress undesired modes.

The local oscillator strobe pulse signals are applied to center conductor 161 and ground plane conductors 163A and 163B of an integrated coplanar wave guide. The device under test is coupled to the center conductor 181 and ground plane conductors 183 and 185 of an integrated coplanar wave guide. Air bridges 205 and 207 equalize the potential of the ground plane segments 183 and 185 to suppress undesired modes in reflected waveforms travelling away from the device under test along the coplanar wave guide segments 181, 183 and 185.

Connection pads for IF output signal from diode/capacitor combinations D1/C1 and D2/C2 are shown at 209 and 211. The IF output resistors 213 and 215 are shown with dashed lines as buried N+ layer resistors with ohmic contacts 217 and 219 making contact to the ends of the resistor 213 and ohmic contacts 221 and 223 making contact the ends of the resistor 215.

Ohmic contacts to buried layer structures in FIGS. 9A and 9B are shown in rectangles with x's therein. All the resistors and diode active areas in the structure of FIG. 9A and 9B are implemented as buried N+ layer regions outlined by dashed borders. All areas outside these dashed borders are proton damaged so as to render the semiconductor substrate nonconductive.

The IF output resistors 143 and 145 coupling the diodes D3 and D4 to the off chip summing junction start on FIG. 9A and end on FIG. 9B. These resistors lead to IF output contact pads 225 and 227 shown on FIG. 9B. Ohmic contacts connect the surface metalization to the buried layer resistor pathways.

Figure 10:
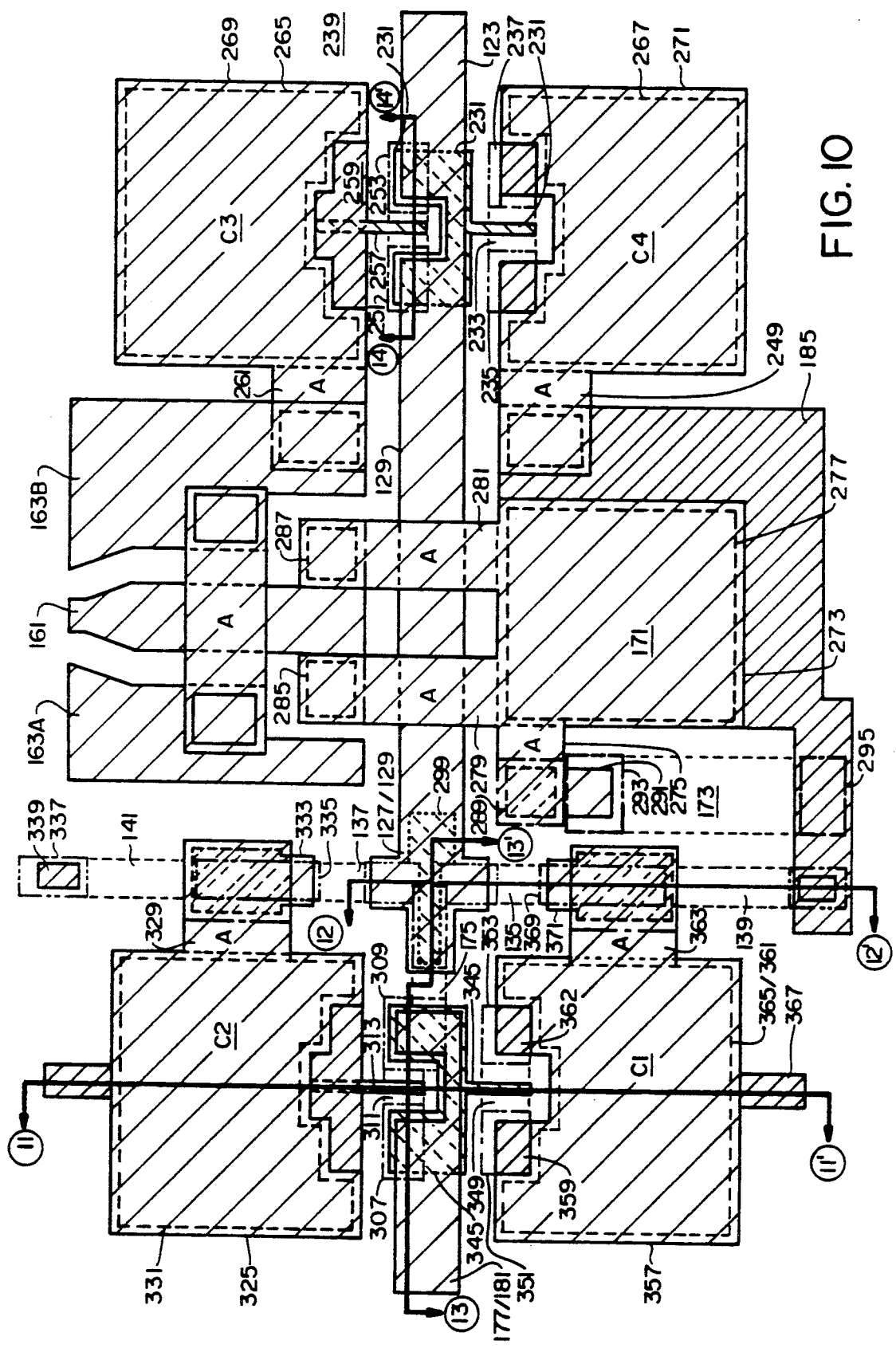
FIG. 10 is a plan view on an extended scale of the central portion of the layout of FIGS. 9A and 9B.

The area inside border line 229 on FIG. 9A is shown in expanded scale in FIG. 10 for better clarity in depiction of the integrated structure. In addition, a number of cross-sectional views through the structure are provided for additional clarity.

Referring to FIG. 10, the RF excitation energy on CPW center conductor 123 enters from the right. The RF excitation energy is coupled to the anode of diode D4 which is shown as an area of Schottky metal outlined by line 231. The cathode 233 of diode D4 is outlined by dashed lines connecting two ohmic contacts 235 and 237 at either end of the active area. The Schottky metal is a layered titanium/platinum/gold structure with the titanium in contact with the gallium arsenide substrate 239 and the platinum, acting as a diffusion barrier between the titanium layer and the overlying gold layer. The gold layer serves as the interconnect metal to the rest of the circuit.

The ohmic contacts 235 and 237 consist of multiple metal alloy structures as described later herein.

The ohmic contacts 235 and 237 underlie the metal of a bottom plate of a capacitor C4. In FIG. 9A, it can be seen that the bottom plate of the capacitor C4 also extends by a metal interconnect line 151 (not shown in FIG. 10) in FIG. 9A to an ohmic contact 243 at one end of the IF output resistor 143.

A top plate of the capacitor C4 is connected to the ground plane conductor 131 in FIG. 9A by a series of air bridges of which air bridge 245 is typical. Air bridges are shown in FIGS. 9A and 9B as rectangles with single dots near the center. In FIG. 10, they are shown as rectangles with A;s therein. An air bridge 247 connects the ground plane segment 131 to the ground plane segment 185 thereby jumping over interconnect line 151 for one of the IF output lines of the sampler for the RF excitation energy (doing the function of sampler A in FIG. 1).

Ohmic contacts are designated by areas in FIG. 10 bordered by lines consisting of long dashes with two dots interspersed between the dashes.

The top plate of the capacitor C4 is an extension of a metal air bridge 249 in FIG. 10 which connects the top plate of the capacitor C4 to the ground plane segment 185 of the CPW.

The center conductor 123 of the CPW is connected to the cathode of the diode D3 through the Schottky metal of the anode of diode D4 which is outlined by border line 231. This Schottky metal is partially covered by the interconnect metal of center conductor 123. The Schottky contacts for the cathode of diode D3 are shown at 251 and 253 and are also in electrical contact with center conductor 123. The anode of diode D3 is a strip of Schottky metal 257 which underlies the bottom plate 259 of the capacitor C3. The top plate of the capacitor C3 is an extension of the metal of air bridge 261 which couples the capacitor C3 to the ground plane segment 163B of the LO CPW. As seen in FIG. 9A the ground plane segment 133 of the RF excitation CPW is also coupled by airbridges to the ground plane segment 163B of the local oscillator strobe pulse CPW.

As seen in FIG. 9A, the bottom plate of the capacitor C3 extends via interconnect line 153 to make contact with the IF output resistor 145.

The top and bottom plates of capacitors C3 and C4 are electrically insulated from each other by a layer of nitride. The dashed lines 265 and 267 within the outlines of capacitors C3 and C4 mark the outline of the air bridge post for the air bridges 261 and 249, respectively. The solid lines 269 and 271 mark the outlines of the interconnect metal of the bottom plates of the capacitors C3 and C4, respectively. Similar structures exists for the capacitors C1 and C2 shown at the left side of FIG. 10.

The local oscillator strobe pulse generator is connected to the ground plane segment 185 of the CPW via the center conductor 161 of the local oscillator CPW via a capacitor 171. The outline of the bottom plate of this capacitor is indicated by border line 273. The bottom plate of the capacitor 171 is coincident with the interconnect metal of the ground plane conductor 185. The top plate of the capacitor 171 is an extension of the metal of an air bridge 275 which connects the center conductor 161 and the top plate of capacitor 171 to a resistor 173. The outline of the post of air bridge 275 is shown by dashed line 277. Air bridges 279 and 281 couple the top plate of the capacitor 171 to the center conductor 161 of the local oscillator CPW. Dashed border lines 285 and 287 mark the outline of the air bridge posts leading down from the metal of the air bridges 279 and 281 to the surface interconnect metal 161 of the center conductor.

The top plate of the capacitor 171 is also coupled by the air bridge 275 and an air bridge post 289 to a section of interconnect metal 291 on the surface of the substrate. The interconnect metal 291 overlies an ohmic contact 293 which makes contact with one end of a buried layer resistor 173. This resistor terminates the local oscillator strobe pulse CPW in a characteristic impedance which provides a better impedance match between the output impedance of the local oscillator strobe pulse generator and the input impedance of the floating sampler to be described below. An ohmic contact 295 underlies a portion of the interconnect metal of the ground plane segment 185 thereby completing the coupling of the local oscillator strobe pulse generator to the ground plane segment 185.

The ground plane segments 163A and 163B of the local oscillator strobe pulse CPW are coupled to the ground plane segments 133 and 183 by air bridges as seen in FIG. 9A.

The structure of the directional bridge and floating sampler are shown generally in the left one-third of FIG. 10. The center conductor of the RF excitation energy coplanar wave guide 129 terminates at a node 127. The interconnect metal of this node 127 overlies a T-shaped ohmic contact and a T-shaped section of Schottky metal. The ohmic contact couples the CPW center conductor 129 and node 127 to the buried layer resistors 137, 135 and 175. In FIG. 8, these resistors are also designated resistors R1 and the two resistors marked 2R3.

Figure 12:
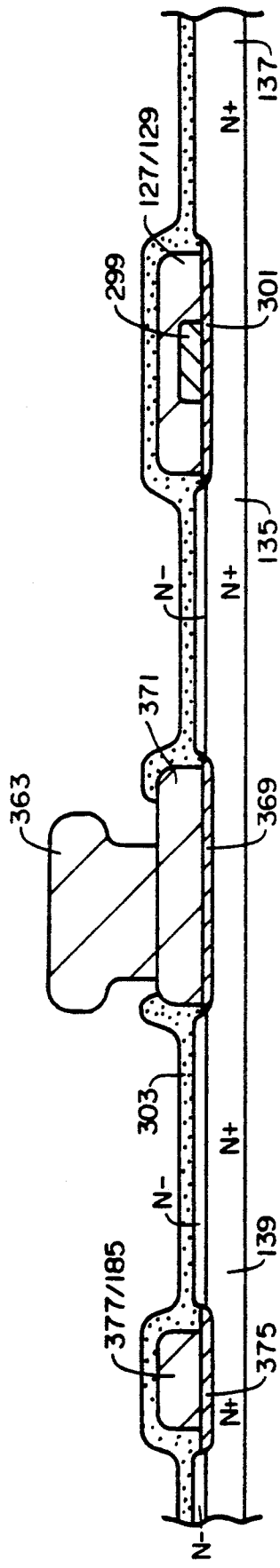
FIG. 12 is another cross-sectional view through the layout of FIG. 10 taken along section lines 12—12'.

Referring to the cross-sectional view of FIG. 12, the structure of node 127 is more clearly shown. The gold interconnect metal of the center conductor 129/node 127 overlies a layer of titanium/platinum/gold Schottky metal 299 which in turn overlies the alloyed gold/germanium/nickel/gold layered structure of the ohmic contact 301. The ohmic contact 301 couples the node 127 to the N+ buried layer which defines the resistive current path embodying resistors 137 and 135 as well as the resistor 175 (extending into page and not shown in FIG. 12).

The floating sampler structure is coupled to node 127 by the buried layer resistor 175 shown in FIG. 10. The central node 177 of the floating sampler is shown in plan view in FIG. 10 and in cross-section in FIG. 13. The structure of node 127 seen along the section line 13—13′ in FIG. 10 is shown at the left in FIG. 13. The structure of node 127 is insulated from the outside world by a passivation layer of nitride shown at 303. Note that the ohmic contact 301 lies at the bottom of a shallow trench which is etched through the N− layer 305 and extends into the N+ layer defining the current path for resistor 175.

Figure 13:
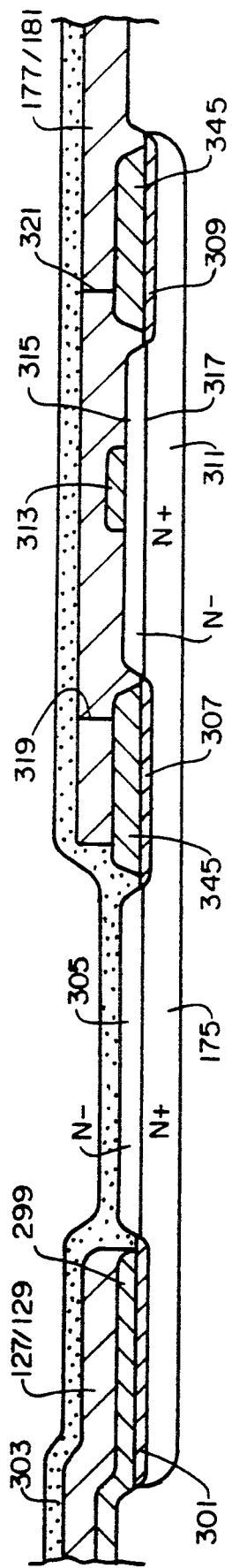
FIG. 13 is another sectional view through the layout of FIG. 10 taken along section lines 13—13'.

The structure of node 177 is shown at the right in FIG. 13. The gold interconnect metal of the node 177 and center conductor of the coplanar wave guide coupled to the device under test is U-shaped so as to overlie ohmic contacts 307 and 309 for the cathode of diode D2 but not contact the anode metal 313. The active material for the cathode region of diode D2 is shown at 311. The Schottky metal of the anode of diode D2 is shown at 313. This Schottky metal makes contact with the N− layer segment 315 which defines a junction 317 between the N− and N+ layers 315 and 311 respectively. The interconnect metal of the node 177 does not contact the Schottky metal 313 of the anode of diode D2 as indicated by vertical lines 319 and 321 in FIG. 13.

Figure 11:
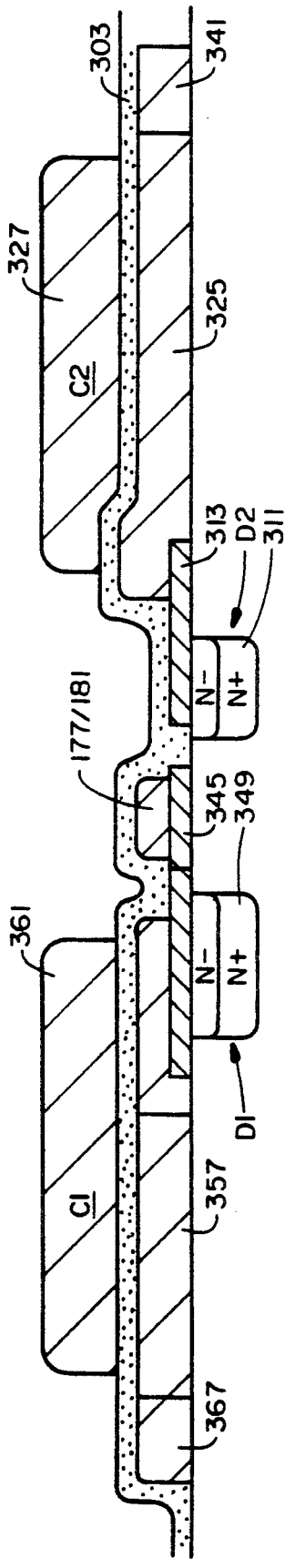
FIG. 11 is a cross-sectional view through the layout of FIG. 10 taken along section line 11—11'.

Referring to FIG. 11, there is shown a cross-section through the floating sampler structure at the location of 24 the section line 11—11′ in FIG. 10. The bottom plate of the capacitor C2 is shown as gold interconnect metal at 325. This bottom plate partially overlies the strip of Schottky metal 313 which forms the anode of the diode D2. The active material of the diode D2 is shown at 311. The layer of nitride insulator 303 separates the bottom plate 325 of the capacitor C2 from the top plate 327. This top plate 327 is an extension of the metal of an air bridge 329 (not shown in FIG. 11) which couples the top plate of the capacitor C2 to the junction between the resistors 141 and 137 as seen in FIG. 10. The outline of the post metal of this air bridge 329 is shown at 331.

Referring again to FIG. 10, the metal of the air bridge 329 for capacitor C2 extends over to and descends upon a segment of interconnect metal 333 on the surface of the substrate which overlies an ohmic contact 335. This ohmic contact connects the metal of the air bridge 329 to a point in the buried layer N+ resistor path which serves as the dividing line and node between the resistors 137 and 141. The resistor 141 extends upward in FIG. 10 and terminates in an ohmic contact 337 which is electrically connected to an overlying segment of interconnect metal 339 which is in contact with (connection not shown) with the ground plane conductors 183 and 133 of the CPW. As seen in FIG. 9A, the metal of the bottom plate 325 of the capacitor C2 extends to the position of ohmic contact 223 shown in FIG. 9A via interconnect line 341 to make contact with the IF output resistor 215.

Referring again to FIG. 10, the active material 311 of diode D2 makes contact with the overlying interconnect metal of node 177 via ohmic contacts 307 and 309 (not shown in FIG. 11). These ohmic contacts are shown in the cross-section of FIG. 13.

Referring to FIG. 13, the ohmic contacts 307 and 309 lie under a more or less U-shaped section of Schottky metal 345. This Schottky metal 345 underlies at least a portion of the interconnect metal of node 177/center conductor 181.

FIG. 11 shows that the Schottky metal 345 which underlies the interconnect metal of node 177 extends to the left over the active region 349 of diode D1. Referring again to FIG. 10, the cathode of this diode is coupled by ohmic contacts 351 and 353 to the bottom plate 357 of the capacitor C1 is shown as a solid border line in FIG. 10. The closer pitch of the diagonal hatching lines at 359 and 362 indicates the portion of the bottom plate 357 of C1 which overlies the ohmic contacts 351 and 353. No portion of the bottom plate 357 electrically contacts the Schottky metal 345 of the D1 anode.

The top plate of the capacitor C1 is shown at 361 in FIG. 11 and is an extension of the metal of an air bridge 363. The outline of the post of this air bridge 363 is shown in dashed lines at 365 in FIG. 10. As best seen in FIG. 9A, the bottom plate 357 of the capacitor C1 extends via interconnect metal pathway 367 to the position of an ohmic contact 217 which couples the capacitor C1 to the IF output resistor 213.

The air bridge 363 best seen in FIGS. 10 and 12 connects the top plate of the capacitor C1 to the junction between the buried layered resistors 139 and 135 at the position of an ohmic contact 369. This ohmic contact is best seen in FIG. 12 which is a cross section which passes through the post segment of the air bridge 363. As seen in FIG. 12, the metal of the air bridge 363 descends upon a layer 371 of interconnect metal through an opening in the nitride layer 303. This structure connects the top plate of the capacitor C1 to the junction between the resistors marked 139 and 135 in the N+ layer.

Resistor 139 extends to the left in FIG. 12 and terminates in an ohmic contact 375 and a layer of interconnect metal 377 which is in contact with the ground plane segment 185 of the CPW.

Figure 14:
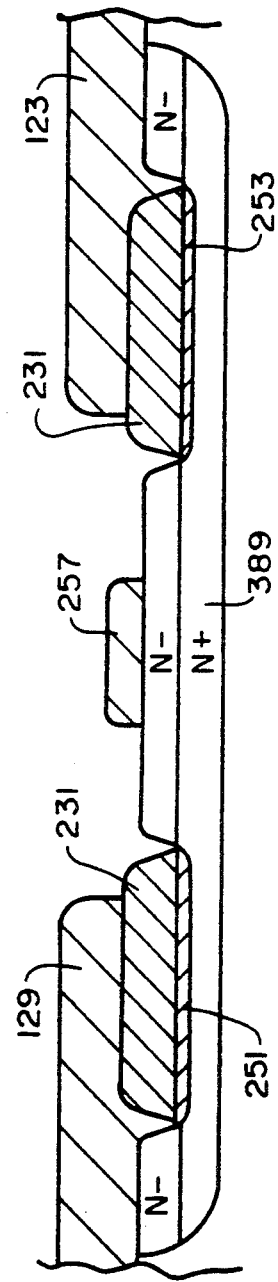
FIG. 14 is another sectional view through the layout of FIG. 10 taken along the section lines 14—14'.

Referring to FIG. 14, there is shown a sectional view through the layout of FIG. 10 taken along section line 14—14′ on the right side of FIG. 10. The section of FIG. 14 reveals the structure of the diode D3. Like structures in FIGS. 10 and 14 have been given the same reference numerals. The active area of diode D3 is shown at 389.

Figure 15:
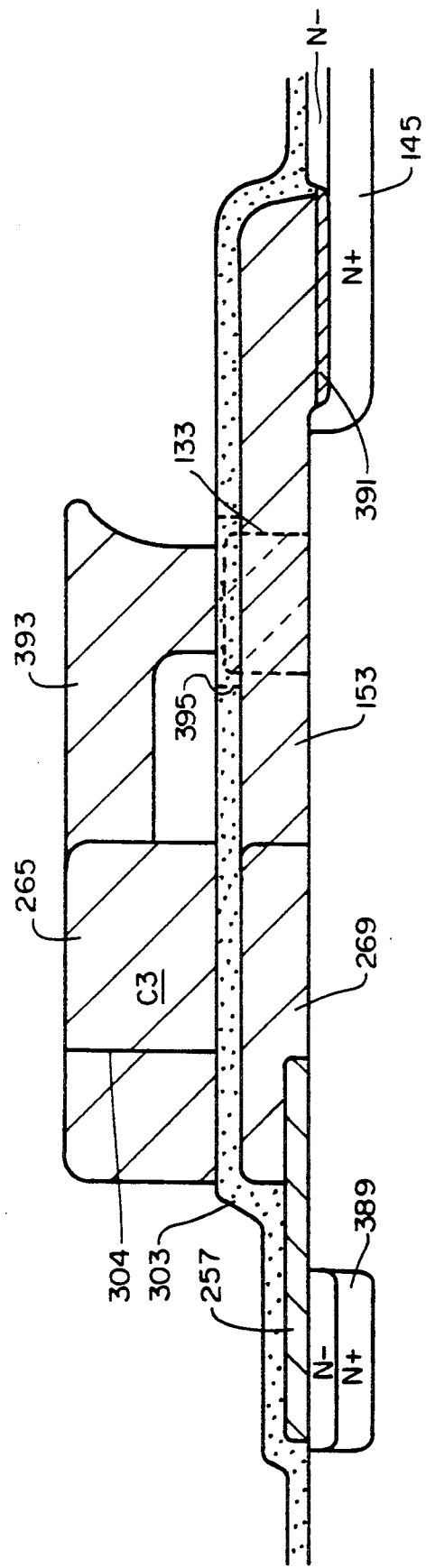
FIG. 15 is a sectional view taken through the layout of FIG. 9A taken along the section line 15—15'.

Referring to FIG. 15, there is shown a cross sectional view of the of the structure of the layout shown in FIG. 9A taken along section lines 15—15′ at the right side of FIG. 9A. The section of FIG. 15 is essentially a section through diode D3, capacitor C3 and the interconnect metal 153 leading to the IF output resistor 145 for the sampler which samples the RF excitation waveform. The anode 257 of diode D3 is shown as the Schottky metal layer 257 which overlies the active region 389 of diode D3 and underlies the bottom plate 269 of the capacitor C3. The top plate 265 of the capacitor C3 is insulated from the bottom plate 269 by a layer of nitride 303. Note that the top plate of the capacitor C3 has an enclave formed therein indicated by vertical line 304 such that no portion of the top plate overlies the Schottky metal of anode 257. This reduces parasitic capacitance between the anode 257 of the diode and the top plate 265 of the capacitor C3.

The bottom plate 269 of the capacitor C3 extends via interconnect metal 153 to the location of an ohmic contact 391 to couple the bottom plate of the capacitor C3 to the IF output resistor 145. The top plate 265 of the capacitor C3 is an extension of an air bridge 393 which couples the capacitor C3 to the ground plane conductors 133 and 163B through a hole 395 in the nitride layer.

Appendix A attached hereto is a detailed process schedule for a process suitable for building the integrated structure described herein.

There follows some descriptive material from the parent cases hereto which describe equivalent time sampling and a suitable nonlinear transmission line for the generation of local oscillator strobe pulses as well as the theory of generation of IF signals using diode based samplers.

EQUIVALENT TIME SAMPLER

Figure 16:
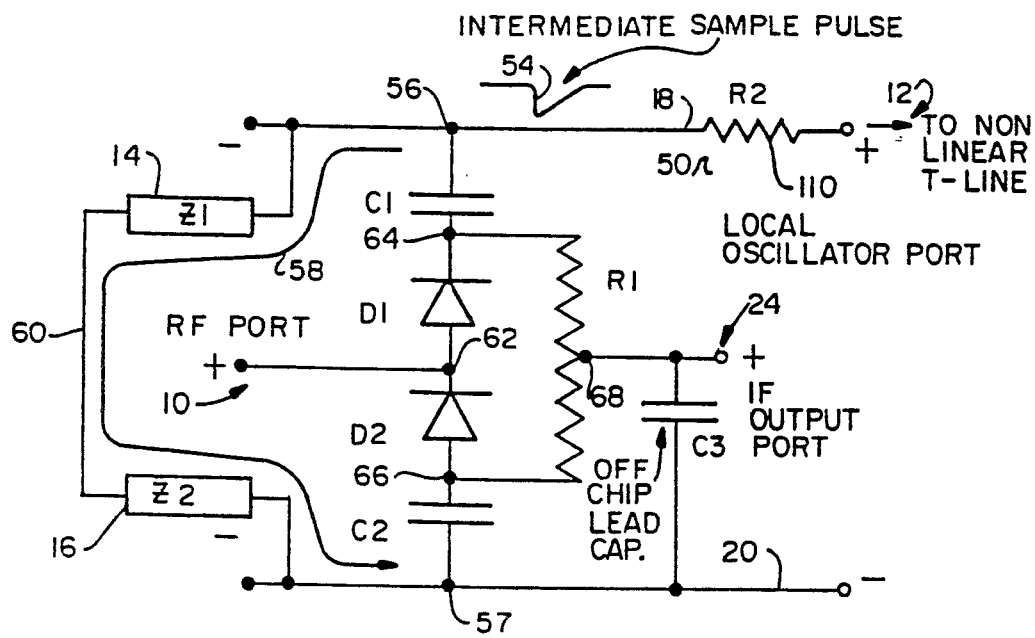
FIG. 16 is a schematic diagram of a single voltage source sample head.

Referring to FIG. 16, there is shown a schematic diagram of the signal sampler which is implemented in integrated form. The circuit of FIG. 16 receives a high frequency RF signal to be sampled at an RF port 10. A local oscillator port 12 receives local oscillator sample pulses, usually sawtooth in shape, at a frequency such that the $n_{th}$ harmonic of the local oscillator frequency is offset from the fundamental frequency of the periodic RF signal to be sampled by a frequency Delta. The local oscillator pulses are differentiated by a shunt inductance symbolized by the impedances Z1 and Z2, 14 and 16, respectively in FIG. 16. These shunt inductances are implemented by a short-circuited section of a slot line portion of the coplanar waveguide serving to guide the RF signal to be sampled and will be described in more detail below. The slot line guides the sample pulses to the location of an air bridge short circuit termination where they are reflected back toward nodes 56 and 57. The resultant voltage between nodes 56 and 57 is the derivative of the sample pulse. The sample pulse propagates along the slot line in the even mode whereas the RF propagates along the coplanar waveguide in the odd mode thereby minimizing coupling between the two signals.

The sample pulses appearing across nodes 56 and 57 turn on diodes D1 and D2 each time a sample pulse occurs. Because the RF signal is offset from the $n_{th}$ harmonic of the local oscillator frequency by the frequency Delta, the sample pulses will sample the RF wave form once every n cycles. There results an output signal at an intermediate frequency at an intermediate frequency (IF) output port 24. This sampling process is illustrated in FIG. 17.

Figure 17:
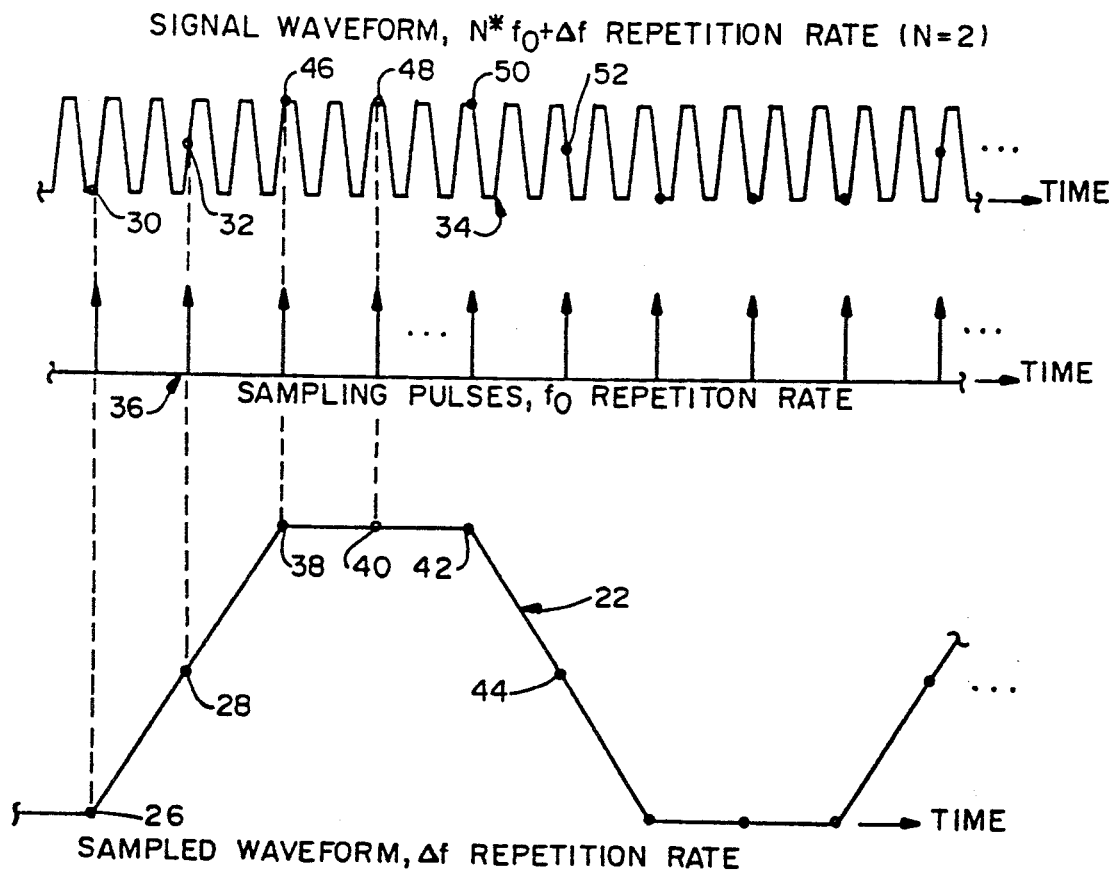
FIG. 17 is a diagram illustrating equivalent time sampling.

In FIG. 17, the wave form 22 represents the output signal at the intermediate output port 24 in FIG. 16. The points marked 26, 28, 38, 40, 42 and 44 are typical sample points, and correspond, respectively, to the points 30, 32, 46, 48, 50 and 52 on the RF wave form 34. The wave form 34 is the signal to be sampled and must be periodic.

The impulses shown at 36 represent the differentiated sample pulses, and are termed Delta functions. The sample pulses occur at a repetition rate of $f_0$ which is the local oscillator (LO) frequency. Delta functions are the most desirable form of sample pulse to use because the harmonic amplitude of a Delta function pulse is level throughout the harmonic spectrum. This allows a broader range of RF frequencies to be sampled without voltage conversion loss. The integrated nonlinear transmission line allows the rise time of the incoming sample pulses to be substantially shortened. When this fast edge is differentiated, a sampling pulse results which has a pulse width which is substantially equal to the rise time of the fast edge. Since this pulse width can be anywhere from 7.8 picoseconds to 1.5 picoseconds, an approximation of a true Delta function having a pulse width substantially near 0 can be achieved with the disclosed integrated, monolithic structure.

Inspection of FIG. 17 shows how the occurrence of the sampling pulses corresponds to the sample points on the RF wave form 34 and the corresponding points on the wave form shown at 22. The sampled output wave form occurs at a frequency of Delta. Note also that the voltage at the sample point 26 corresponds to the voltage of the RF wave form at sample point 30 while the voltage at the sample point 28 corresponds to the voltage of the RF sample waveform 34 at point 32. Likewise, the sample voltage at points 38, 40, 42, and 44 correspond, respectively, to the voltage at the points 46, 48, 50, and 52 on the RF waveform 34.

The manner in which this sampling is accomplished is as follows. Referring to FIG. 16, consider the case where the RF is off such that no RF signal 34 appears at the port 10. Assume that the local oscillator is turned on at time T=0 and that intermediate sample pulses such as the pulse shown at 54 begin arriving at the node 56. The current resulting from each intermediate sample pulse travels along the path 58 through the inductance segments Z1 and Z2 representing the inductance of the slot line portion of the RF coplanar waveguide. It can be shown from network theory that the voltage at node 56 is equal to the derivative of the input voltage at the local oscillator port 12 times a constant equal to the round trip inductance of the short circuited slot line path divided by the resistance in series with the path.

Note that the intermediate sample pulse 54 has a one edge which is much shorter than the other edge. It is the differentiation of this sharp rise time which causes the Delta function sample pulses shown at 36 in FIG. 17. The first sample pulse is at least two volts and therefore turns both diodes D1 and D2 on hard for the duration of the sample pulse. When the pulse is over, a large amount of current has passed in the forward direction through capacitors C1 and C2, but very little current has passed through them in the reverse direction. This leaves a charge Q on capacitors C1 and C2, which gives rise to a voltage Q/C1 reverse biasing diode D1 and Q/C2 reverse biasing the diode D2. Because the diodes are now slightly reverse biased, the next sample pulse does not turn the diodes on quite as hard as they were turned on by the first sample pulse. However, the diodes are still forward biased by the second sample pulse which causes more charge to be left on each of the capacitors by the end of conduction of the second sample pulse. This process continues until the reverse charge leakage through and around the diodes D1 and D2 through the resistor R1 just equals the forward charge stored during a sample pulse interval. This equilibrium condition will always occur at a fixed voltage $V_r$ across the diodes for a given pulse amplitude and resistance R1.

Now consider the case where the RF signal is on, but the frequency of the RF is an exact harmonic frequency of the local oscillator fundamental frequency. This means that the sample pulse will always occur at the same place in each RF signal cycle. Therefore, whenever the diodes are on, the RF signal will have the same voltage at node 62 in FIG. 16. The diode pair D1 and D2 will now self bias in the manner described in the previous paragraph until each diode has regained its reverse bias voltage $V_r$. Thus, if the voltage at node 62 is $V_{RF}$ when the sampled pulse arrives, then the voltage at node 64 is $V_r+V_{RF}$, and the voltage at node 66 is $-V_r+V_{RF}$ in the steady state. This means that the voltage at the center tap node 68 of the resistor R1 is simply the DC value, $V_{RF}$.

If the fundamental frequency of the RF signal at the RF port 10 is offset from some harmonic of the local oscillator by the frequency Delta, then the sample pulses will cause sample voltages at the output node 68 that will trace out one complete RF waveform cycle in the interval 1/Delta seconds. This means that the time axis of the RF signal has been scaled by a factor of $f_{RF/Delta}$ with no voltage conversion loss in the ideal case. Thus it is seen that the final output signal at node 68 is the same as the RF input signal except it is on a scaled time axis.

In time domain instruments, it is important that the amplitudes of the RF signal harmonics be preserved as well as preserving the shape of the RF fundamental signal. Of course, if the RF signal is a sign wave, there are no harmonics. However, the signal sampler works with any periodic RF signal, and it is well known that periodic signals of a nonsine wave nature have harmonic components defined by the Fourier expansion of the time domain function representing the signal. Sample pulses having pulse widths substantially approximating the pulse width of a Delta function are used. The result is an absence of voltage conversion loss because of the unity strength of the harmonics of the local oscillator frequency at every harmonic of interest.

There is power conversion loss in the sampler since the RF is being sampled for a small fraction of each cycle.

The time scale factor relating the time access of the RF signal 34 in FIG. 17 and the time scale of the sampled waveform 22 in FIG. 17 is $f_{RF}/f_{IF}$ where $f_{IF}$ is the intermediate frequency of the output signal at node 68. This is the difference frequency between the frequency of the RF signal, $f_{RF}$, and the nearest harmonic of the local oscillator frequency, i.e., Delta. Real time on the time axis of the signal 34 in FIG. 17 is multiplied by this scale factor to yield the equivalent time on the time axis for the signal 22 in FIG. 17. If the intermediate frequency waveform is displayed on an oscilloscope, the horizontal axis of the display will be in equivalent time. Actual time is obtained by dividing by the scale factor. The process symbolized by FIG. 17 is referred to as "equivalent time sampling".

Referring to FIG. 18, a short summary of the operation of nonlinear transmission lines will be helpful in understanding the operation of the equivalent time sampling circuit. A nonlinear transmission line is a relatively high impedance transmission line which is periodically loaded with Schottky diodes serving as voltage-dependent shunt capacitances. FIG. 18 is an equivalent circuit diagram for a nonlinear transmission line such as may be used in the invention and FIG. 19(A) shows the input pulse entering the nonlinear transmission line while FIG. 19(B) shows the shape of the output pulse which emerges as a result of propagation of the input pulse down the nonlinear transmission line. The propagation delay time per section of the line is equal to the square root of the transmission line inductance times the line capacitance per section. The nonlinear capacitors make the propagation delay time a function of voltage. For the diode polarity shown in FIG. 18, the diode capacitance increases with voltage so a more positive voltage on the line will have a longer delay time. This allows the more negative portions of the trailing edge of a pulse to catch up with the more positive portions of the trailing edge and the peak which shortens the rise time (or fall time depending upon perspective) of the trailing edge. Further, the voltage dependent capacitance causes the more positive peak to lag behind the more negative portions of the leading edge as is illustrated in FIG. 19(B).

While the voltage dependent delay time causes one edge of an input pulse to get steeper and stretches out the other edge, dispersion on the line causes both edges to stretch out. The rise time of the pulse will therefore be reduced as the pulse propagates along such a nonlinear transmission line until, finally, the tendency of the nonlinear delay to reduce the rise time just balances the tendency of the dispersion to increase the rise time. If diode series resistance can be neglected and the diode capacitance is much larger than the capacitance per section of the line, the final limited fall time of the pulse at the output of the nonlinear transmission line is on the order of but longer than the square root of the inductance of the line section times the capacitance per section. If the nonlinear transmission line is implemented in the form of a monolithic integrated circuit, this limiting rise time can be less than a picosecond.

Rise times of 7.8 picoseconds to 1.5 picoseconds are obtainable with today's process technology. Since the slope of the edge 70 in FIG. 19(B) is negligible compared to the slope of the edge 72, the derivative of the waveform of FIG. 19(B) is a narrow impulse function having a pulse width equal to the rise time of the edge 72. Hereafter, the time between the points 74 and 76 on the waveform of FIG. 19(B) will be referred to as the rise time, although it can also be called the fall time.

The diode arrangement of FIG. 16 is used because it allows both diodes to have the same polarity to the local oscillator. However, to the RF signal to be sampled, the diodes still appear to be anti-parallel, thus imposing only odd harmonic distortion on the RF signal. This arrangement provides natural isolation between the RF signal and the local oscillator signal since the local oscillator output is a balanced signal while the RF signal is unbalanced. Since the short circuited transmission line represented by the inductances 14 and 16 differentiate the oscillator waveform, that waveform can be a square wave or sawtooth wave rather than a series of impulses. Generation of a series of impulses by a local oscillator is possible but difficult.

Assuming that the local oscillator pulse is narrow enough, diode capacitance and series resistance directly determine the bandwidth of the sampler in two ways. First, the capacitor loading of the shunt diodes on the RF line causes the RF voltage at the diodes to have a pole in its frequency response at a frequency 1/25C1. Thus for an RF bandwidth of 300 GHz, the capacitance of the diode loading has to be less than 10 femtofarads per diode. Second, diode capacitance and series resistance determine the turn-on time of the sampling diode. In the circuit of FIG. 16, it can be shown that the turn-on time of the sampling diodes is 1.8 picoseconds (10% to 90% rise time). This rise time exists for a local oscillator source resistance of 100 ohms, a characteristic impedance of 75 ohms for the shorted slot line, a series diode resistance of 60 ohms and for the series capacitance of the two diodes equal to 5 femptofarads. This means that if the diode is biased so that it turns on at the 85% point of the applied sample pulse, and if the shorted transmission line round trip line is 4 picoseconds, that the sampling diodes will be on for 1 picosecond yielding a bandwidth of roughly 300 GHz.

In order to achieve the high bandwidth and low values for the parasitic elements given in the previous example, it is necessary to have the local oscillator drive the sampling circuit with sufficient edge speed to develop the needed voltage across the short circuited slot line before the reflected wave returns from the short circuit termination and shuts the sampling diodes off. This means, for the design of the previous example, that the transition time or edge speed of the intermediate pulses emerging from the nonlinear transmission line must be preferably less than 4 picoseconds. By using a nonlinear transmission line to reshape the input pulse, usually a sinewave, from the local oscillator, this transition time requirement can be met. However, to couple pulses having such a fast edge speed to the local oscillator port of the sample circuit without distortion, the nonlinear transmission line must be integrated on the same chip with the sampling diodes and differentiation circuit. This means that hybrid technology and any construction technology other than full integration on the same surface of a substrate is not acceptable since the dimensional tolerances and spatial separation of these other construction options lead to losses, dispersion and parasitic loading, i.e., parasitic inductance, which would distort or destroy the fast edge speed achieved by the nonlinear transmission line.

Figure 20:
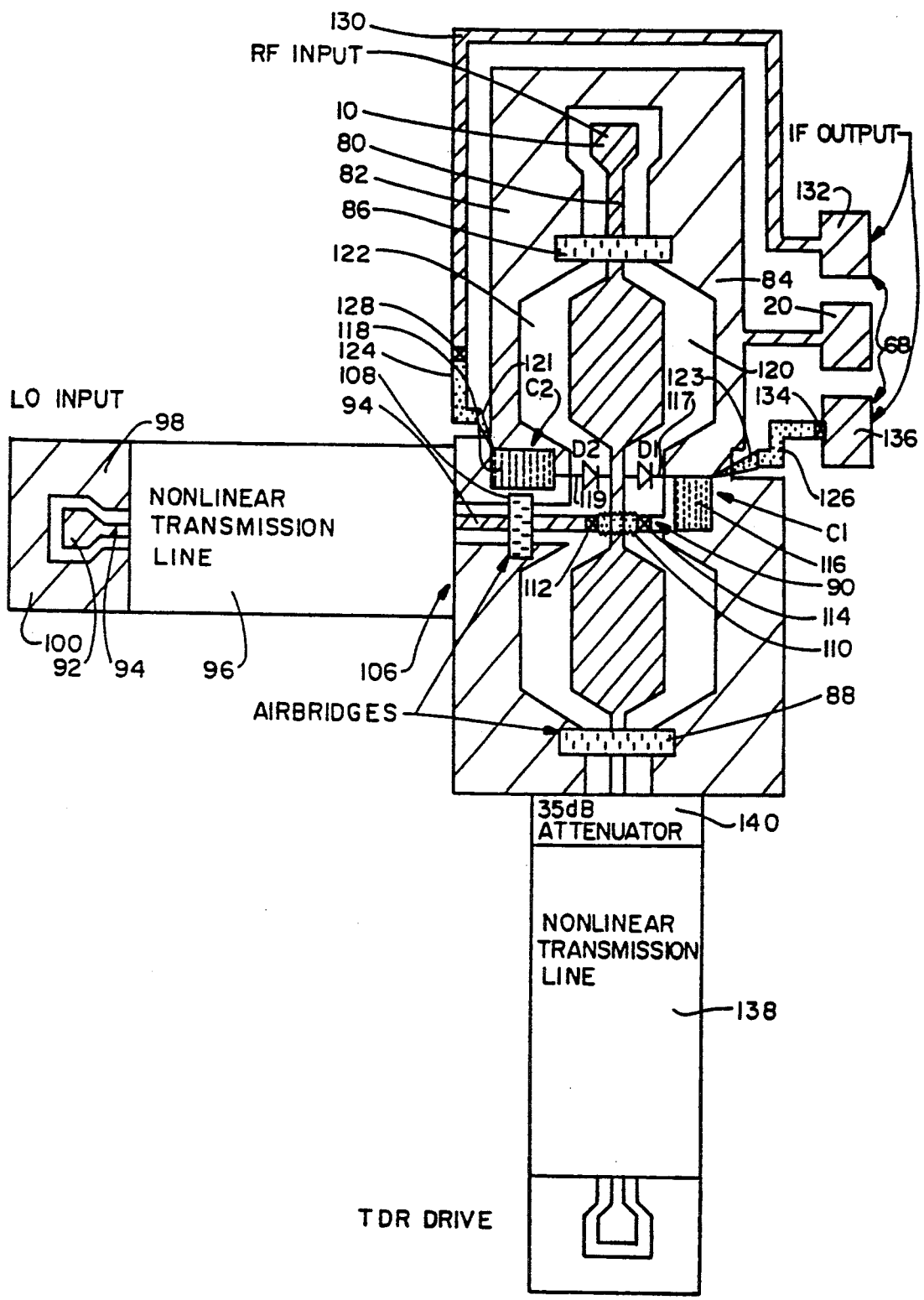
FIG. 20 is a plan view of the layout of an integrated sampling circuit like that shown in FIG. 16.

The sampling head is integrated on the same side of a substrate as a nonlinear transmission line with a single level of metallization plus air bridges. The requirement for monolithic implementation is quite demanding since it prohibits all prior art structures for sampling head designs which use microstrip or coax-to-slot-line local oscillator drive The integrated structure for the sample head is shown in plan view at overview scale in FIG. 20. In FIG. 20, the RF input port 10 consists of a conductive pad connected to a center Conductor 80 of an integrated coplanar waveguide. This integrated coplanar waveguide serves to carry the RF signal to be sampled toward the sample diodes D1 and D2 shown in the middle of FIG. 20. FIG. 20 is intended only to show the layout of the sample head schematically and not the exact integrated structure. More detail of the exact integrated structure will be given in FIG. 22.

The integrated coplanar waveguide for the RF signal is comprised of the center conductor 80 and two ground plane conductors 82 and 84. The substrate is comprised of gallium arsenide, which has an N+ buried layer lying beneath an N− layer both layers being formed by molecular beam epitaxy. The doping of the N+ layer is $3 \times 10^{18}$ per cubic centimeter, while the doping of the N− layer is $3 \times 10^{16}$ per cubic centimeter. Areas underlying the RF signal integrated coplanar waveguide which need to be insulating such as most of the area between the center conductor 80 and the ground planes 82 and 84 are damaged by proton implants so as to convert the substrate in such areas into a semi-insulating material. This prevents shorting between the semiconductor and the ground plane conductors 82 and 84.

An air bridge 86 is formed to connect the ground planes 82 and 84 above the sampling diodes. Likewise, an air bridge 88 connects the two ground planes 82 and 84 at a location below the sampling diodes. These two air bridges, 86 and 88, serve as short circuit terminations for the slot line comprised of the ground plane conductors 82 and 84. These short circuit terminations cause the reflection of the incoming sample pulses propagating down the ground plane conductors 82 and 84 back toward the point of injection adjacent to the sample diodes.

The point of injection of the sample pulses is shown at 90. Input sample pulses are coupled to a contact pad 92 formed from the metal of the center electrode 94 of a nonlinear transmission line 96. The nonlinear transmission line also has two ground plane conductors 98 and 100. The structure of the nonlinear transmission line will be described in more detail below. The sample pulses are coupled into the nonlinear transmission line by coupling to the center electrode 94 via pad 92. This causes the sample pulses to propagate down the nonlinear transmission line 96 in coplanar waveguide mode. The intermediate pulses which emerge from the nonlinear transmission line are coupled into the RF signal coplanar waveguide at 90 in a manner to excite slot line propagation. That is, the center conductor 102 is coupled only to the ground plane segment 106 at point 90 and the ground plane conductors 98 and 100 of the nonlinear transmission line are coupled to the ground plane conductor 104. This applies the intermediate pulse across the slot in the RF coplanar waveguide so as to excite slot line mode propagation of the intermediate pulses toward the air bridges 86 and 88. An air bridge 108 shorts the two sections of ground plane 104 and 106 together to suppress even modes of propagation on the nonlinear transmission line and to provide continuity in the RF coplanar waveguide ground plane 82.

A buried 50 ohm resistor 110 formed in the N+ layer of the substrate is used to terminate the coplanar waveguide carrying the intermediate sample pulses in its characteristic impedance. The center conductor 102 of the nonlinear transmission line makes an ohmic contact to the buried N+ layer via holes etched through the N− layer and shown symbolically at 112 and 114. The center conductor 80 of the RF signal coplanar waveguide is coupled to an airbridge which passes over the buried 50 ohm resistor 110 to make contact with a continuation of the center conductor 80.

The entire substrate is proton implant damaged to render it semiinsulating prior to forming the waveguides thereon. Certain areas are excepted from this proton implant damage, however. Those areas include the buried path of the resistor 110 and the resistor 126, and the junction areas of the diodes D1 and D2 and all diodes of the nonlinear transmission line.

The center conductor 102 of the nonlinear transmission line is is coupled through the resistor 110 to the ground plane conductor 84. The ground plane conductors 104 and 106 of the nonlinear transmission line are electrically coupled to ground plane 82 of the RF signal coplanar waveguide. As a result, the intermediate sample pulses emerging from the nonlinear transmission line 96 are coupled into the slot line mode of propagation on the RF signal coplanar waveguide at the point of injection 90. When each intermediate sample pulse arrives back at the point of injection, the sample diodes D1 and D2 are turned off thereby stopping the process of charging two integrated capacitors C1 and C2. Each of the capacitors C1 and C2 is comprised of a top plate of plated gold formed over a nitride layer which in turn is formed over a layer of evaporated Schottky metal which forms the bottom plate of the capacitor and is coincident with the ground plane conductors 82 and 84. The top plates of the capacitors C1 and C2 are shown at 116 and 118, respectively.

The resistor 110 implements the resistor labeled R2 in FIG. 16. The capacitors C1 and C2 correspond to the capacitors C1 and C2 in FIG. 16 and the diodes D1 and D2 correspond to the diodes D1 and D2 in FIG. 16. The cathode of the diode D1 is coupled to the top plate of the capacitor C1 by an air bridge 117. The anode of the diode D1 is an extension of the Schottky metal for the center conductor 80 of the RF signal coplanar waveguide and extends out over a junction area of unimplanted N− substrate thereby forming a Schottky diode. Likewise, the anode of the diode D2 is coupled via an air bridge 119 to the top plate 118 of the capacitor C2, while the cathode of the diode D2 is an extension of the center conductor 80 of the RF signal line and make contact to an unimplanted portion of the N− layer via ohmic contacts to form the Schottky diode.

The resistor R1 in FIG. 16 is implemented by a segment of the N+ buried layer which is masked off during the proton implant. This area is shown as two segments at 124 and 126. The area 124 is coupled to the top plate 118 of the capacitor C2 via an air bridge 121. The air bridge 121 is coupled to the buried resistor segment 124 via an ohmic contact (not shown). The resistor segment 126 is coupled to the top plate 116 of capacitor C1 via an air bridge 123. An ohmic contact couples the air bridge to the buried resistor segment 126. The cross-sectional area and path length of the resistor segments 124 and 126 are equal such that each resistor segment has an equal resistance. The resistor segment 124 is coupled via an ohmic contact at 128 to a conductive path 130 formed on the surface of the substrate which couples the resistor segment 124 to a contact pad 132 serving as output node 68 for the IF signal. The resistor segment 126 terminates in an ohmic contact at 134 to make electrical contact to a contact pad 136 which is also, by off chip connections, the output node 68. Separate contact pads 132 and 136 allows the diodes to be separately biased slightly differently if necessary to balance the circuit.

A second nonlinear transmission line 138 is used to inject test signals into the RF coplanar waveguide for purposes of testing the bandwidth of the sampler. This nonlinear transmission line 138 is not critical to the invention and may be omitted as it is used solely for testing the performance of the sampler.

A 35 DB attenuator 140 terminates the RF signal coplanar waveguide, thereby rendering the nonlinear transmission line 138 invisible to sources of RF signals coupled to the RF input port 10.

Figure 21A:
FIG. 21(a) is a circuit diagram of the sampling diodes laid out to correspond to the cross-section of the sampling diode structure shown in FIG. 21(b).
Figure 21B:
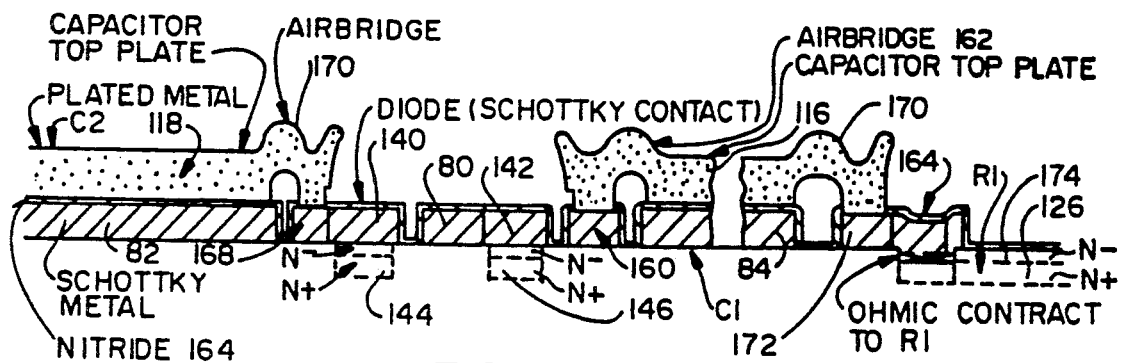
FIG. 21(b) is a cross-section of the diode and RF waveguide structure shown in plan view in FIG. 21(c).
Figure 21C:
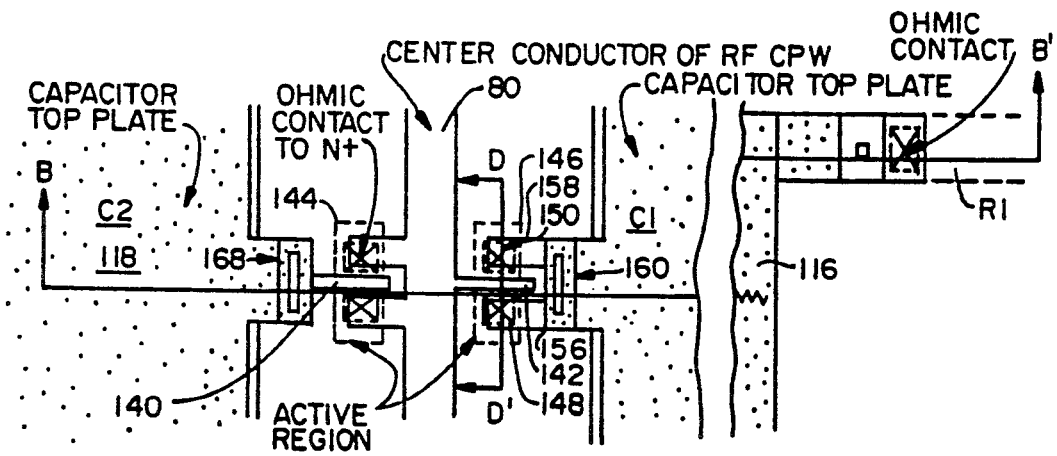
FIG. 21(c) is a plan view of the sampling diode and RF waveguide structure.
Figure 21D:
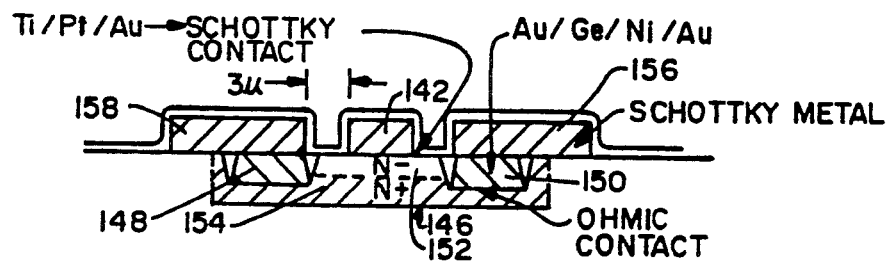
FIG. 21(d) is a cross-sectional view of a sampling diode.

Referring to FIGS. 21(A) through 21(D), there are shown further structural details of the sampling diode section of the preferred embodiment. FIG. 21(a) represents the schematic diagram implemented by the structure of FIG. 21(B) which is a cross section through the sampling diode portion of the structure but not passing through the anode portions of the diode structures. FIG. 21(C) is a plan view of the sampling diode and capacitor region. FIG. 21(D) is a cross-sectional diagram showing the structure of each sampling, Schottky diode. The position of the section line BB' in FIG. 21(C) shows the position of the cross section of FIG. 21(B). The position of the section line DD' in FIG. 21(C) shows the position of the section illustrated in FIG. 21(D). FIG. 21(A) is the schematic diagram of FIG. 16 laid out in a manner to spatially correlate to the structures shown below in FIG. 21(B). Corresponding structures in FIGS. 21(B) and 21(D) have corresponding reference numerals.

Referring jointly to FIGS. 21(B), 21(C) and 21(D), further details of the sampling diode portion of the structure are given. In FIG. 21(C), the diode anodes are shown as projecting fingers of Schottky metal at 140 and 142. An active region of N+ gallium arsenide is shown outlined in phantom for each diode at 144 and 146, respectively.

The center conductor of the RF signal coplanar waveguide is shown at 80. In FIG. 21(B) this is seen as a portion of the Schottky metal layer which is deposited on the surface of the proton implant damaged substrate.

The diode D1 to the right of the center conductor 80 in FIG. 21(C) is illustrated in cross section in FIG. 21(D) In FIG. 21(D), the diode anode 142 is seen as a strip of Schottky metal placed over the active region 146 between two ohmic contacts 148 and 150 which form connections to the cathode. These ohmic contacts are formed by etching holes down through the N− layer 152 shown in FIG. 21(D) to the level of the N+ buried layer 154 of the active region 146. These holes through the N− layer are aligned under two projecting fingers of Schottky metal 156 and 158 which form the cathode terminals. The outlines of these holes 148 and 150 are shown in dashed lines in FIG. 21(C) under the projecting fingers 156 and 158. The ohmic contact is comprised of a structure consisting of 108 angstroms of germanium, 102 angstroms of gold, 63 angstroms of germanium, 236 angstroms of gold, 100 angstroms of nickel and 6000 angstroms of gold followed by a high temperature 450° C. annealing step to form an alloy. The Schottky diode anode contacts are comprised of a three layer structure including titanium, platinum and gold formed in direct contact with the substrate. The projecting fingers 156 and 158 form the legs of a U-shaped island of Schottky metal best seen in FIG. 21(C) at 160. This U-shaped island of Schottky metal is connected to the top plate 116 of the capacitor C1 by an air bridge 162 best seen in FIG. 21(B). This air bridge is a bridge of conductive metal which joins the U-shaped island of Schottky metal shown at 160 in FIG. 21(C) to the plated metal 116 of the top plate of capacitor C1. Capacitor C1, as best seen in FIG. 21(B), is comprised of a top plate 116 of plated gold separated by a layer of nitride 164 from the bottom plate of the capacitor. The bottom plate of the capacitor is the layer of Schottky metal used to form the various components of the diodes and the ground plane 84.

The structure of the diode D2 on the left side of the center conductor 80 of the RF signal coplanar waveguide is similar to the structure of D1 except that a T-shaped island of Schottky metal shown at 168 is used to form the anode Schottky contact 140. This T-shaped section 168 is connected by an air bridge 170 to the top plate 118 of capacitor C2. This top plate is separated by the nitride layer 164 from the bottom plate of the capacitor comprising the Schottky metal layer 82. All areas of the substrate shown in FIG. 21(B) except the diode junction areas and the buried resistor 126 are proton implanted and semiinsulating.

The resistor R1 shown in FIG. 16 is best seen in cross-section in FIG. 21(B). An air bridge 170 couples the top layer 116 of the capacitor C1 to an island 172 of Schottky metal. This island 172 is formed over a ohmic contact hole which has been etched through the N− layer 174 to the N+ layer below. In FIG. 21(B) only the resistor segment 126 is visible. The Schottky metal 172 contacts a gold-germanium alloy in contact with the N+ layer 126 to form an ohmic contact. A similar structure exists on the other side of the RF signal coplanar waveguide making contact between the top plate of the capacitor C2 and the resistor segment 124.

The method for forming air bridges is well known in the art of gallium arsenide processing but will be summarized here for completeness. A complete description of the process for fabricating the structure of the preferred embodiment is appended hereto as Appendix B. The first step in forming an air bridge between two metal patterns to be connected is to deposit the metal and pattern it to form the two nodes to be connected. Following this, a first layer of photoresist is deposited to coat the entire wafer. Thereafter the photoresist is developed in the area where the bridge is to be formed so as to leave contact holes to the metal surfaces to be electrically connected. Metal evaporation follows with an evaporation of 100 angstroms of titanium, 2000 angstroms of gold and another 300 angstroms of titanium being typical. This evaporated metal covers not only the exposed surface of the metal nodes to be connected but also the exposed surfaces of the photoresist. Next, a second layer of photoresist is deposited and developed to open a hole in the second layer of photoresist in the area where the air bridge is to be formed. The developing step for the second layer of photoresist includes formation of a contact hole to the evaporated metal layer for use in making contact for electroplating of a later defined gold layer. In the locations where the air bridge is to be formed, the top titanium is etched away to expose the underlying 2000 angstrom layer of gold. Then two microns of gold are electroplated onto the wafer by making electrical contact to the evaporated metal layer. After electroplating the gold, the top layer of photoresist is dissolved by spraying the wafer with acetone. This leaves the evaporated layers of titanium, gold and titanium in the areas outside the area of the bridge exposed. These three layers of evaporated metal outside the bridge are then etched away in a conventional manner. Finally, the wafer is dipped in acetone to dissolve the remaining layer of photoresist to leave the air bridge standing between the two nodes to be connected.

Figure 22:
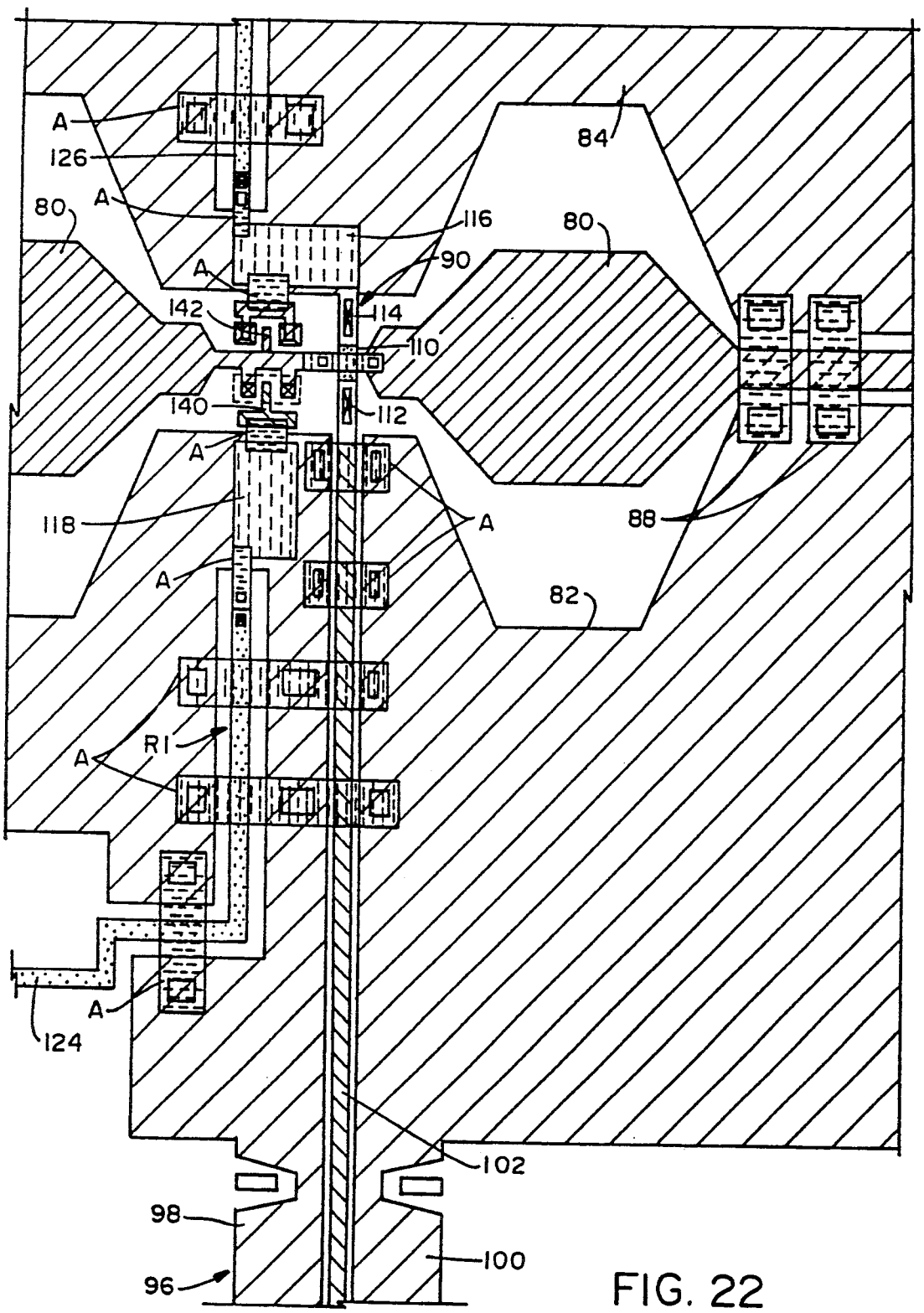
FIG. 22 is a partial plan view of the integrated sample head of FIG. 16 showing the interconnections of the diodes, capacitors, resistors and coplanar waveguides which are combined to implement the circuit of FIG. 16.

Referring to FIG. 22, there is shown in plan view a layout of the sampling diode portion to show more detail regarding the interconnection of the various structural components. In FIG. 22, structures which coincide with structures detailed on FIGS. 20 and 21, share the same reference numerals. The rectangular boxes inside the air bridge structures represent the metallic posts which support the air bridge. Rectangular boxes with Xs inside represent ohmic contacts to the underlying N+ layer. The multiplicity of air bridges across the gaps between ground plane conductors are used to maintain the separate segments of ground plane conductor at equal potentials so as to suppress even or slot line mode propagation. Because the mode of propagation for the sample pulses along the coplanar waveguide including center conductor 102 is even whereas the mode of propagation along the slot line portion of the RF signal coplanar waveguide is odd, there is little coupling between the RF signal coplanar waveguide and the coplanar waveguide carrying the sample pulses. Each coplanar waveguide has two propagation modes, CPW and slot-line. The odd mode, here called the CPW or coplanar waveguide mode, has electric field lines which point away from the center conductor across the gaps and toward the ground plane conductors. The even mode, here referred to as the slot line mode, has electric field lines which point in the same direction across the gaps between each ground plane and the center conductor. As long as the loading on the RF signal coplanar waveguide is symmetric about the center conductor, the slot line mode will not couple to the coplanar waveguide mode carrying the RF. It will be noted from FIG. 22 that the sampling diodes and series capacitors connected across the slot are arranged to load the RF signal line symmetrically.

The intermediate pulses arriving in CPW mode from the nonlinear transmission line are coupled in slot line mode into the RF signal coplanar waveguide at point 90. After traveling for two picoseconds along the slot line in both directions, the intermediate pulses encounter an air bridge shorting together the two ground planes which form the slot line. Only one such air bridge is shown at 88 in FIG. 22 with the air bridge to the left of the injection point 90 being out of view but shown at 86 in FIG. 20. The air bridges short out the intermediate pulse waveform and brings the voltage back to 0 at the diodes after the four picosecond round trip time thereby shutting off the diodes. The resulting voltage waveform across the diodes appears as a differentiated version of the intermediate pulse.

Figure 23:
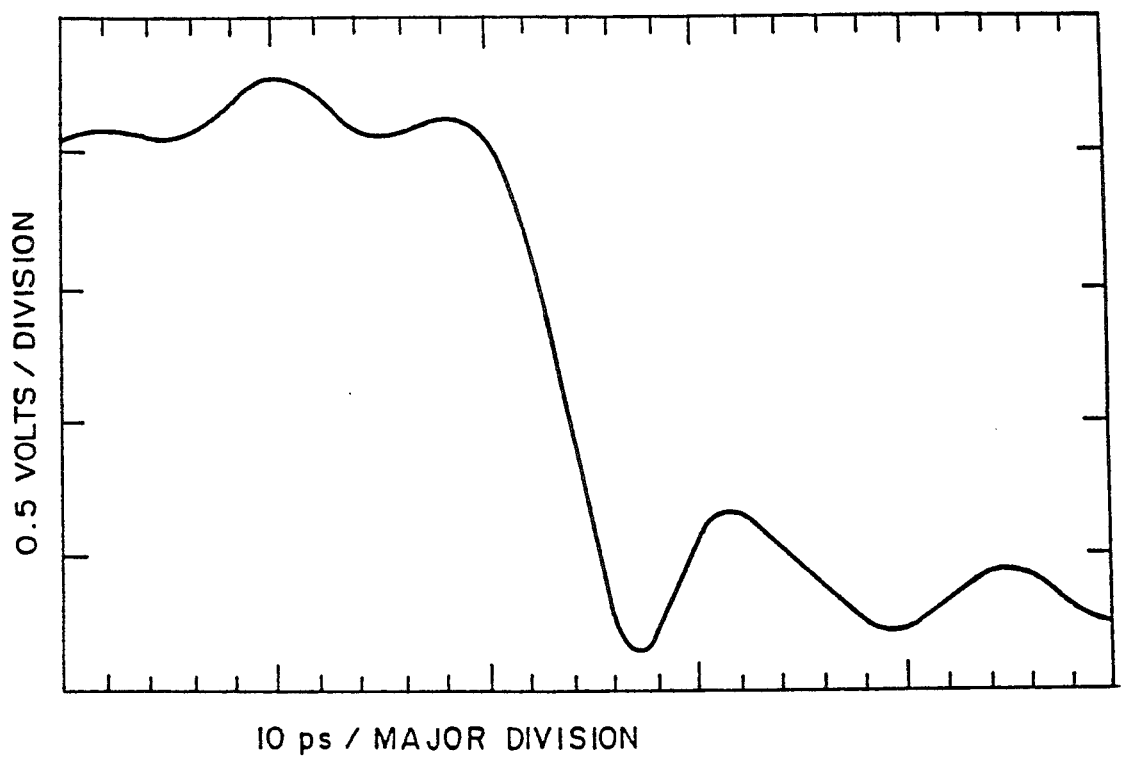
FIG. 23 is an illustration of a fast edge which is sampled using a sample head having the construction of FIG. 22.

The bandwidth of the sampler circuit is so large, it can only be measured indirectly through a built-in TDR pulse generator shown at 138 in FIG. 20. This built-in TDR pulse generator is identical to that used to generate the local oscillator intermediate pulses. The transition time at the output of the nonlinear transmission line 138 should be on the order of 2.8 picoseconds. The transition time measured by the sampling head is 4 picoseconds as shown in FIG. 23. With a nonlinear transmission line having an 8.5 picosecond per millimeter reduction in fall time of a length sufficient to provide a falling edge of less than 2.5 picoseconds fall time with larger amplitude, it is possible with the sampler head design of FIG. 22 to achieve sampling head bandwidth of 200–300 GHz. A larger intermediate pulse output amplitude will allow the differentiating slot line to be made narrower thereby eliminating the need for the hour glass shape of the RF sample coplanar waveguide. The hour glass shape is used in the embodiment shown in FIG. 22 to emphasize the inductance by increasing path length so as to increase the amplitude of the sample pulses that turn on the diodes. Because the amplitude of the sample pulse is the derivative of the input voltage of the intermediate sample pulse times a constant equal to the inductance of the round trip path from the injection point to the air bridge and back again divided by the resistance of this path, increased inductance increases the voltage of the sample pulses across the diodes.

Improvement in the sampling bridge performance can also be made by using lower resistance diodes. In the embodiment shown in FIG. 22, the junction area is 2×5 microns which results in a 12 femtofarad 0 bias capacitance. With suitable adjustments in geometry and doping, lower diode series resistance and possibly lower junction capacitance can be achieved.

The conversion efficiency of the sampling head design of FIGS. 20 through 22 when measured at 5 GHz and the intermediate frequency output port externally loaded by a 330 picofarad capacitance (cable capacitance of connections to chip) represented by capacitor C3 in FIG. 16, and a 1 megohm parallel resistance, there was no voltage conversion loss within the accuracy of the measurement (0.5 dB). The power conversion loss was 43 dB which was also the approximate noise figure. This yields a minimum detectable signal of 90 nanovolts per square root Hertz. For an intermediate frequency bandwidth of 10 kHz, the minimum detectable voltage is 9 microvolts. The sampler was observed to be within 0.6 percent of linearity from −60 dBm to +3 dBm. The RF to IF isolation ("blow-by") was 55 dB, while local oscillator to IF isolation was 63 dB, and local oscillator to RF isolation ("kick-out") was 68 dB.

An ideal sampler would have perfect isolation between all ports except at the intermediate frequency where a time scaled representation of the RF signal would appear with no voltage conversion loss in amplitude to any RF frequency. Further, the local oscillator and RF ports of an ideal sampler would be perfectly matched at all frequencies. When parasitics are accounted for in the sampler model, however, it is possible for the RF to couple directly or "blow-by" to the intermediate frequency port through diode capacitance and reverse leakage. Loss of isolation between the local oscillator and RF ports can occur if the bridge is not perfectly balanced or if the intermediate frequency drive is not balanced. Such imbalance can result in "kick-out" of the local oscillator pulse onto the RF line. Imbalance also causes a DC offset in the intermediate frequency voltage proportional to the local oscillator amplitude. These considerations must be taken into account when designing a layout.

Other layouts are possible besides structure illustrated in FIGS. 20 through 22. For example, a series capacitor arrangement could be used to differentiate the intermediate pulses, however, the layout shown in FIG. 22 is more convenient since the parasitic inductance of the slot line differentiator is used to form the differentiating circuit.

Although the fabrication of the device is completely specified in Appendix B, a short summary of the fabrication is given here for completeness. Schottky diodes are formed on gallium arsenide molecular beam epitaxy material with a 0.6 micrometer N− active layer with $3 \times 10^{16}$ per cubic centimeter doping. A buried 0.8 micrometer N+ layer with $3 \times 10^{18}$ per cubic centimeter doping provides both the diode cathode connection and, on the nonlinear line, a resistive connection between the two coplanar waveguide ground planes, suppressing propagation of the slot line mode. Ohmic contacts having 0.02 ohms-millimeter resistivity are formed by a 0.75 micrometer recess edge, self-aligned gold/germanium/nickel/gold lift-off, and a 450° C. alloy. Proton implantation using both 110 keV implant at a dose of $7 \times 10^{14}$ per square centimeter and a 190 keV implant at a dose of $1 \times 10^{15}$ per square centimeter. This proton implant damages the substrates sufficiently to provide greater than 40 megaohm per square isolation. During implantation, a 1.6 micrometer gold mask on top of a 1.4 micrometer polyimide layer protects the ohmic contacts on the diode active region. The interconnections are formed with 0.1 micrometer titanium/0.75 micrometer platinum/1.4 micrometer gold lift-off. Schottky diodes are formed in regions where the center conductor overlaps unimplanted N− material.

In addition to millimeter wave Schottky diodes, fabrication of this high speed circuit requires high capacitance per unit area capacitors and low capacitance air bridge crossovers. High capacitance per unit area is needed for capacitor C1 and C2 to allow reasonably high coupling capacitance diodes while maintaining a high capacitor self-resonance frequency. The capacitor resonates when it is one quarter wave length long. To set the self-resonant frequency to ten times the highest frequency of interest ($10 \times 100$ GHz), for a 20 micrometer wide, 500 femtofarad capacitor with a silicon nitride dielectric, the dielectric thickness is must be 700 angstroms. A value of 1,000 angstroms was chosen for the dielectric thickness since nitride thinner than this can have an unacceptably high density of pin holes. 1,000 angstroms of nitride puts the resonant frequency at approximately 700 GHz for this structure.

Silicon nitride was chosen as the capacitor dielectric not only because of its high relative permittivity of 7.3 necessitated by the resonant frequency requirement discussed above, but also because of its excellent properties as a diffusion barrier and scratch protector. These are the same reasons that silicon nitride is the most widely used dielectric by microwave monolithic integrated circuit foundries. Choosing this dielectric in conformance with the existing industry standards also makes the sampling head circuit more practicable from the standpoint of manufacturability.

The capacitors are fabricated by depositing 1000 angstroms of 250° C. PECVD silicon nitride over the entire wafer and reactive ion etching holes, in a $C_2 F_6$ plasma, where contact is to be made to underlying metal. The bottom plate of the capacitor is the Schottky metal while the top plate is 2 micrometers of plated gold. An air bridge, which is plated at the same time as the capacitor, is used to make connection to the top plate.

The last element required for millimeter wave circuits of reasonable complexity is the air bridge. The air bridge, which is a cross-over with no supporting dielectric, can be made to clear the metal that is crossing over by 1.5 micrometers. This large gap, in addition to the unity dielectric constant of air, gives the air bridge cross-over extremely low capacitive coupling to the metallization below.

The air bridges are fabricated by the process summarized earlier herein and detailed in Appendix B.

Important features of the sampler design layout are: (1) monolithic integration with processing on one side of the wafer only; (2) fifty ohm input match at the RF port; (3) no degradation in RF signal as it propagates through the sampling structure; (4) sufficient bandwidth in the local oscillator connection for the ultra short sampling pulse; (5) a reasonable match on the local oscillator port; (6) a balanced drive on the local oscillator port; and (7) an unbalanced drive on the RF port. The first requirement is the most demanding since it prohibits all previous sampling head designs. The structure detailed in FIGS. 20 through 22 to fulfill this requirement essentially consist of two intersecting coplanar transmission lines, one of which carries the local oscillator sawtooth waveform and the other which carries the RF signal to be sampled.

The slot line differentiator also provides a naturally balanced local oscillator drive. That is, the current in the center conductor of the local oscillator coplanar waveguide is equal and opposite to the current in the outer conductor. When this current is applied to the slot line mode of the RF signal coplanar waveguide, no current is induced on the center conductor of the RF signal line. Since no current is induced on the center conductor of the RF signal line, the potential of this conductor is determined by the RF circuit and not by the local oscillator.

When the intermediate pulses from the nonlinear transmission line are applied to the RF slot line, the initial impedance is that of the RF slot line in parallel with the sampling diodes, all in series with the 50 ohm local oscillator coplanar waveguide terminating resistance 110. To get the majority of the RF voltage to develop across the diodes instead of the terminating resistor 110, the RF slot line impedance must be as large as possible. To achieve the high impedance slot line segments, the RF ground planes must be separated by a significant fraction of the substrate thickness. To maintain the RF coplanar waveguide impedance at 50 ohms, the RF center conductor must also be made larger to keep the same center conductor to slot width ratio. This is another reason for the hour glass configuration of the center conductors 80 and the ground planes 82 and 84 shown in FIG. 20. Scale modeling showed that a slot width on the RF slot line which is ⅛ of the substrate thickness yields a slot line impedance of 78 ohms. Microwave simulations on SPICE indicate that this would be large enough to permit sufficient voltage to develop across the diodes. The requirement of the high impedance slot line mode in addition to the necessity of keeping the diode sampling loop short, results in the hour glass shape of the RF coplanar waveguide and keeps the RF coplanar waveguide at a characteristic impedance of 50 ohms.

A fundamental difficulty in making a sampling head with a bandwidth of 100 GHz or greater is to lay out the circuit in such a way that parasitic elements are eliminated or incorporated into the design. Any element that cannot be treated as a distributed structure must be kept much less than a wave length long at 100 GHz. In gallium arsenide, this means all lumped elements must be less than 100 micrometers in their longest dimension. This requirement is easily met by the 2×5 micrometer sampling diode junction areas. However, it is desirable that the entire local oscillator circuit loop meet the 100 micrometer design rule to minimize inductance in this critical path. To accomplish this, minimum design rules were used to pack the elements as close together as possible. The thick Schottky metal lift-off process described earlier allows two micrometer lines and three micrometer spaces. When packed together, the local oscillator loop including the local oscillator terminating resistor 110, the two sample capacitors and the two sampling diodes measured 104 micrometers in perimeter.

NONLINEAR TRANSMISSION LINE DETAILED DESCRIPTION

Figure 24:
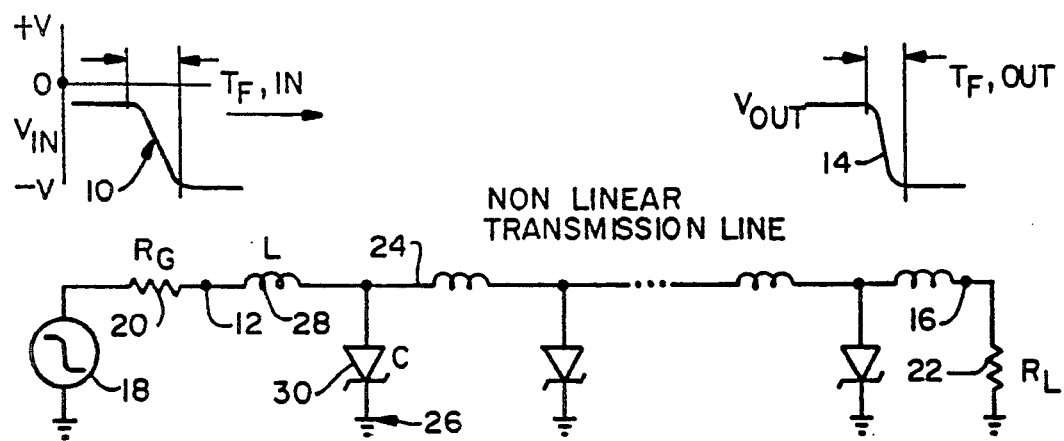
FIG. 24 is schematic diagram of a nonlinear transmission line.

Referring to FIG. 24 there is shown a schematic diagram of a nonlinear transmission line. This transmission line will change the shape of an input signal shown generally at 10 and applied to an input terminal 12 to the output signal shown at 14 appearing at an output terminal 16. In the process of propagating from the input terminal 12 to the output terminal 16, the fall time of the signal 10 is reduced from the time $T_{f,in}$ to the fall time of the output signal equal to $T_{f,out}$. The input signal 10 is supplied by a signal generator 18 through a source resistance 20. The output signal 14 is applied to a load resistance 22.

The nonlinear transmission line between input terminal 12 and output terminal 16 is comprised of a plurality of segments. Each segment is comprised of an inductor L and a capacitor C. In the preferred embodiment, the inductance is implemented through short sections of transmission line marked XX in FIG. 27. These short sections of transmission line have a characteristic impedance $Z_1$ and have a length in units of time which is designated in the equations of Appendix C as the Greek letter tau. Each capacitor takes the form of a varactor diode junction in the preferred embodiment. The capacitor in each section couples the center conductor 24 of the transmission line to a ground plane shown generally at 26. Thus, the first section of the nonlinear transmission line of FIG. 24 is comprised of the inductor 28 and the varactor diode 30 having its anode coupled to the conductor 24 and having its cathode coupled to the ground plane 26. The conductor 24 serves as the center conductor. The varactor diode 30 has a PN junction therein which has a transition capacitance. The transition capacitance results when the junction is reverse biased and a depletion region is formed as will be explained in more detail below. The transition capacitance is actually the change in uncovered charges of the depletion region as the voltage changes, but for discussion purposes the reader can visualize the capacitor as having two movable, conductive plates. These two conductive "plates" are separated by the depletion region when the diode junction is reversed biased For completeness here, the transition capacitance and depletion region will be explained briefly so that the nonlinearity of the transmission line can be understood by the reader. To do this requires reference to a cross section of the diode region.

Figure 25:
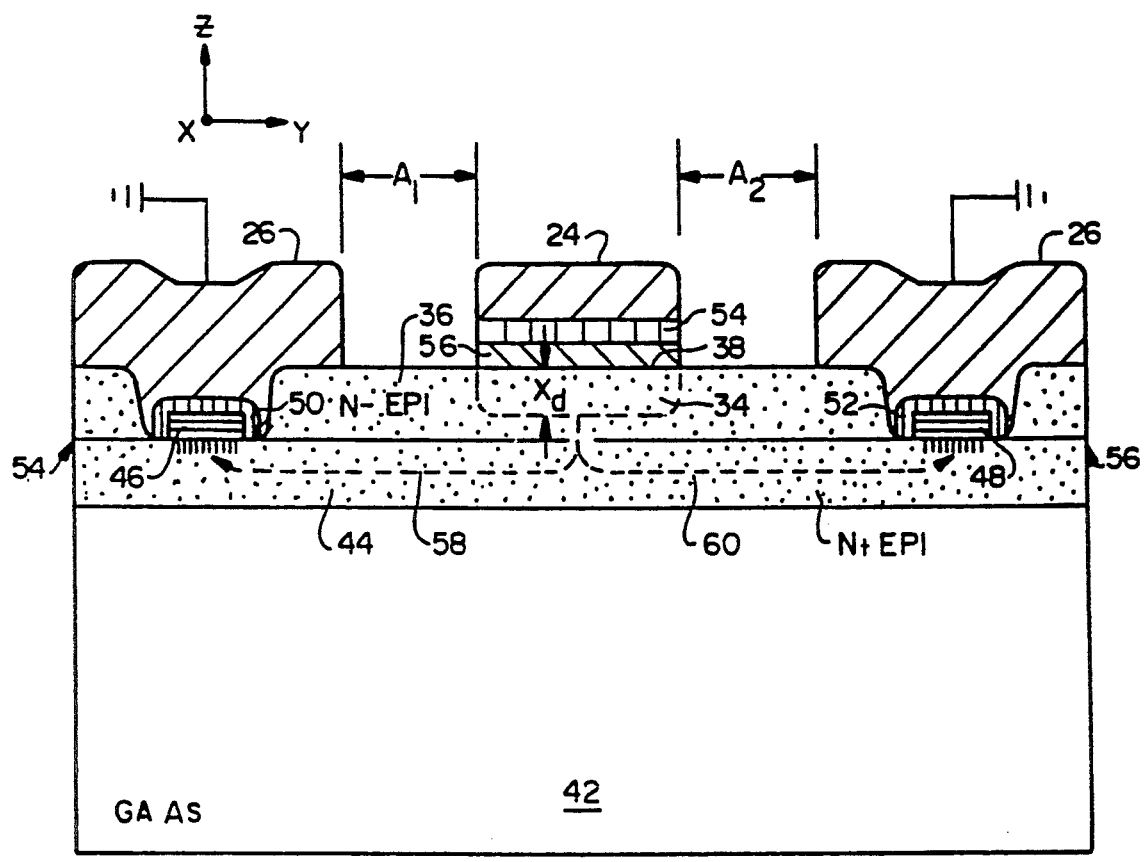
FIG. 25 is a cross-sectional view taken through a diode isolation island of the structure of a nonlinear transmission line according to the teachings of the invention.

Referring to FIG. 25 there is shown a cross section of the transmission line at a location which shows the construction of one of the varactor diodes. FIG. 25 will be explained in much greater detail below during the discussion of the features of the transmission line. For now, the reader's attention is directed to a Schottky contact (diode junction) 38, a depletion region 34 and a N− doped epitaxial layer 36 and an N+ doped epitaxial layer 44. These three components along with ohmic contacts 46 and 48 form a Schottky diode. The dotted line defining the bounds of the depletion region 34 represents the extent of the depletion region into the N− epitaxial layer 36 at a particular voltage level of reverse-bias on the Schottky diode junction. This depletion region 34 represents a volume of uncovered, immobile charges bonded in the N− epitaxial gallium arsenide crystal lattice caused by the reverse-bias voltage. That is, the reverse-bias voltage causes mobile 20 majority carriers donated by the dopants in the N− epitaxial layer 36 to move away from the junction 38. In N− material, these majority carriers are free electrons that are loosely bound to the nuclei of the N-type impurity atoms which have been added to the crystal lattice. When these mobile carriers move away from their nuclei under the influence of the negative potential applied to the anode of the diode, they leave uncovered the nuclei of the dopant atoms. These dopant atoms have one more proton than electron because of the movement of the electrons away from the junction, and thus represent immobile positive charges making up the depletion region 34. The dimension $x_d$ represents the depletion region width. This dimension increases with increased reverse-bias voltage. Schottky contact 38 is the anode of the diode, and the N− epitaxial layer 36 is the cathode of the diode. When a negative voltage is applied to the anode relative to the cathode, the diode is reverse-biased and the depletion region 34 is formed. If the level of reverse-bias voltage is increased, the dimension $x_d$ increases as more electrons are pushed away from the junction and more positive charges are uncovered. This process of uncovering charges represents the process of changing charge storage as voltage changes, which is the essence of a capacitor. This increase in uncovered charge with increases in applied voltage may be considered to be a capacitive effect. This capacitance is the transition capacitance which will hereafter be denoted $C_j(v)$. The magnitude of the transition capacitance is equal to the change in charge within the depletion region divided by the change in voltage which caused that change in charge. This capacitance is variously referred to in the literature as the transition region, space charge region, barrier region or depletion region capacitance. Because the depth of the depletion region 34 increases as V becomes more negative, the transition capacitance decreases with more negative voltages V.

The amount of change in the dimension $x_d$ with the change in reverse-bias voltage depends upon the doping of the N⁻ epitaxial layer 36. Lighter doping leads to greater changes in the width of the depletion region for a given change in the reverse-bias voltage.

Referring again to FIG. 24, what this change in the transition capacitance means in terms of the operation of the nonlinear transmission line is as follows. As the input signal 10 propagates along the transmission line, the instantaneous voltage at the anode of each diode changes over time. The input signal is applied with such a polarity relative to ground, that all diodes are reverse-biased. As the reverse-bias voltage on each anode changes, so does the transition capacitance magnitude. There is a total capacitance per section of line which is the combination of a fixed capacitance from the interconnecting line sections XX in FIG. 27 which is not voltage dependent and the transition capacitance which is voltage dependent. Thus, the total capacitance per section of line is voltage dependent.

Many characteristics of the transmission line depend upon the transmission line capacitance per section. Where the capacitance per section is voltage dependent, so are these parameters. For example, the characteristic impedance of the line, the group delay and the group velocity of the line are all voltage dependent.

Precisely speaking, the mathematical relationship between the characteristic impedance and the voltage-dependent total capacitance per section of the line (denoted $C_T(v)$) is given in Equation 1 of Appendix C. The relationship between the group delay and the voltage dependent total capacitance per section of line is given in Equation 5 of Appendix C. The other equations of Appendix C define various other relationships of interest in considering the characteristics of a nonlinear transmission line. Equation 4 of Appendix C defines the precise mathematical relationship between the capacitance of a step junction diode and the voltage applied to that junction to reverse bias it. Equations 6 and 7 of Appendix C give the relationships between the periodic structure cutoff frequency $w_{per}$ and the diode cutoff frequency $w_{rc}$ and the voltage dependent capacitance per section, the line inductance per section and the series resistance of the diodes. Generally, the higher these cutoff frequencies are, the shorter the falltime which can be achieved at the output of the line.

Figure 26A:
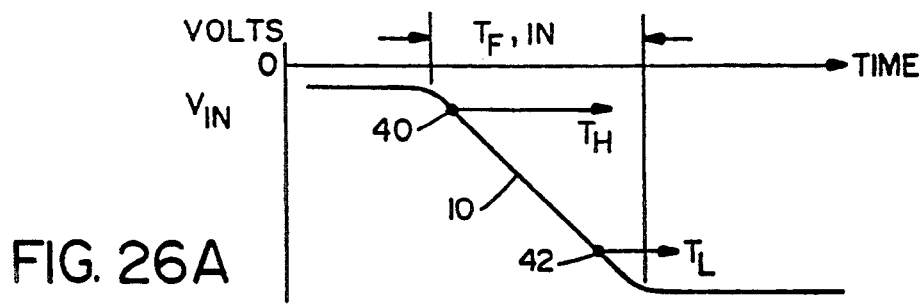
FIG. 26 is a diagram of the input signal and the output signal from the nonlinear transmission line of the invention showing the results of the compression.
Figure 26B:
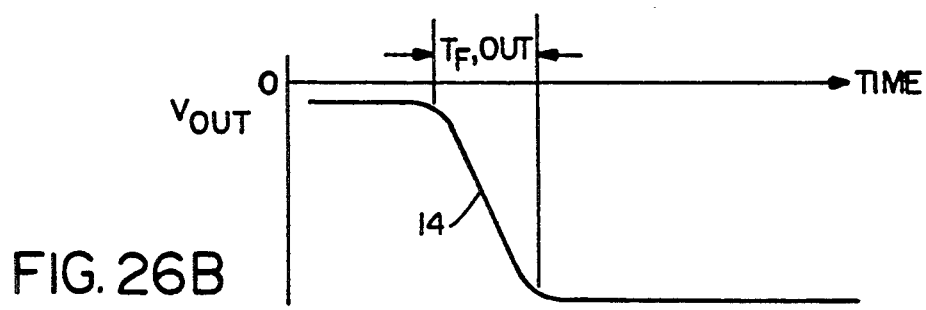

It is the voltage dependence of the group velocity which results in compression of the fall time of electrical wave fronts as they propagate along such a nonlinear transmission line. This compression can be understood by reference to FIG. 26. FIG. 26 shows the input signal 40 labeled $V_{IN}$ in part A and the output voltage labeled $V_{OUT}$ in part B. The fall time of the input signal is labeled $T_{f,in}$. The fall time of the output signal is labeled $T_{f,out}$. Note that the fall time of the output signal is substantially shorter than the fall time of the input signal because of the compression which occurred during propagation down the line. The reason for this compression is that the points on the input voltage waveform having more negative voltages travel at higher speeds and experience less delay in a nonlinear transmission line than points on the voltage waveform having more positive voltages. This is because of the voltage dependence of the line capacitance and the relationship between the line capacitance and the group delay. This phenomenon is symbolized in FIG. 26A by the delay vector labeled $T_H$ for the point 40 on the input voltage wave form being longer than the delay vector labeled $T_L$ for the point 42 which is lower on the voltage waveform. Every point on the voltage waveform has a different speed of propagation, and hence a different delay through the line. Because the higher voltage points are traveling faster and have less delay than the lower voltage points, the "tops catch up with the bottoms" and the waveform changes shape and assumes the shape of the output waveform known at FIG. 26B. The result is that the fall time is compressed as seen by the substantially shorter duration of $T_{f,out}$ in FIG. 26B, compared to $T_{f,in}$ in FIG. 26A. The reasons why higher voltage points have faster speeds of propagation are described in Appendix C and are well understood by those skilled in the art and no further details will be given here.

Figure 27:
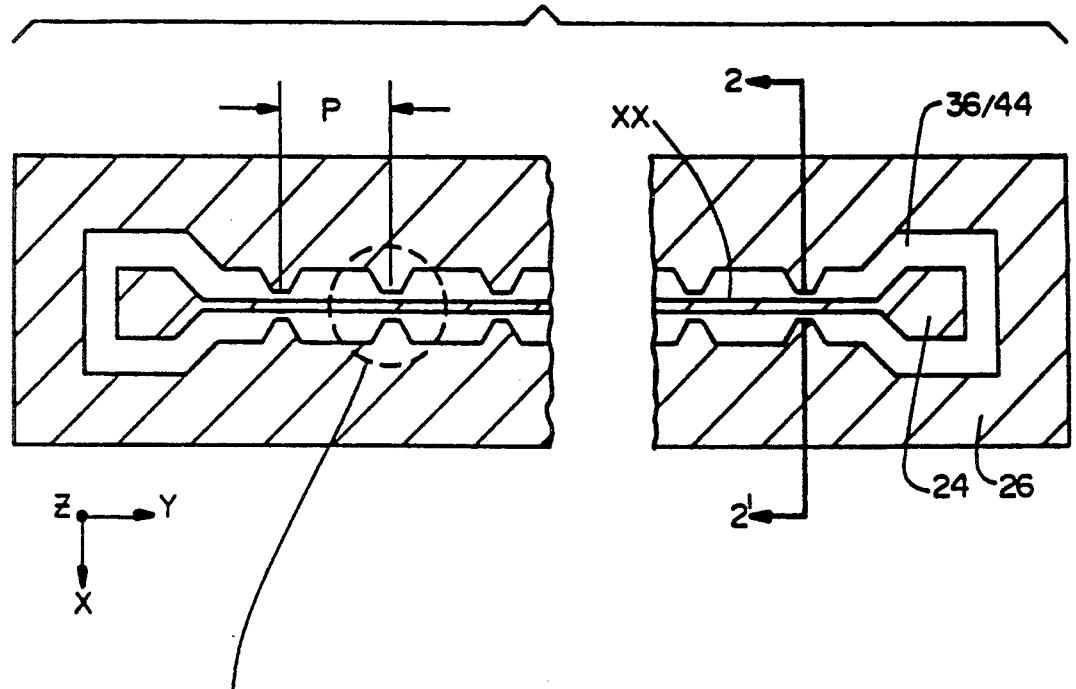
FIG. 27 is a plan view of the structure of the nonlinear transmission line.

Referring to FIG. 27 there is shown a plan view of the nonlinear transmission line. The structural details of the transmission line can best be understood by joint reference to FIGS. 25, 27, 28, and 29. FIG. 25 shows a cross-section of one of the diodes in the transmission line taken at section line 10—10' in FIG. 27 according to one process of fabricating the line. The transmission line is fabricated on a monolithic gallium arsenide substrate 42. This substrate has formed thereon an N+ epitaxial layer 44 and an N⁻ epitaxial layer 36 formed on top of the epitaxial layer 44. In FIG. 27, only a portion of these epitaxial layers is visible between the ground plane metal contacts 26 and the center metal contact 24. This epitaxial layer portion is labeled 36/44. The two parallel metal conductors 24 and 26 form the inductive portions of the transmission line The center conductor 24 also forms the anode contact of the Schottky diodes. The ground plane contact 26 is also the cathode contact of the Schottky diodes. These cathode contacts are implemented with ohmic contacts to the N+ epitaxial layer 44 as best shown in FIG. 25.

The ohmic contacts 46 and 48 are formed by alloying a gold germanium mixture at high temperatures as is well known in the art. Any ohmic contact alloy will work to form the contacts 46 and 48, but it is preferred to use an alloy and a technique which will create the lowest possible contact resistance for reasons which will be explained more fully below. In the preferred embodiment, the ohmic contacts 46 and 48 are formed by heating a mixture of 8% gold and 12% germanium so as to cause the germanium to diffuse into the N+ epitaxial layer 44 to form a low resistance contact. The ground plane metal contact 26 and the center anode contact 24 are each comprised of gold. Two diffusion barrier layers 50 and 52 in the ohmic contact structure prevent the gold from the ground plane conductor 26 from diffusing into the ohmic contact regions 46 and 48 or the N+ epitaxial layer below it. This prevents spiking of gold through the N+ epitaxial layer 44 to the substrate 42. Preferably, the metal/dopant alloy chosen for the ohmic contacts will have as low a melting point as possible. Other nonalloyed contact structures may also be used if spiking of the gold through to the substrate 42 can be prevented. It is important, however, for the contact structure chosen to have a low series resistance so as to maintain the diode cutoff frequency as high as possible.

The diode-anode contacts are formed by the gold layer 24 on top of a platinum diffusion barrier 54. The platinum diffusion barrier separates the gold layer 24 from the Schottky contact metal 56 and prevents the gold layer 24 from spiking through the Schottky junction to the buried layer 44 and shorting the diode. The Schottky contact metal layer 56 is titanium in the preferred embodiment. However, many other metals may be used for the Schottky contact metal layer 56. Basically, any metal that will form a Schottky diode may be used. Such metals include aluminum, molybdenum, chromium and alloys such as molybdenum/aluminum and titanium/tungsten. The desired qualities for the metal layer 56 are that it exhibit good adhesion to the gallium arsenide substrate and that the diffusion of the metal into the gallium arsenide be low during high temperatures of operation or during subsequent processing steps. It is also desirable that the material chosen for metal 56 be stable in the sense that it should not change the leakage current through the diode with aging, changing temperature and so on. For further information, see page 271 of the text on gallium arsenide processing incorporated by reference herein.

The liftoff process for forming the diode anode contact 56/54/24 is well known in the art of semiconductor processing and is described in more detail at page 145 in "Gallium Arsenide Processing Techniques" incorporated by reference herein. For completeness here, a short summary of the process will be given. In the area where metal is to be placed on the substrate, a layer of photoresist which has been spun onto the wafer is exposed to light through a mask. All other areas are shaded by the mask. The layer of photoresist is then hardened at the surface by a chlorobenzene soak before being developed. This renders the surface farthest away from the gallium arsenide harder than the regions closer to the substrate. The layer of photoresist is then developed. Because the developer carries away material closer to the substrate faster than the harder material farther away from the substrate, the area of photoresist exposed to the light is carried away and forms a hole with inwardly tapered edges. Then the desired metal is evaporated onto the surface of the substrate in the hole in the photoresist and onto the surface of the photoresist itself. Thereafter, the photoresist is dissolved thereby carrying away the metal on top of the photoresist and leaving the metal in the hole in the photoresist layer attached to the substrate there. This process is used to form the diode anode contact, the final interconnect metallization, and the ohmic contacts. It is also used to form the implant mask except that a layer of polyimide is placed under the layer of photoresist such that the metal in the hole in the photoresist is formed on top of a layer of polyimide. After the metal liftoff, the metal in the hole lies on top of a layer of polyimide covering the whole wafer. The wafer is then immersed in commercially available polyimide solvent to dissolve all the polyimide except that portion of the layer under the metal. The resulting metal/polyimide sandwich acts as an implant mask during the proton isolation implant.

Other gate technologies could also be used to form the Schottky diode anode contact. Some of these other gate technologies may have reduced reliability over time when subjected to high temperatures.

The doping of the N− epitaxial layer 36 is $3 \times 10^{16}$ $N_D$ atoms/cm$^3$. The doping of the N+ epitaxial layer in the preferred embodiment is $3 \times 10^{18}$ $N_D$ atoms/cm$^3$.

Figure 28:
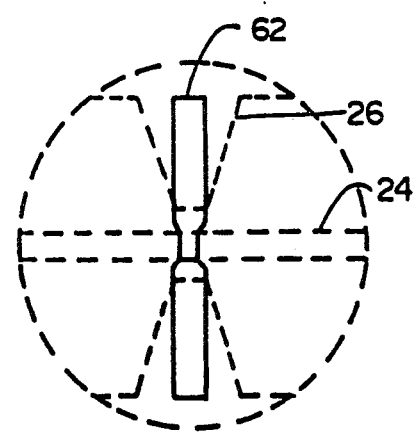
FIG. 28 is a plan view of the outline of the isolation implant mask.

The Schottky diodes are formed by isolating the epitaxial layers so that there are periodically spaced, isolated islands of epitaxial layers 36 and 44 which have mobile charge carriers therein. An implant is used at all other areas to cause crystal damage in the epitaxial layers 36 and 44 to immobilize the charge carriers, thereby converting the epitaxial layers in these implanted regions back to what is essentially intrinsic, high resistivity gallium arsenide. This crystal damage region is shown as the speckled pattern in the epitaxial layers 36 and 44 at 54 and 56 in FIG. 25. In FIG. 28 viewing above the plane of the nonlinear transmission line, the crystal damage region includes the entire area of the devices except for the masked regions 62 in which the diodes are formed. Outside the masked (unimplanted) regions 62, the implantation converts the N− and N+ layers into semi-insulating material, thus restricting the Schottky contact area 38 to within the unimplanted region 62. These isolation regions restrict the current path to the dotted lines shown passing through the N− epitaxial layer 36 and the N+ epitaxial layer 44 from the depletion region to the ohmic contacts. These current paths are designated 58 and 60 in FIG. 25.

A plan view of the boundary of the isolation island for each Schottky diode is illustrated in FIG. 28. In Figure 28, the dashed lines represent the outline of the metal contacts 24 and 26, while the solid line 62 represents the boundary of the isolation implant. All area within the solid line 62 is not implanted. Thus, the charge carriers in the epitaxial layers 36 and 44 within this perimeter will be free to move.

Figure 29:
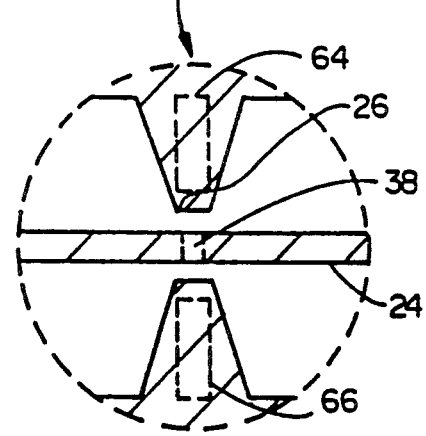
FIG. 29 is a plan view of the diode, including diode contact region and ohmic contact regions.

Referring to FIG. 29 there is shown a plan view of the area of a typical diode. The dashed lines 64 and 66 define the perimeters of the ohmic contacts 46 and 48. The region 38 defined by the intersection of the areas of the central metal contact 24 and the isolation island 62 defines the junction area of the Schottky diode.

The dimension P in FIG. 27 defines the pitch or periodicity of the diodes. In the preferred embodiment, the pitch is 160 microns. Ten micron design rules are used in the preferred embodiment, which means that the junction area 38 in FIG. 29 of the diode is 10 microns $\times 10$ microns. This also means that the space between the center conductor 24 and the ground plane conductors 26 is also 10 microns. Smaller junction areas and closer spacing will improve the performance of the device for reasons which will be explained in more detail below.

The minimum compressed fall time $T_{f,min}$ is set predominantly by the periodic line cutoff frequency and the varactor diode RC cutoff frequency $w_{rc}$. The expressions for these two cutoff frequencies are given by Equations 6 and 7 of Appendix D. With monolithic fabrication of the transmission line on gallium arsenide substrates, these two cutoff frequencies can be on the order of 0.1 – 1 terrahertz. This permits obtaining compressed fall times on the order of 5-10 picoseconds with 10 micron design rules. In the preferred embodiment, the integrated nonlinear transmission line incorporates 42 diodes. Each of these diodes has a junction potential phi of approximately 0.8 volts and $C_{jo}$ of approximately 50 femtofarads at 160 micron spacing (tau = 1.4 picoseconds) along a 90 ohm coplanar waveguide transmission line. This results in a 140 gigahertz periodic line cutoff frequency. By calculation, the characteristic impedance $Z_o(v)$ varies from 44–55 ohms, and the group delay $T(v)$ changes by 25 picoseconds as the line voltage varies from 0 to −2 volts.

In FIG. 25, the N− epitaxial layer 36 is 0.6 microns thick in the Z direction. The N+ epitaxial layer 44 is 0.8 microns thick in the Z direction in the preferred embodiment.

The current in the diodes travels from the anodes to the cathodes along the paths 58 and 60 in FIG. 25. There is a series resistance associated with the current paths 58 and 60 which is the series resistance of the diode which limits the diode cutoff frequency $w_{rc}$. This series resistance can be divided into three components. The first component is the resistance of the current path in the portion of the N− epitaxial layer 36 from the bottom of the depletion region 34 to the junction with the N+ epitaxial layer 44. This component of resistance accounts for approximately 20% of the total series resistance, and varies as the depth of the depletion region 34 varies with voltage. The second component of the resistance is the component attributed to the flow of the current through the N+ epitaxial layer 44 to the positions of the ohmic contacts 46 and 48. This component accounts for approximately 60% of the total series resistance. The remaining 20% of the total series resistance is attributed to the resistance of the ohmic contacts 46 and 48. Obviously, closer spacing of the ground plane contacts 26 to the center contacts 24 will decrease the total path length and the total series resistance. Also, improvement of the ohmic contacts series resistance will raise the diode cutoff frequency.

The N+ epitaxial layer 44 also provides a resistive connection between the two coplanar waveguide ground planes labeled as metallic contacts 26 in FIG. 25. This resistive connection suppresses propagation of an undesired unbalanced "slot-line" mode on the transmission line.

Fabrication of the device of FIG. 25 is performed in the following manner. Fabrication starts with an undoped gallium arsenide substrate which has a sufficient length to get a sufficient number of sections of the transmission line to achieve the desired degree of compression. In the preferred embodiment, 42 diodes are used at 160 micron center to center spacing. The minimum number of diodes required in the line is approximately 20% larger than the quantity equal to the falltime of the input signal ($T_{f,in}$) divided by the difference in delay between the highest voltage point and the lowest voltage point of the waveform. This delay is given by Equation 5 of Appendix D. The factor of 20% is necessary because compression to the final, shortest falltime is approached asymptotically.

The first actual process step is to grow the two epitaxial layers 36 and 44. In the preferred embodiment, these layers are grown by molecular beam epitaxy to the thicknesses cited above. Any other epitaxial method will also work to grow these layers. For example, liquid or vapor phase epitaxy will work as well as MOCVD which stands for metal organic chemical vapor deposition. Methods of performing this process and other process steps described herein are described in more detail in "Gallium Arsenide Processing Techniques" by Ralph Williams, ISBN 0-89006-152-1 (Artech House, Inc. 1984) which is hereby incorporated by reference.

The epitaxial layers are doped as they are formed to have uniform doping profiles with the doping levels given herein. It is not believed that diffusion can be used to dope the epitaxial layers since it would not be possible to dope the epitaxial layer 44 heavily without leaving a doping level in the epitaxial layer 36 which is too high.

Next, the two ohmic contacts 46 and 48 are formed having 0.06 ohms/mm resistivity. These contacts are formed using a 0.75 $\mu$m recessed etch, a self-aligned (88% gold-12% germanium)/nickel/gold liftoff technique, and a 450° C. alloy or a 12 second rapid thermal anneal. The rapid thermal anneal process is preferred since lower contact resistance can be achieved.

Figure 30:
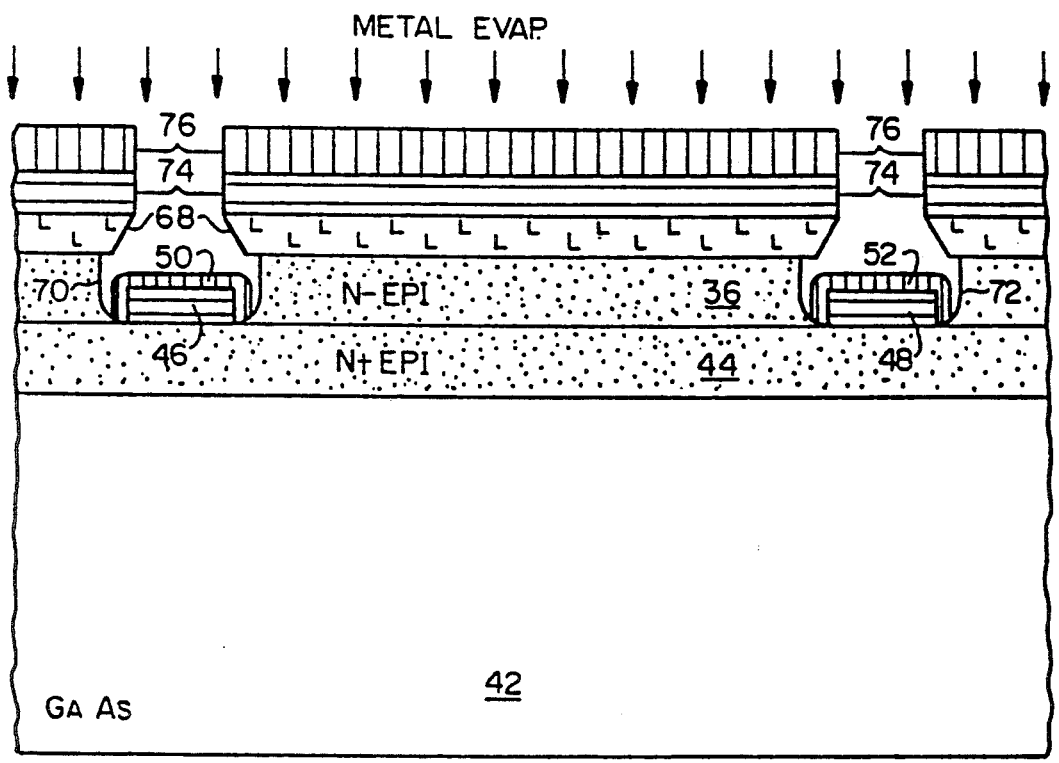
FIG. 30 is a cross-sectional view of the structure during an intermediate stage of device construction during formation of the ohmic contacts.

FIG. 30 shows the state of the wafer after formation of the two epitaxial layers 36 and 44 and after deposition of the ohmic contact metals and just prior to the liftoff. The layer of photoresist 68 represents the configuration of the first mask level. The contact holes 70 and 72 are etched using the photoresist layer 68 as the etch mask. This etch is performed using a wet chemical etch because of the 10 micron design rules. If 2 micron design rules are used, in alternative embodiments, the etch step to form the contact hole 70 and 72 may be performed using a plasma etch. After the contact holes are etched through the N− epitaxial layer 36, a conventional metal evaporation step is performed This metal evaporation step uses the photoresist layer 68 to protect all layers of the N− epitaxial layer 36 except the areas where the contact holes 70 and 72 are formed To do this, the wafer is placed in a chamber which is pumped down to a high vacuum level. Then a high energy electron beam is directed at a crucible filled with a gold-germanium mixture comprised of the desired alloy. The electron beam evaporates portions of this mixture in the center of the crucible causing gold and germanium atoms in the prescribed proportion to be deposited as the first layer of the ohmic contacts labeled 46 and 48 in FIG. 30 and as the layer 74 on top of the photoresist layer 68. After this layer has been deposited, the gold-germanium target crucible is rotated out of the path of the electron beam and a crucible containing nickel is rotated into the path of the beam. The high energy electron beam then evaporates portions of the nickel in the target crucible causing nickel atoms to be deposited on top of the previously deposited gold-germanium layer. This nickel layer is labeled 50 and 52 in the positions of the ohmic contacts and 76 on top of the layer 74.

After these two metal layers are deposited, the photoresist layer 68 is dissolved in a chemical bath thereby removing the metal layer 74 and 76. In some embodiments, a further layer of gold (not shown) is evaporated on top of the nickel layers 50 and 52 prior to removal of the photoresist layer 68. In these embodiments, the photoresist layer 68 is removed after this gold layer is deposited. The entire structure then is subjected to a 450° C. alloy process in a diffusion furnace for 30 seconds or for 12 seconds in a rapid thermal anneal device. During this high temperature step, germanium atoms in the metal layers 46 and 48 diffuse into the N+ epitaxial layer 44, thereby forming a low resistance ohmic contact. During this high temperature step, the nickel layers 50 and 52 act as diffusion barriers to prevent gold deposited on top of the nickel from diffusing into the gold germanium layers 46 and 48. This also prevents the gold from diffusing into the epitaxial layer 44 and "spiking" through to the gallium arsenide substrate 42.

Figure 31:
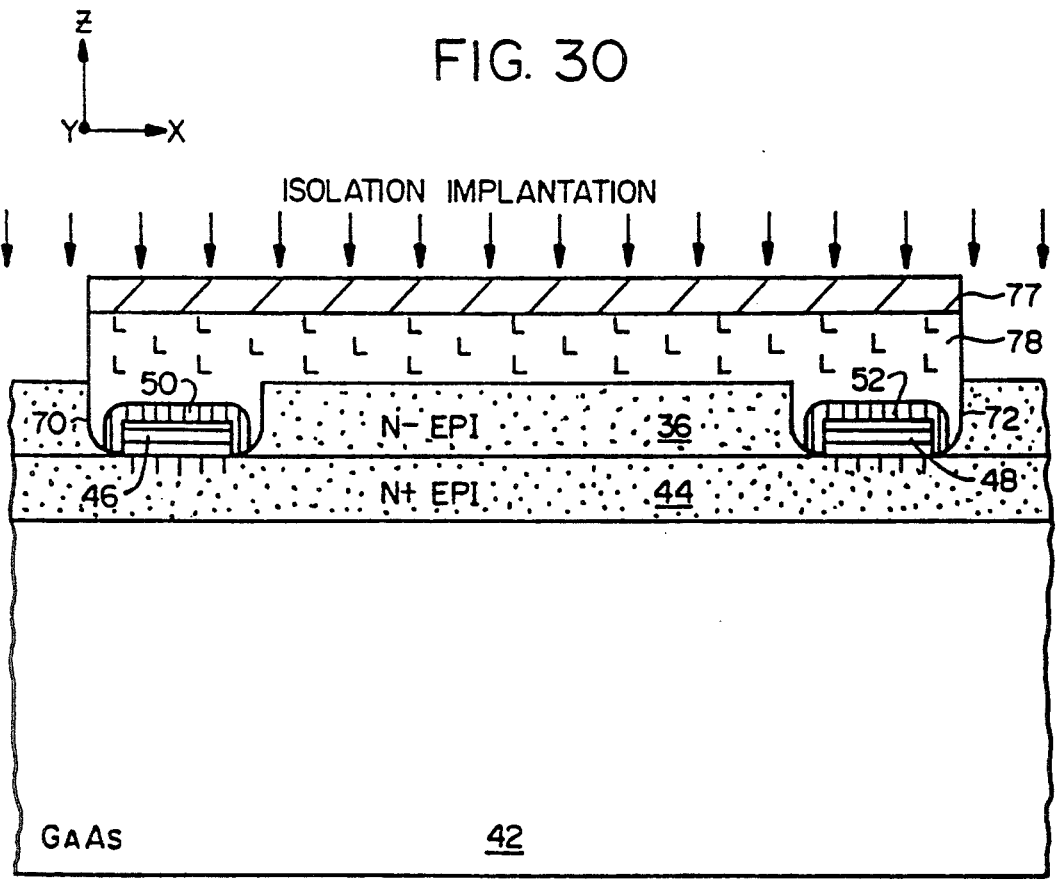
FIG. 31 is a cross-sectional view of the structure of the device during the isolation implantation.

The next step is a proton implantation for the purpose of defining the isolation islands in which the Schottky diodes will be formed. FIG. 31 shows the proton implantation step and the configuration of the gold 77/polyimide 78 implantation mask which defines the boundaries of the isolation island. The implantation mask 77/78 has a configuration from the plan view, i.e., looking down the Z axis, as shown in FIG. 28. The purpose of the isolation implantation has been previously described. Only the portions of the epitaxial layers 36 and 44 lying underneath the implantation mask 77/78 will be able to conduct current freely after the implantation step has been performed. In the preferred embodiment, the implantation is done using protons since protons are relatively easy to implant to the necessary depth into gallium-arsenide at energy levels around 190 KEV. However, some equipment having greater acceleration energies is available to implant other types of ions such as oxygen or boron to the necessary depth. Any such implantation which causes the above described crystal damage result will suffice. In the preferred embodiment, the proton implantation is done in two steps. The first step is an implant at 190 KEV with a dosage level of $6 \times 10^{14}$/sq cm. The second step is a 160 KEV implant with a dosage level of $1.5 \times 10^{14}$/sq. cm. These implants provide a greater than 40 megohm/sq. isolation characteristic. The isolation mask 77/78 is comprised of 1.6 micrometers of gold shown at 77 and 1.4 micrometers of polyimide 78 overlying the ohmic contacts and the region 62 which will become the diode-active region.

The final process step is to perform a third mask level photolithography step to define by liftoff techniques the locations of the Schottky anode contacts 24 in FIG. 25 and the configuration of the ground plane metal contacts 26. After the resulting photoresist layer is developed, metal evaporation is used to deposit 0.1 microns of titanium as shown at 56 in FIG. 25. After the titanium is deposited, the titanium crucible is rotated out of the way and a platinum crucible is rotated into the target position. The high energy electron beam then is applied to evaporate a portion of the platinum in the center of the crucible to deposit a 0.1 micron platinum diffusion barrier shown at 54 in FIG. 25. Finally, the platinum crucible is rotated out of the way and a gold target crucible is rotated into the target position. The third evaporation step is then performed to deposit a 1.4 micron thick (Z direction) gold contact 24 and to form the gold ground plane contacts 26 and transmission line conductors 24. In some embodiments, the ground plane contacts 26 and transmission line conductors 24 may be formed separately with a fourth masking level. Schottky diodes are formed in a 10 micron by 10 micron region underlying the titanium layer 56 in each isolation island by the self aligned intersection of the titanium metal deposition and the isolation island. This completes the fabrication of the device.

With a nonlinear transmission line of the structure of FIGS. 25 and 27, it is possible to configure the dimensions of the structure to obtain compressed fall times which are short enough to generate gate impulses of approximately 5 picosecond duration or better. Such a gate impulse can be obtained by differentiating the output step transition after compression in a nonlinear transmission line of the structure of FIGS. 25 and 27. The band width of diode sampling bridges used in sampling oscilloscopes and network analyzers is primarily limited by the duration of the pulse gating the diode. With gating pulses having approximately 5 picoseconds duration, the bandwidth of 2 diode sampling bridges for sampling oscilloscopes could be extended from the current 20 gigahertz level to 100 gigahertz.

One of the factors which limits the shortest falltimes which are available from a nonlinear transmission line of the structure shown in FIGS. 25 and 27 is the cutoff frequency for the Schottky varactor diodes. This cutoff frequency, is defined by Equation 7 of Appendix D. Another factor which limits the amount of compression is the cutoff frequency of the periodic structure. This cutoff frequency is defined by Equation 6 of Appendix D. With the configuration of the nonlinear transmission line of FIGS. 25 and 27 and with some scaling of the structural dimensions using more stringent design rules, it is possible to obtain step functions with the falltimes of approximately 4 picoseconds. This is a factor of 6 improvement over the rise times which can be currently attained by electrical means. With further improvements in the process and with tighter design rules, it is possible to obtain subpicosecond rise times.

What is the relationship between the physical dimensions of the structure shown in FIGS. 25 and 27 to the amount of compression which can be obtained?. As a step input signal $V_{in}(t)$ with initial voltage $v_h$, final voltage $v_l$, and fall time $T_{f,in}$, propagates along the line, the fall time will at first decrease linearly with distance. As the pulse fall time decreases, dispersion arising from the structure's cutoff frequency, $w_c$, competes with the compression arising from the voltage-dependent propagation velocity. A final limited fall time $T_{f,min}$, on the order of, but longer than $2.2/w_c$, is reached at which the edge compression per section due to line nonlinearity is equal to the edge broadening per section due to line dispersion. The output fall time is given by Equation 8 of Appendix D. $T_{f,min}$ in Equation 8 varies inversely with both the diode cutoff frequency $w_{rc}$ given by Equation 7 and the periodic cutoff frequency $w_{per}$ given by Equation 6. Exact calculation of $T_{f,min}$ requires computer simulation.

Line periodicity of the diode structure introduces a cutoff frequency $w_{per}$ which is given by the implicit relationship of Equation 9 of Appendix C which is simplified to Equation 6 of Appendix C. The term $C_{ls}$ in Equation 9 is the varactor's large signal capacitance and is defined by Equation 10 of Appendix C.

For input signals $V_{in}(t)$ such that at all points on the line the propagating wave is of sufficiently long rise time, 13 the output of the transmission line is given by Equation 11 of Appendix C. This equation shows that the compression occurs because of the voltage dependence of the propagation velocity signal along the line as shown by the relationship between equations 11 and 5.

The performance of the line can be improved by increasing the periodic cutoff frequency $w_{per}$. This can be done by decreasing the diode spacing (in units of tau). However, decreasing tau (decreasing pitch) will also decrease the small signal characteristic impedance given by Equation 1 of Appendix C and will also decrease the large signal characteristic impedance given by Equation 12 of Appendix C because of the decrease in inductance per section (given by Equation 1 of Appendix C) where the characteristic impedance of the line is defined by Equation 12 of Appendix C. This is an undesirable result for the power transfer efficiency reasons noted above. Therefore, the large signal characteristic impedance $Z_{ls}$ given by Equation 12 in Appendix C will be constrained to approximately 50 ohms. Other embodiments may use different characteristic impedances for specific applications. However, the preferred embodiment will have a characteristic impedance of approximately 50 ohms. Accordingly, to satisfy this constraint while decreasing the diode spacing tau, the large signal Varactor capacitance $C_{ls}$ must also be scaled in proportion with the scaling of L, the transmission line inductance per section. In such a case, the periodic cutoff frequency $w_{per}$ is limited by lithographic constraints on the minimum junction area for the varactor.

The varactor series resistance $r_s$ introduces a varactor cutoff frequency of $w_{rc}$. If this cutoff frequency is much less than the periodic cutoff frequency $w_{per}$, this varactor cutoff frequency limits the compressed rise time to approximately $2.2\ r_s C_{ls}$. This time constant is the fundamental limitation to the compressed fall time, assuming elimination of the periodic line cutoff frequency $w_{per}$. Of course, neither cutoff frequency can be eliminated in reality so both effects must be taken into account.

The total circuit area of the structure shown in FIGS. 25 and 27 with 10 micron design rules and 160 micron diode spacing along a 90 ohm coplanar wave guide transmission line is approximately 8 mm by 0.3 mm. With a periodic line cutoff frequency of approximately 140 gigahertz, the minimum compressed fall time of 4 pico seconds can be obtained if the diode resistance is zero. With 10 ohm diode resistance, minimum compressed falltimes of 7.5 picoseconds can be obtained.

To generate subpicosecond pulses with a nonlinear transmission line, both the line periodicity cutoff frequency $w_{per}$ and the varactor cutoff frequency $w_{rc}$ must be increased. Because of the constraints on line impedance in the preferred embodiment of 50 ohms or thereabouts, diode spacing (L) must scale with diode junction area $C_{j(v)}$. To decrease the diode capacitance and increase $w_{per}$, either the device-active layer doping must be decreased below $3 \times 10^{16}$ atoms/cm$^3$ or the junction area must be decreased below the 10 micron by 10 micron area described herein. Because of degraded diode cutoff frequency and because of rapid increases in the depletion layer width, $x_d$ in FIG. 25, with decreases in the doping of the N$^-$ epitaxial layer 36 requiring much thicker N$^-$ layers to avoid possible punch through, capacitance reduction through reduction in the junction area is the more desirable of the two approaches.

Increased varactor cutoff frequency $w_{rc}$ can be achieved by decreasing diode series resistance $r_s$. This can be achieved by reducing the spacing of the ohmic and Schottky contacts. In FIG. 25, decreased contact spacing would translate to smaller dimensions $A_1$ and $A_2$. This would decrease the length of the current paths 58 and 60 thereby reducing the series resistance. Further improvements in the series resistance can be made by selecting the ohmic contact material in process so as to minimize the series resistance presented by the ohmic contacts 46 and 48, by heavier doping of the N+ epitaxial layer 44, and by optimization of the thickness of the N$^-$ epitaxial layer 36 to the maximum possible depletion layer width $x_d$. That is, the thickness of the epitaxial layer 36 should be made as close as possible to the maximum penetration of the depletion layer 34 into the N$^-$ epitaxial layer 36. This minimizes the current path segment from the edge of the depletion layer 34 to the junction between the epitaxial layer 36 and the epitaxial layer 44.

Figure 32:
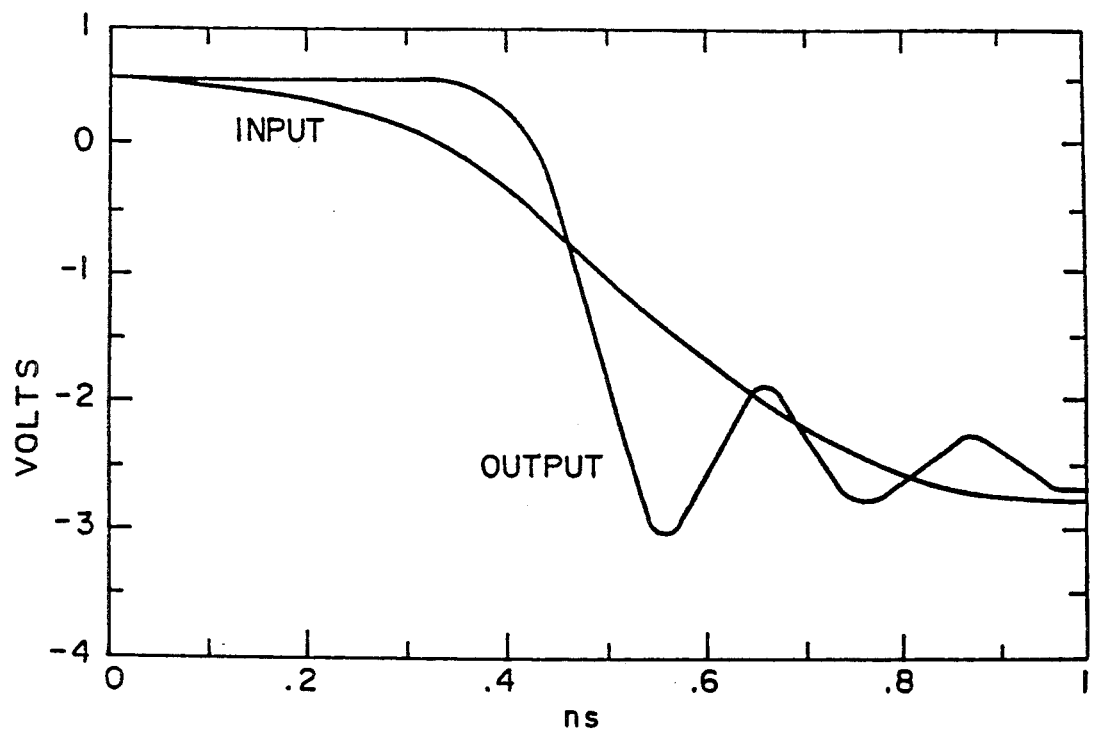
FIG. 32 is a diagram of the relative wave shapes of the input and output signals from the transmission line as implemented in a scale model of the preferred embodiment.

FIG. 32 is a graph of the compression of a 500 picosecond input fall time to a 100 picosecond output fall time on a scale model which was constructed with very large geometries.

Figure 33:
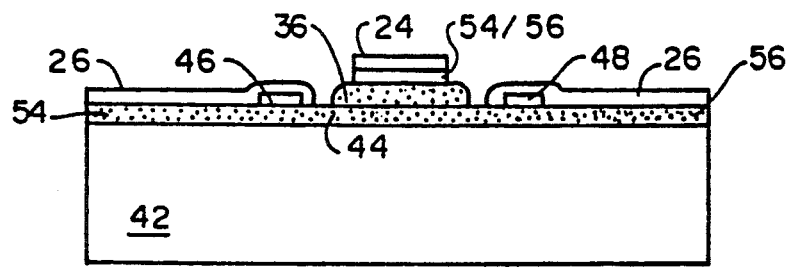
FIG. 33 is a cross-sectional view of another embodiment of the nonlinear transmission line through the diode area.
Figure 34:
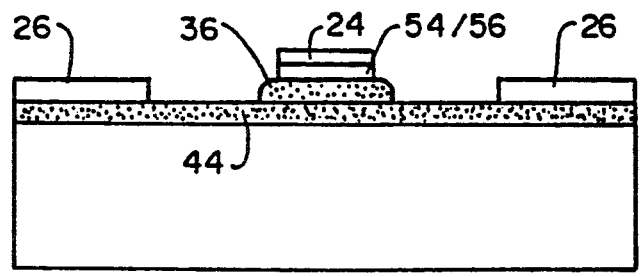
FIG. 34 is a cross-sectional view of another embodiment of the invention through a region outside the diode isolation island.

FIGS. 33 and 34 show an alternative embodiment. FIG. 33 is a cross-section through one of the diodes of a nonlinear transmission line where the N$^-$ epitaxial layer has been etched away at all locations except the area under the Schottky diode anode contact.

FIG. 34 shows a cross-section through the transmission line at a location other than the location of a diode active area.

Figure 35:
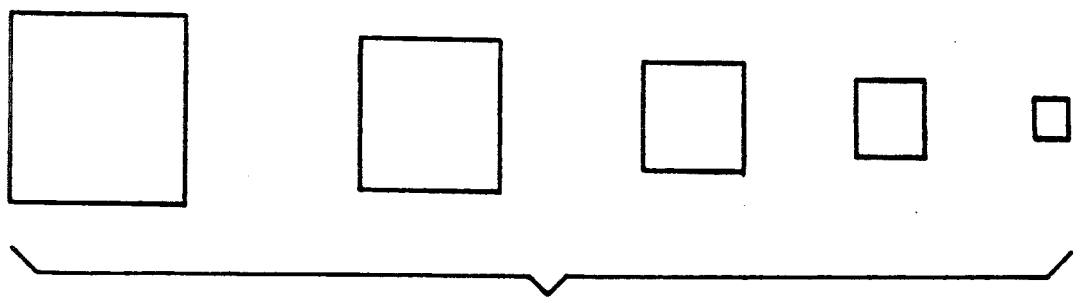
FIG. 35 is a symbolic plan view of an embodiment of the nonlinear transmission line wherein the diode junction areas are successively smaller and the spacing between diodes becomes progressively smaller.

FIG. 35 schematically shows another alternative structure. In this structure, the diode junction areas are decreased at each diode location from the input of the line to the output. Further, the spacing between the diodes is scaled in proportion to the decrease in the junction area such that the characteristic impedance of the line remains approximately 50 ohms. The purpose of such an embodiment is to achieve improved performance. This improved performance results from the recognition that as the signal propagates down the line, its fall time is compressed and the high frequency components in the spectrum of the signal therefore increase. These high frequency components change the impedances presented by the capacitances of the diodes and the inductance of the coplanar wave guide sections unless the size of the junction and the spacing between the junctions is altered. FIG. 35 shows the junction areas and junction spacings from plan view only. All other details of the construction are as previously described. Another possible embodiment is to construct the transmission line in segments, each segment containing a plurality of diodes. In the first segment, the diodes will have a first junction area in a first spacing. In the second segment, the junctions will all be the same size but smaller than the size of junctions in the first section. Further, the spacing between the diodes in the second section will be closer in proportion to the decrease in the junction area so as to maintain the characteristic impedance of that section at approximately 50 ohms. This pattern of ever-decreasing junction area and spacing between the diodes in each section is repeated until the appropriate length for the transmission line is achieved. The first several sections are designed to maximize the change in delay with voltage, thus reducing the total number of diodes required for a given input falltime $T_{f,in}$. The later sections with smaller geometries have higher diode and periodic cutoff frequencies, and are optimized to obtain the shortest possible output falltimes.

Figure 36:
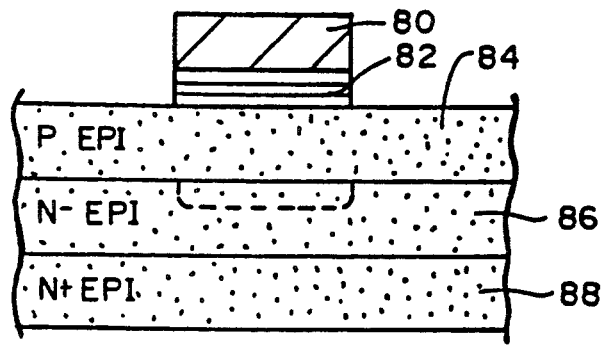
FIG. 36 is a cross-sectional view of the diode region of another embodiment of the nonlinear transmission line.

Other possible structures which can be used to achieve compression are any capacitance which is voltage dependent. Thus, for example, regular PN diode junctions could be used as opposed to Schottky diodes to create the nonlinearity and voltage-dependent propagation velocity needed to achieve the compression. A cross-section of the diode portion of the transmission in such an embodiment is shown in FIG. 36. In the diode structure of FIG. 36, layer 80 is a gold diode contact. Layer 82 is an ohmic contact. Layer 84 is P type epitaxial gallium arsenide which is doped to give a minimum amount of series resistance in current flow through the P epitaxial layer 84, to the N⁻ epitaxial layer 86. The N⁻ epitaxial layer 86 is formed and doped in accordance with the description given above for the epitaxial layer 36. Finally, the N+ epitaxial buried layer 88 is formed and doped in accordance with the description of the N+epitaxial layer 44 given above. In alternative embodiments, the P type epitaxial layer 84 could be doped P⁻.

Figure 37:
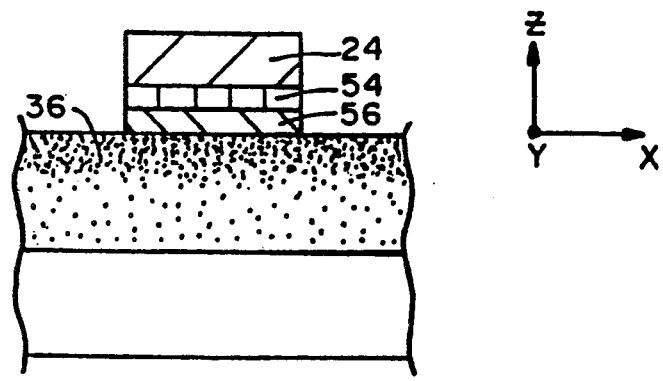
FIG. 37 is a cross-sectional view of the diode region of another embodiment of the nonlinear transmission line.

In yet another alternative embodiment, hyperabrupt Schottky contacts are used to fabricate a line which otherwise has the construction shown in either FIGS. 25 and 27 or FIGS. 33 and 34. Such a hyperabrupt junction is represented by FIG. 37 where the increased density of the dot pattern near the surface of the N⁻ epitaxial layer represents a heavier doping there. A hyperabrupt Schottky contact requires that the N⁻ epitaxial layer have a nonuniform doping. Such an N⁻ layer is lightly doped at the N⁻/N+ epitaxial layer junction. This doping increases as one moves through the N⁻ epitaxial layer in the positive Z direction. Such a doping profile can be manufactured using molecular beam epitaxy, liquid phase epitaxy or MOCVD. It is also possible to form such a nonuniform doping profile using ion implantation. In such an embodiment, the N⁻/N+ epitaxial layers would be formed with molecular beam epitaxy and doped using an ion implantation. The doping profile is adjusted to make the capacitive changes linear for linear changes in the instantaneous line voltage applied to reverse bias the junction. In the preferred embodiment, the change in capacitance for a unit change in reverse bias voltage is nonlinear in that for higher levels of voltage, the unit change in applied reverse bias voltage produces less change in the capacitance than a unit change in voltage at a lower voltage causes. By adjusting the doping profile appropriately, the changes in capacitance for a given change in voltage can be made linear throughout the range of voltages of the input signal. The main reason for using hyperabrupt junctions is to get larger changes in capacitance per unit change in voltage. That is, with a hyperabrupt junction, the capacitance of the resulting junction varies more rapidly with voltage than the capacitance of a junction with uniform doping, producing a greater change in line delay with input voltage For a given input signal falltime $T_{f,in}$, the required number of diodes and hence the required line length is decreased.

Another alternative embodiment is to reduce the size of the overall die using spiral inductor sections to replace the inductive transmission line sections marked XX in Figure 27. The spiral inductor sections are publicly known and exist on various devices manufactured by Pacific Monolithics of Sunnyvale, Calif.

Figure 38:
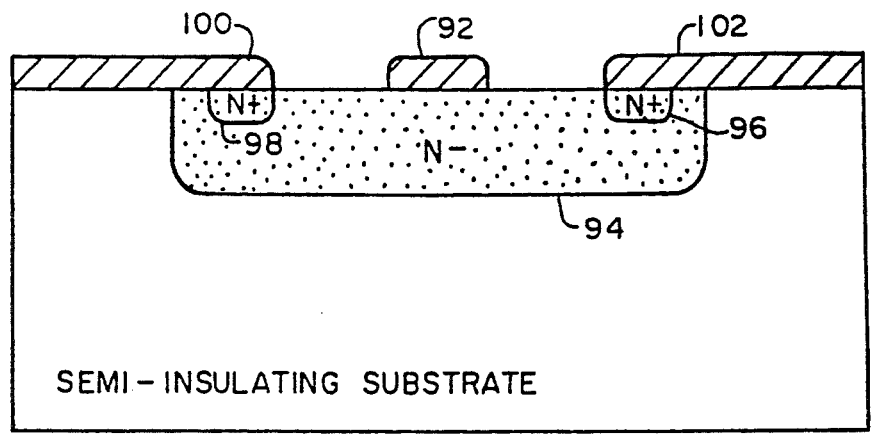
FIG. 38 is a schematic cross-sectional view of another embodiment of the nonlinear transmission line.

Another alternative embodiment is in the form of a monolithic coplanar wave guide loaded periodically with the gate capacitances of a series of MESFET's. A cross-section through the MESFET of such a device is shown in FIG. 38. In such a device, layer 92 is the gate metal and layer 94 is N⁻ epitaxial gallium arsenide lying on top of a substrate of gallium arsenide (not shown). Layers 96 and 98 are N+epitaxial layers which make contact with source and drain metal contacts 100 and 102.

Figure 39:
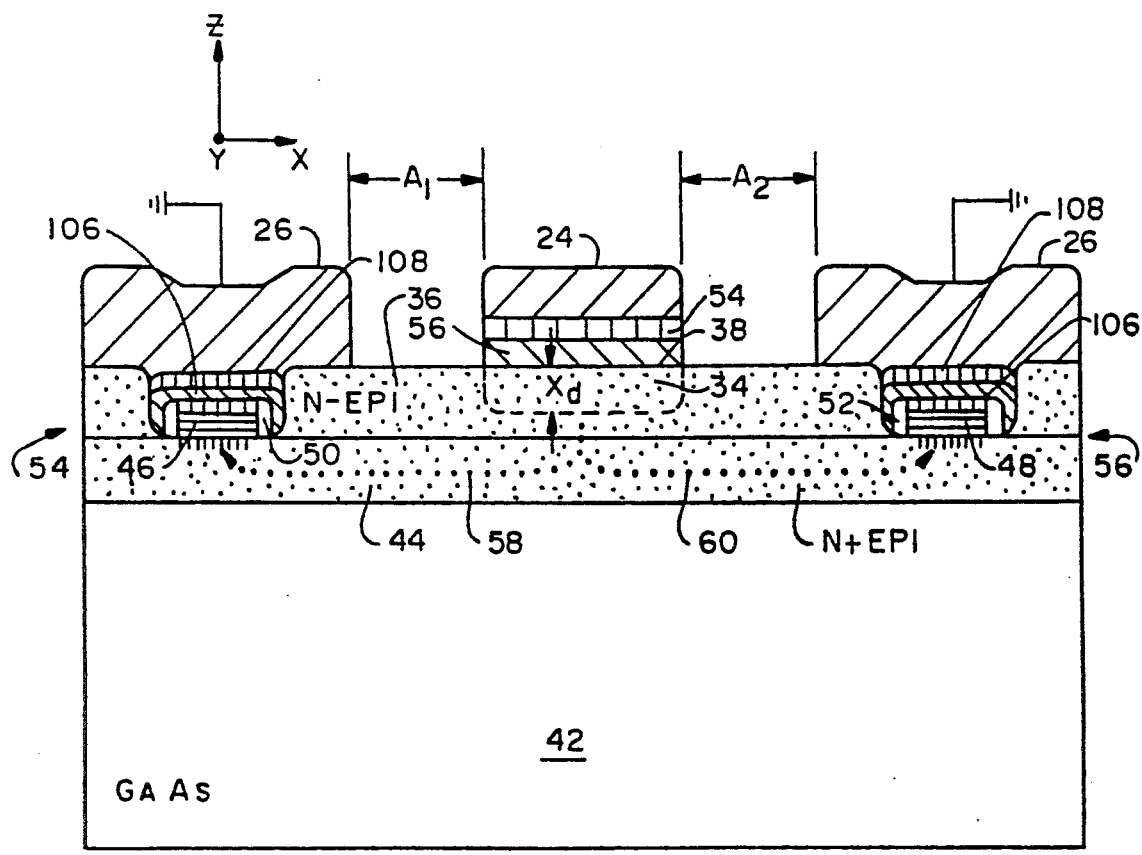
FIG. 39 a cross-sectional diagram of the preferred embodiment of the nonlinear transmission line.

A detailed process schedule for the construction of the nonlinear transmission line described herein is given in Appendix D. The process schedule of Appendix d results in a structure as shown in FIG. 39. The only difference between the structure of FIG. 39 and that shown in FIG. 25 is the existence of the additional layers of titanium 106 and platinum 108 above the ohmic contact metal. These additional layers do not affect the resistivity of the contacts substantially.

Alternative process technology can also be used to fabricate the device structures described above. Although in the preferred embodiment of the process given in Appendix D a standard NH₄OH/H₂O₂/H₂O gallium arsenide wet etch is used to give good etch depth control needed for etching through the N⁻ layer to the buried N+ layer for the ohmic contact and initial alignment marking etch, other etch processes may also be used. For example, dry etch or plasma etch processes may be used if sufficient depth control can be achieved to prevent etching through the N+ epitaxial layer Dry etches create surface states, but it is possible that these surface states can be etched away with a mild wet etch following the dry etch.

In the preferred embodiment, ohmic metallization is a typical germanium-nickel-gold eutectic mixture deposited by electron beam evaporation and alloyed in a rapid thermal annealer. The rapid thermal anneal process is faster, easier, cheaper and more reproducible than a conventional oven anneal process and is therefore preferred. Ohmic contacts of 0.06 ohms/mm resistivity have been achieved which is much lower than the typical values quoted for oven annealed contacts (typically 0.5 to 5 ohm-mm). Although this ohmic contact metallization is achieved using liftoff metallurgy (additive) it is also possible to perform this metallization as well as the other metallizations in the process using subtractive etching processes. Either wet etch or dry etch processes may be used for the subtractive etching. The liftoff technology avoids problems of semiconductor surface etching, and is therefore preferred.

The implant isolation masking is an important step. Since high energy, high dose proton implant masking is required, the preferred embodiment uses a 1.6 micron layer of gold on top of a polyimide layer. This layer is patterned using a thick metal liftoff process. However, this implant mask could also be performed by subtractive processing using either wet or dry etches to define the implant mask. The liftoff process works quite well, and the metal thickness for the gold layer can even be increased to provide better implant masking. Better implant masking permits higher implant energies, which will result in a greater depth of penetration of the implant into the N⁻ layer 36 and the N+ semiconductor layers. A thicker N+ layer can then be used, reducing the diode series resistance, as is described subsequently. Thicker metal on the implant mask for subtractive processing means longer etch times and possibly lateral etch problems if wet etches or isotropic dry etches are used for subtractive processing. Therefore, liftoff processing is preferred.

Although the final level interconnect metallization requires very thick layers of gold, subtractive etch processing may also be used for this metallization as opposed to the thick metal liftoff process currently used in the preferred embodiment of the process. The thick metal of this metallization is necessary to achieve low line series resistance. This resistance is currently 12 ohms in the preferred embodiment.

As geometries are scaled down to achieve higher performance levels, self-alignment techniques for the fabrication will become more important. Currently, the Schottky diode junction area and the ohmic contacts are formed using self-aligned process steps. In alternative embodiments, the spacing between the central metal conductor 24 and the ground plane conductors 26 may also be performed using self-aligned processes.

Finally, in the preferred embodiment, the N+ epitaxial layer 44 is formed at a thickness of 0.8 microns to keep the resistance of the current paths 58 and 60 in FIG. 25 to a minimum. Thicker layers for this epitaxial layer 44 may be used to further lower their resistance. However, for areas outside the diode isolation island, isolation implantation must be performed. Where thicker layers of epitaxial material 44 are used, higher energies for these isolation implants will be necessary. Alternatively, some etch step may be used to remove the epitaxial layers at regions outside the isolation islands. Preferably, this etch step should be self-aligned so as to not destroy the ohmic contacts 46 and 48.

It is also possible to use self-aligned gate techniques to align the Schottky junction area between the ohmic contacts when the dimensions of the structure are scaled to very small geometries. One possibility is to use refractory metal gates in a T shape. The bottom of the T then serves as the Schottky contact while the top of the T serves as an etch mask to define the positions of the inner edges of the contact windows for the ohmic contacts.

Although the invention has been described in terms of the preferred and alternative embodiments disclosed herein, those skilled in the art will envision other embodiments which may be used without departing from the teachings of the invention All such embodiments are intended to be included within the scope of the claims appended hereto.

APPENDIX A

MMIC Process October 31, 1989 RM

This process is for fabrication of the millimeter-wave transmission lines and schottky varactor diodes of a nonlinear transmission line pulse compressor; similar millimeter-wave circuits can be made with small process variations. Etch times and ion implant energies given are for the standard material for the nonlinear transmission line, ie a 0.6 μm N- layer (3X10^16) above a a 0.8 μm N + layer (6X10^18) on a [100] semi-insulating GaAs substrate.

- Process steps have subsequently been added to fabricate capacitors and air-bridges.

Self-Aligned Ohmic Contacts
MASK LEVEL 1    DARK FIELD

In this step the N- layer is first etched to expose the N+ layer. Ohmic metal is then evaporated and lifted off using the same photoresist which served as an etch mask. The alignment marks are also on this mask layer.

Photoresist
  Use AZ 5214 and follow standard photoresist procedure
  but postbake 120°C, 20 min, and USE HMDS
    HMDS is not essential on GaAs but can be useful when adhesion is critical
  After postbake, Alpha Step to find starting resist thickness
  The resist thickness was found to be 1.55-1.65 microns
  Verify resist thickness before etching!
Wet Etch
  Use NH4OH:H2O2:H2O (14 : 2.4 : 200)
    A 1:1 H2O:H2O2 adjusted to PH 7.1 with NH4OH has been shown to have less lateral etching.
  Etch in H2O bath for stable temperature.
    Etch rate estimated at 0.44um/min
  Etch first piece for 30 sec to establish etch rate
    the anticipated etch rate is 0.44um / min so a 30 sec etch will go approx half way through a 0.3um n- layer. This initial etch should be scaled with the n- layer thickness if it is other than 0.3um.
  Stop etch with 2 min DI H2O rinse, Nitrogen dry
  Alpha Step to find the estimated etch depth measure in two places
Don't forget to subtract the resist thickness
Perform additional wet etchs to get 0.75 µm etch depth
Estimate needed time conservatively to avoid overetching
Alpha Step after each etch to monitor progress Evaporate Metal
Etch wafer for 60 seconds in 6:1 BOE immediatly prior to evap.
Evaporate
108 A Ge
102 A Au
63 A Ge
236 A Au
100 A Ni
6000 A Au
For 0.3um n- layer, same as above but
with 3000A finishing layer of gold.

Standard Liftoff
make sure periphery lifts off, otherwise it burns in the RTA
3-solvent clean, DI rinse...
Alloy metal at 450°C for 25 seconds in RTA
Measure Contact resistance

Proton Implant

MASK LEVEL 2    DARKFIELD MASK    CRITICAL ALIGNMENT

Proton implantion is used to electrically isolate N+ regions and to eliminate conductive layers under transmission lines. Protons are implanted into the wafer at high energies, generating ≈3 defect per proton & making the substrate semi-insulating. A thick Au layer defined by liftoff above a polyimide removal layer forms the implant mask.

Proton implant energies and doses depend on the particular layer structure and application.

Hot Solvent Clean
Apply Ciba-Geigy polyimide
Spin adhesion promoter at 5000 rpm for 30 sec
Spin Probimide 284 at 5000 rpm for 30 sec
Bake polyimide
Bake at 100°C for 30 min
Ramp to 180°C, Hold for 15 min at 180 +/- 5°C
Ramp to 240°C, Hold for 15 min at 240+/- 5°C
Let oven cool down to 150°C before removing wafers Photoresist
Thick Metal liftoff with AZ 5214e
Spin at 2500 rpm for 30 sec to achieve approx 1.95um
Increase exposure time by about 15%
This compensates for low reflectivity of the polyimide and the additional resist thickness. At 16.5mW/cm2 with UV400 optics, the exposure time is 3.5 sec (58mJ/cm2).

Evaporate Metal
- 100A Ti
- 1.8um Au
- Leave at least 1000A between the top of the Au and the top of the photoresist for safety.

Liftoff Metal
- Soak in acetone for at least 30 min
    - One method that has worked is to give Lance or Tom (whoever is doing the depositon) a beaker and instruct him to put the wafer in a covered beaker of acetone when he is finished. You can then go in at your leasure, or even the next day to do the liftoff.
- Swirl the acetone around to lift the metal.
- If the metal refuses to lift, blast it with the acetone bottle.
- Tom's spray gun can blast off unrelenting metal pieces
    - Since acetone attacks the seals of the spray gun, use water in the resevoir and periodically soak the wafer in acetone.
- If absolutely necessary, Ultrasonic clean
    - Ultrasonic for as little time as possible
        - excess use can crack GaAs wafers and "unstick" deposited metals
        - Watch for liftoff of particular feature(s), then remove
    - Attenuate power by:
        - using large amounts of H2O in Ultrasonic unit
        - using Teflon beaker to reduce chatter
        - dipping beaker only partially in the bath Etch Polyimide
- Etch in polyimide Etcher, QZ 3296, for 70 sec
- Rinse in Etch Rinse, QZ 3297, for 30 sec
- Rinse in DI H2O for at least 30 sec
- N2 dry and inspect Proton Implant
- Send to IICO for Proton Implantation
    - IICO spectral services
    - 3050 Oakmead Village drive
    - Santa Clara, CA 95051
    - 408-727-2547

- Small pieces to be implanted should be mounted on a 3" silicon wafer, using 3M brand Kapton tape

- Implant Hydrogen
    - 1e15 at 110keV and 2e15 at 190keV has been used for compensation of a 0.6um 3e16 N- layer on top of a 6e18 N+ layer.

Strip polyimide
- Soak in hot (<=100C) polyimide thinner to remove gold
    - This takes at least 20min. One method that has worked is to soak 10min, ultrasonic 10 sec, soak 10 min, ultrasonic 10 sec, DI rinse immediately.

Ethylene diamine and ethanolamine are also available for use in stubborn cases. These are highly reactive solutions, and manufacturer's literature should be checked for instructions and safety precautions.

Ethanolamine (aka polyimide stripper) is very thick and does not transmit ultrasonic waves. Therefore, the ultrasonic will be ineffective unless a thinner bath is used in the ultrasonic. For example, you could have a beaker of thinner sitting in the ultrasonic and a beaker of stripper on the hot plate and then just move the wafer back and forth. This sounds like a good idea but has not been tried. There are a couple of potential problems with this. First, the wafer should not be allowed to dry during transit from one beaker to another. Secondly, it is not known what happens when stripper and thinner are mixed. The manufacturer should be consulted before trying this. An alternative method is to first soak and ultrasonic in thinner and then rinse and dry and then soak in stripper to get any stubborn cases.

Use ultrasonic bath as necessary to aid in liftoff
   see notes in "liftoff lithography" re use of ultrasonic
DI rinse, N2 dry
   After removing wafer from the thinner, rinse immediately before the thinner has a chance to dry. This helps to prevent the lifted off gold from readhearing to the wafer.
Ash polyimide residue
   Some edge residue may remain after mask removal
   Ash at full power for 3 to 5 minutes to remove residue

Schottky Metal
MASK LEVEL 3    DARKFIELD MASK    CRITICAL ALIGNMENT

This mask level is now being developed to provide micron resolution for the Schottky diodes. Formerly, the diodes and interconnects were formed with a simultaneous liftoff of 1000A Ti / 750A Pt / 1.4 um Au. This is being replaced by 300A Ti / 500A Pt / 2000A Au for the Schottkys and 100A Ti / 1.4 um Au for the interconnects.

Surface Preparation
   Solvent Clean (see above)
     Trichlorethane
     Acetone
     Isopropyl
     Rinse in cool DI water
     Nitrogen blow dry
   Dehydration bake 120 °C for 30 minutes
   Let wafer cool 5-10 minutes
Photoresist application
   Spin adhesion promoter for 40 seconds at 5000 rpm
   Spin AZ 5214e photoresist for 40 seconds at 5000 rpm
   Clean and turn off Spinner
Soft Bake
   Think about thermal inertia ! If you bake pieces in a closed petri dish, or in an open dish with large thermal mass, then bake times will have to be increased. Best to use open vessels.

Times given are for baking small pieces on an open petri dish on the top shelf of a Blue-M oven.

Bake in convection oven for 25 minutes at 90 °C

Turn on Aligner so source can warm up

Let wafers cool (approx. 10 minutes)

Exposure

Log into and follow direction on the aligner align if necessary ( possible?)

Expose for 48 mJ (2.9 sec at 16.5mW/cm2)

Chlorobenzene

Soak the wafer for 15 minutes in undiluted chlorobenzene

Chlorobenzene should be used in a covered beaker at the rear of the laminar flow hood to prevent fumes from entering the room.

Nitrogen dry the wafers

Pour chlorobenzene in special container

When full, the waste chlorobenzene can be disposed of in the solvent disposal drum in the Ginzton Lab north courtyard.

Development

Develop 1.5 to 1.75 minutes in 1:1 AZ solution developer:H2O (watch)

We (MR & CM) have decided that the best method here is to watch the development. When large (visible) areas on the wafer have cleared, transfer to the "clean" beaker for the final 15 seconds.

two-beaker method: last 15-30 seconds in "clean" beaker of developer

Rinse in DI water for 2 minutes

Nitrogen dry

Pour developer down the drain

Pre-evaporation clean

Just before placing wafers in evaporator do a 60 second buffered oxide etch in a teflon beaker. BOE contains HF, so be sure to dispose of it in the waste HF mixtures container.

Evaporate desired metal(s)

For micron resolution, metal thickness should be less than or on the order of 0.3um.

300A Ti / 500A Pt / 2000A Au lifted off well when put down at the following rates:

Ti   5-10 A/sec

Pt   5-8 A/sec

Au  10-15 A/sec

Liftoff Metal

Resist temptation to attack the metal. The best lift off tool is time and patience. Let the wafer sit at the bottom of the beaker for an hour or so.

Soak in acetone for at least 60 min

One method that has worked is to give Lance or Tom (whoever is doing the depositon) a beaker and instruct him to put the wafer in a covered beaker of acetone when he is finished. You can then go in at your leisure, or even the next day to do the liftoff.

Swirl the acetone around to lift the metal.
If the metal refuses to lift, blast it with the acetone bottle.
Tom's spray gun can blast off unrelenting metal pieces
    Since acetone attacks the seals of the spray gun, use water in the resevoir and periodically soak the wafer in acetone. The high pressure nitrogen air gun is also effective when the spray is at a large angle to the normal.

If absolutely necessary, Ultrasonic clean
    Ultrasonic for as little time as possible
        excess use can crack GaAs wafers and "unstick" deposited metals
        Watch for liftoff of particular feature(s), then remove
    Attenuate power by:
        using large amounts of H2O in Ultrasonic unit
        using Teflon beaker to reduce chatter
        dipping beaker only partially in the bath Acetone, isopropyl, and DI water rinse
N2 dry wafers
Inspect in optical microscope

Interconnect Metal
    MASK LEVEL 3   DARKFIELD MASK   CRITICAL ALIGNMENT

This mask step replaces both the Schottky and interconnect metal steps. We put down thick (Ti/Pt/Au) metal on the transmission line pattern. Only where the substrate has been masked from proton isolation will a Schottky be formed- at all other points we get metal on insulating dielectric. Alignment is easier as we can misalign in the horizontal plane without making the metal miss the unimplanted regions, and a mask step is eliminated Photoresist
    Thick Metal Liftoff with AZ 5214 resist but:
    ...increase exposure ~20% to fully expose ohmic etch holes
.Evaporate
    Etch wafer in BOE for 60 secs prior to evaporation
    Evaporate
        1000 A Ti
        750 A Pt
        1.2 $\mu$m Au
Liftoff

Silicon Nitride
    Mask Level 4    DARKFIELD MASK

This dielectric layer serves two purposes. It is the capacitor dielectric, and it also protects the circuits from the atmosphere.

Surface Preparation
    Solvent Clean

Trichlorethane
Acetone
Isopropyl
Rinse in cool DI water
Nitrogen blow dry
Dehydration bake 120 °C for 30 minutes
Let wafer cool 5-10 minutes PECVD Si3N4

Typical capacitor dielectric thicknesses range from 0.10um to 0.25um. The very thin layers suffer yield problems on large area capacitors due to pin holes in the film. Thick layers tend to crack due to thermal expansion missmatch.

0.2um is probably a good place to start, but it would be nice to get down to 0.1um Deposition temperature must be less than 290C. 250C is probably best.

Gerald Li at Varian, Santa Clara has successfully deposited Si3N4 at 250C. The yield was poor because at this low temperature it was difficult to get high quality 0.1um films. 0.2um is more realistic and he has done much better with this.

Photoresist
    Standard S1400-33 process
        use adesion promoter
        hardbake 120C for 20 min

RIE

These instructions are for the Harris group machine.

The buttons on the machine have two states: in and out. The button should light when the button is depressed, unfortunately, most of the bulbs are burnt out, so you must look at the position of the switch to see if it is in or out.

PECVD/RIE switch

The same electronics are used to control both the PECVD and RIE machines, so be sure neither is in use before proceding. If the PECVD/RIE key switch is on PECVD and no one is using it, turn the switch after disengaging the pump as described below.

Mains switch out
PECVD/RIE key switch to RIE
Mains switch in

Turn on gas bottles
    Open valve on C2F6 bottle (normally open)
        Pressure should be about 10psi Put wafers in chamber
When not being used, the RIE chamber should be pumped down, therefore, it is necessary to purge and vent before hoisting the lid.
    set purge timer to 1 min
    purge 2 switch should be in
    turn on both timers
    vent switch in after purge and vent, hoist up lid
> Press both hoist up buttons simultaneously vent switch out arrange wafers hoist lid down
> Lower lid until it makes contact with the chamber all the way around. If the lid is hoisted down to far, it will lift in the front. Once the lid is down, it may be necessary to align the lid with the chamber.

Switch to MPB pump for pump down valve switch out timers off pump switch out

MPB switch in pump switch in valve switch in wait for pressure to stop changing

Start gas flow set pressure to zero with screwdriver

GAS2 switch in (C2F6)
> Mode switch should be on open flow on, adjust flow to 20
> The flow is turned on with the toggle switch near the LED flow display for C2F6
>
> The flow is adjusted with the 10 turn pot next to the toggle switch log in to log book
> The delay allows the gas to run at low pressure for a while to purge the chamber.

adjust pressure to 40mT
> Pressure is adjusted with the 10 turn pot and multipier switch near the LED pressure gauge.

mult switch set at 0.1 set mode to auto
> The exit valve on the chamber will gradually close until the pressure is brought up to that specified.

slightly low reading on guage ok

ETCH set process time
> Etch rate is approx. 70A/min for sputtered nitride, 300A/min for PECVD nitride.

set purge time to 2.5 min set RF power to 0W

RF power switch in increase RF power to 200W in approx 2W out
> The chamber can be matched either manually or automatically. Try auto mode first. Observe the reflected power as the input power is increased. If the reflected power is a significant fraction of the input power (>2%) the load needs to be matched. This is a two variable optimiztion process of 'tuning' and 'load'. If the load is set to auto, this should happen automatically, but rumor has it that the auto match doesn't allways do the best job.

If there is extreme difficulty in matching the load (>30% reflected power), there is probably something wrong (like a conductive wafer bridging the anode to the cathode).

self bias should be 380V

When Process is Complete . . .
- RF power shuts off automatically
- Purge begins automatically
- Set Mode switch to open
- Turn off flow
- Set RF power pot to 0
- Wait for purge to finish
- Vent switch in
  - When vent is completed the lid will raise slightly
- Hoist lid, remove wafers
- Vent switch out Pump down
- valve switch out
- timers off
- pump switch out
- MPB
- pump switch in
- valve switch in 30 sec 6:1 BHF etch to clean up Strip photoresist
- Soak in acetone

Airbridge Posts

Mask Level 5    DARKFIELD MASK

There are two mask levels involved in making an airbridge. This mask level covers the area that is to be spanned by the bridge, but has holes where the bridge comes down to first level metal. Also, a hole is left where an MIM capacitor top-plate will be.

The airbridge process described here is adapted from a Texas Instruments process and a Hughes process. Chris Storment (723-1209 in AEL 132) gave me the information from Hughes, while John Owens of Santa Clara University explained the Texas Instruments process.

Photoresist

For best resolution use standard AZ5214 process
- and hardbake 120C for 20min
- Plasmod at medium power for 2 min
  - RIE of Si3N4 tends to leave a thin polymer film that must be removed before subsequent metal deposition. The plasmod will help ensure complete removal of this film.

This step also cleans up residue from the PR process.

Use S1400-33 process for 3um thick film

AZ 5903 and AZ4330 are also being investigated

AZ5903 could provide taller bridges (up to 1.2mils!) and better aspect rations (3:1), AZ4330 avertizes better aspect ratios (2:1) at similar thicknesses.

Evaporate flash layer

This layer shorts all the airbridges together to provide a plating current path and also serves as a good surface on which to initiate plating. The layer must be thick enough to safely carry the plating current even over steps in the photoresist.

100A   Ti   sticking layer
2000A  Au   conductive layer
300A   Ti   sticking layer for subsequent photoresist.

The last layer also keeps the underlying gold surface clean until immediately prior to plating.

Procede to next level photoresist

Since it is impossible to do a solvent clean at this point, and any kind of an acid clean would be difficult (since the thin Ti layer etches in almost anything), it is advisable to put down the next layer of photoresist immediately after the wafer is removed from the vacuum chamber.

Airbridge Interconnects

Mask Level 6          DARKFIELD MASK

This is the second mask of the airbridge fabrication sequence. This mask defines the areas that will be up-plated with gold. Gold is plated to form airbidges and the top plates of MIM capacitors. This mask is a superset of the airbridge post mask. Anything feature defined by this mask but not on the previous mask will be suspended on top of the previous layer of photoresist.

Photoresist

Adhesion is critical in this step so be sure to use adhesion promoter

Be certain that there is no scum left. Scum can devestate this whole process.

Use AZ4330 process except . . .

softbake for 60min at 75C expose for 16 sec at 16.5mW/cm2 (265mJ/cm2)

develop in 1:1 H2O:AZ concentrate. watch!

DUV expose?

It would be desirable at this point to do a 2min DUV expose instead of a hardbake which makes the lower lever more difficult to remove. Unfortunately, we do not currently have this capability.

Open areas for electrical contact to flash layer

Use a Q-tip slightly wetted with acetone to clear contact area in upper right and lower left corner of wafer.

This is really not a good way to accomplish electrical contact. Putting these areas on the airbridge crossover mask would make more sense.

post-bake 30 min at 90C

AZ5903 and S1400-33 are also being investigated

Etch 300A Ti layer at posts

Use 20:1 H2O:HF solution

Don't use a buffered solution, it etches too slowly

Etch until 10sec after wafer turns gold (approx 1min)

DI rinse N2dry

Inspect under optical microscope.
> The Au will not plate significantly on Ti and not at all on dirty Ti. Be sure Ti is completely cleared in regions to be plated.

Plate 1.8um Au or as much as you dare.
> Due to the two layer photoresist structure it is difficult to resolve narrow spaces (think of the aspect ratio of the complete 2 layer feature). So beware. Currently, plating for 8min at 50mA is working well and yields about 1.8um in the finished structure.
>
> 2.3 um has been done with this process but 2.5um spaces are marginal.

Rinse off top layer of photoresist with acetone spray
> Spraying instead of soaking prevents attacking the lower level resist. If things start lifting off now, it could get messy.

Rinse with isopropyl and DI spray

Etch 300A Ti layer in the field

Use 20:1 H2O:HF solution
> Don't use a buffered solution, it etches too slowly

Etch until 10sec after wafer turns gold (approx 1min)

DI rinse N2dry

Inspect under optical microscope.

Etch 2000A Au layer

Use KI2:I2:H2O gold etch in lab diluted in >10 parts H2O
> RIE or Ion Milling would be superior ways to go if and when available.

Etch until 10 sec after Au clears.
> This is very difficult to tell in this murky brown solution so check every 15 seconds by DI rinsing. It should take approximately 30 seconds.

DI rinse, N2 dry.

Etch 100A Ti layer
> This is certainly not necessary, however, it makes removal of the lower level photoresist easier.

Use 20:1 H2O:HF solution

Etch approx 30 seconds

DI rinse N2 dry

Strip lower level resist
> This is difficult using acetone alone. The warm stripper hasn't been tried but should work better.

Soak in acetone

Soak in warm photoresist stripper

Do not ultrasonic
> Ultrasonic waves spell death to airbridges

APPENDIX SECTIONS

Wafer Cleaning
> Be careful about boiling solvents. TCA and acetone both tend to boil in an unstable fashion, occasionally superheating and then expelling solvent all over the place at once. Use some source of nucleation for bubbles, like tweezers, stirring rod, etc.

In transferring the wafer between solvents, make sure that the surface remains wet at all times. In the final step, DI water rinse & nitrogen dry, the water should be blown off as a sheet, leaving no drops to dry, leaving a residue.

2 minutes in boiling TCA 2 minutes in Acetone at room temperature, or slightly warmed
> Acetone is suspected to be weakly carcinogenic, so DON'T boil the stuff. If you do boil it, keep it under the hood.

2 minutes in boiling Isopropyl

DI water rinse

N2 dry dehydration bake if photoresist or polyimide follows
> 120°C for 30min.

Mask Cleaning

...is essential for high-resolution, high-yield lithography if you plan to use your mask more than once!

Soak in Shipley photoresist remover
> very gentle wet scrubbing with Q-tip

DI rinse

Nitrogen dry
> use air knife and be very careful not to drop the mask

Store waste in gallon jug for later disposal
> Remover 150 is an organic acid and needs to be stored for proper disposal.
> Remover 1165 is a mixture of solvents that can be disposed of down the solvent drain.

Standard AZ5214e Photoresist (etch masks, etc.)

Surface Preparation
> This section assumes that nothing has been done previously to the wafer. If processing has already occured then it may be necessary to skip some cleaning steps so that the wafer is not damaged Solvent Clean (see above)

Dehydration bake 120 °C 30 minutes

Let wafer cool 5-10 minutes

Photoresist application
> Spin on adhesion promoter 40 sec 3000 rpm
>> adhesion promoter should be filtered
>> approx .75 cc per 2" wafer
>
> Spin AZ 5214e for 40 seconds at 3000 rpm
>> approx 1.5 cc per 2" wafer Soft Bake
> Think about thermal inertia ! If you bake pieces in a closed petri dish, or in an open dish with large thermal mass, then bake times will have to be increased. Best to use open vessels.
> Times given are for baking small pieces on an open petri dish on the top shelf of a Blue-M oven.

Bake in convection oven for 25 minutes at 90°C

Turn on Aligner so source can warm up
Let wafers cool (approx. 5 minutes)

Exposure

Log into logbook and follow directions for aligner
Expose 50 mJ with uv400 optics (3 sec at 16.5mW/cm2)
or expose 192 mJ with uv300 optics
> Most properties of AZ5214e are better with uv400 optics. The one advantage of 300nm optics is the possibility of submicron resolution.

Development

Develop 90 seconds in 1:1 solution AZ developer:H2O (watch)
use 2-beaker development with last 15 seconds in "clean" developer
Rinse in DI for 2 minutes
Nitrogen dry
Pour developer down the drain Postbake 30min at 140C is necessary for the harshest applications
20min at 120C is recommended for most applications
20min at 90C is adequate if edge rounding is unacceptable
Gentle Plasma Descum, if necessary
Inspect wafers under optical microscope

Liftoff Photoresist (Metallization)

Let's talk a little about liftoff lithography and lithography in general. A number of difficulties arose in making a Chlorobenzene liftoff process for the Suss aliigner, and we learned a number of things in the process.

The idea in liftoff lithography is to generate resist with overhanging edges. Metal deposition from some point source (e.g. an electron-beam evaporator) will then result in a film which is discontinuous over resist edges. Dissolution of the resist in Acetone or resist thinner will then remove all metal over the resist, leaving only metal that was deposited on the semiconductor substrate. Overhanging edges are critical!!!

To attain such edges we do two things: we harden the surface of the resist with Chlorobenzene and we SOFTEN the underlying resist by incomplete softbaking. Ideally, resist will not develop in areas where it has not been exposed; all practical resists have some small development rate even if unexposed. By under-baking the resist during softbake, significant dissolved solvents and water will remain in the resist, increasing the unexposed development rate. Underbaking introduces problems, as development times are reduced and become sensitive to the exact bake conditions. In combination with a resist surface which has been in some way hardened, development will occur more rapidly in the depth of the resist than on the surface, generating an undercut edge profile. The edges of the resist then will have an overhanging lip, plus some recessed sidewall, whose slope may be vertical or either inward or outward.

The lip is generated by surface hardening with a Chlorobenzene soak. This process is neither high-resolution nor terribly reproducible; we simply are using it until a more sophisticated 2-resist process is developed. Chlorobenzene selectively removes lighter (low molecular weight) polymers from the resist, leaving a resist surface which then dissolves more slowly in developer. As longer soaks permit progressively deeper penetration of the Chlorobenzene solvent, the vertical thickness of the resist is a function of the soak time. Fifteen minutes gives a good thick lip (~0.2 um) which doesn't seem to wilt under exposure to high temperatures during metal evaporation. Process reproducibility is also most likely improved with longer chlorobenzene soak times.

The slope of the recessed sidewall can be important. The ideal profile is a slight outward slope, so that the overhanging lip of the resist is directly above the bottom edge of the resist where it meets the substrate. This permits most accurate dimensional control and allows for accurate registration of recess etch and deposited metal in self-aligned gate processes. If the edge slope is severe, so that the bottom edge of the resist projects beyond the lip, then control of metallization feature size is lost. In severe cases, the slope can be so poor that a continuous metal film is deposited during evaporation, preventing liftoff.

Edge slope is well corellated to resist actinic absorbance and to exposure time. To understand this better, we really need to look at the contrast curves of the resist; these are much like the contrast curves of photographic film. Ideal photoresist would dissolve away (develop) at zero rate at all exposure energies below some threshold energy Eth, and etch away at a high rate for exposures above Eth. Practical resist shows fast development at exposures above Eth, but the exposure rate then decreases at some finite rate for exposures below this- the faster the decrease in exposure rate the higher the resist's CONTRAST (gamma). Now, photoresist is not perfectly transparent. The transparency increases as the resist is exposed, and the difference between the unexposed and exposed absorbtion coefficients is called the actinic absorbance. If the attenuation is significant, the exposure at the bottom of the photoresist will be lower than at the top. If the exposure at the top of the resist is near Eth, then the exposure at the bottom of the resist will be below Eth, decreasing the development rate at the bottom and thus generating sloping edges. The solution is then to increase the exposure slightly. Clearly, resists with lower attenuation show less of an edgewall slope problem.

For this reason, lithography with 1400 or 1300 series resists (Shipley or Hoescht) is not advisable on the Karl Suss aligner operating at 300 nm. The attenuation coefficient of these resists at 300 nm is about 1.5 nepers/micron, and the resulting sidewalls are sloped at about 45 degrees! Hoescht resist AZ 5200-series has much better transparency at 300 nm, and permits near-vertical sidewalls at 300 nm exposure. Sidewall slope is adjusted by varying the exposure time. AZ-5200 resists are generally just more modern than the 1400 and 1300 series, and have a number of other improved properties, including improved dimensional control during hardbake.

Surface Preparation
    Solvent Clean (see above)
        Trichlorethane
        Acetone
        Isopropyl
        Rinse in cool DI water
        Nitrogen blow dry
    Dehydration bake 120 °C for 30 minutes
    Let wafer cool 5-10 minutes Photoresist application Spin adhesion promoter for 40 seconds at 3000 rpm
Spin AZ 5214e photoresist for 40 seconds at 3000 rpm
spin at less than 3000 rpm for thickest metals
Clean and turn off Spinner Soft Bake
> Think about thermal inertia ! If you bake pieces in a closed petri dish, or in an open dish with large thermal mass, then bake times will have to be increased. Best to use open vessels.
> Times given are for baking small pieces on an open petri dish on the top shelf of a Blue-M oven.

Bake in convection oven for 25 minutes at 75 °C
Turn on Aligner so source can warm up
Let wafers cool (approx. 10 minutes)

Exposure
Log into and follow direction on the aligner
align if necessary ( possible?)
Expose for 50 mJ (3 sec at 16.5mW/cm2)

Chlorobenzene
Soak the wafer for 15 minutes in undiluted chlorobenzene
> Chlorobenzene should be used in a covered beaker at the rear of the laminar flow hood to prevent fumes from entering the room.

Nitrogen dry the wafers
Pour chlorobenzene in special container
> When full, the waste chlorobenzene can be disposed of in the solvent disposal drum in the Ginzton Lab north courtyard.

Development
Develop 1.5 to 1.75 minutes in 1:1 AZ solution developer:H2O (watch)
> We (MR & CM) have decided that the best method here is to watch the development. When large (visible) areas on the wafer have cleared, transfer to the "clean" beaker for the final 15 seconds.

two-beaker method: last 15-30 seconds in "clean" beaker of developer
Rinse in DI water for 2 minutes
Nitrogen dry
Pour developer down the drain Pre-evaporation clean
> Just before placing wafers in evaporator do a 60 second buffered oxide etch in a teflon beaker. BOE contains HF, so be sure to dispose of it in the waste HF mixtures container.

Evaporate desired metal(s)

Liftoff Metal
> Resist temptation to attack the metal. The best lift off tool is time and patience. Let the wafer sit at the bottom of the beaker for an hour or so.

Soak in acetone for at least 60 min
> One method that has worked is to give Lance or Tom (whoever is doing the depositon) a beaker and instruct him to put the wafer in a covered beaker of acetone when he is finished. You can then go in at your leisure, or even the next day to do the liftoff.

Swirl the acetone around to lift the metal.

If the metal refuses to lift, blast it with the acetone bottle.
Tom's spray gun can blast off unrelenting metal pieces
> Since acetone attacks the seals of the spray gun, use water in the resevoir and periodically soak the wafer in acetone. The high pressure nitrogen air gun is also effective when the spray is at a large angle to the normal.

If absolutely necessary, Ultrasonic clean
    Ultrasonic for as little time as possible
        excess use can crack GaAs wafers and "unstick" deposited metals
        Watch for liftoff of particular feature(s), then remove
    Attenuate power by:
        using large amounts of H2O in Ultrasonic unit
        using Teflon beaker to reduce chatter
        dipping beaker only partially in the bath Acetone, isopropyl, and DI water rinse
N2 dry wafers
Inspect in optical microscope

AZ4330

AZ4330 is a highly transparent photoresist with advertised aspect ratios of better than 2:1. It spins on in the neighborhood of 3.8um. This resist is one used bu Hughes in their airbridge process. It is advertised to be stable in alkaline plating baths.

Surface Preparation
> This section assumes that nothing has been done previously to the wafer. If processing has already occured then it may be necessary to skip some cleaning steps so that the wafer is not damaged Solvent Clean (see above)
    Dehydration bake 120 °C 30 minutes
    Let wafer cool 5-10 minutes Photoresist application
    Spin on adhesion promoter 40 sec 3000 rpm
        adhesion promoter should be filtered
        approx 0.75 cc per 2" wafer
    Spin AZ4330 for 40 seconds at 3000 rpm
        approx 1.5 cc per 2" wafer Soft Bake
> If you bake pieces in a closed petri dish, or in an open dish with large thermal mass, then bake times will have to be increased. Best to use open vessels.
> Times given are for baking small pieces on an open petri dish on the top shelf of a Blue-M oven.

Bake in convection oven for 60 minutes at 90°C
> There is a trade off here between soft bake time and contrast. The 60 min bake is supposed to give the best contrast. A shorter bake time would be acceptable but would reduce contrast.

Turn on Aligner so source can warm up
    Let wafers cool (approx. 5 minutes)

Exposure

Log into logbook and follow directions for aligner
Expose 260 mJ/cm2 with uv400 optics (16 sec at 16.5mW/cm2)

Development
    Develop 130 seconds in 1:1 solution AZ developer:H2O (watch)
        develop time not yet established
    use 2-beaker development with last 15 seconds in "clean" developer
    Rinse in DI for 2 minutes
    Nitrogen dry
    Pour developer down the drain Postbake
    30min at 140C is necessary for the harshest applications
    20min at 120C is recommended for most applications
    20min at 90C is adequate if edge rounding is unacceptable
    Gentle Plasma Descum, if necessary
        2 min or less on full power in O2 plasma using the plasmod
    Inspect wafers under optical microscope

S1400-33

This resist spins on in the neighborhood of 2.8um. Aspect ratios are no better than 1:1. Stability in PH 9.5 is reasonable with only a 30min 90C bake.

Surface Preparation
    This section assumes that nothing has been done previously to the wafer. If processing has already occured then it may be necessary to skip some cleaning steps so that the wafer is not damaged
    Solvent Clean
    Dehydration bake 120 °C 30 minutes
    Let wafer cool 5-10 minutes Photoresist application
    Spin on adhesion promoter 40 sec 3000 rpm
        adhesion promoter should be filtered
        approx .75 cc per 2" wafer
    Spin S1400-33 for 40 seconds at 3000 rpm
        approx 1.5 cc per 2" wafer Soft Bake
    If you bake pieces in a closed petri dish, or in an open dish with large thermal mass, then bake times will have to be increased. Best to use open vessels.
    Times given are for baking small pieces on an open petri dish on the top shelf of a Blue-M oven.
    Bake in convection oven for 25 minutes at 90°C
    Turn on Aligner so source can warm up
    Let wafers cool (approx. 5 minutes)

Exposure
    Log into logbook and follow directions for aligner
    Expose 230 mJ with uv400 optics (14 sec at 16.5mW/cm2)

Development

Develop 50 seconds in 1:1 solution AZ developer:H2O (watch)
use 2-beaker development with last 15 seconds in "clean" developer
Rinse in DI for 2 minutes
Nitrogen dry
Pour developer down the drain Postbake
30min at 140C is necessary for the harshest applications
20min at 120C is recommended for most applications
20min at 90C is adequate if edge rounding is unacceptable Gentle Plasma Descum, if necessary
2 min or less on full power in O2 plasma using the plasmod Inspect wafers under optical microscope

Gold Plating

Since plating is a selective, additive procedure, it is potentially much more economical than subtractive methods such as sputtering and evaporation which coat the entire inside of the vacuum chamber.

However, plating tends to be a lower resolution process than other methods because it follow the contours of the resist which is defining the region to be plated. This means the line width is determined not by the width of the resist space at the bottom near the substrate, but by the width of the space at whatever level the gold is plated.

Put teflon base in the 3 liter beaker.

Use 1/2 gallon of Sel-Rex Neutronix 309 gold plating solution.
The solution can be reused until the gold is depleted unless it is contaminated. Unused solution is clear.

Insert anode into base.

Heat solution to 50C
Use Lance's hot plate with the stir-bar moter. Put heat on 7 until the solution reaches 40C then reduce to 3.5 to maintain temperature at 50C. Watch to make sure the solution does not boil. It may be necessary to back off on the heat a little during the initial warm-up.

Plating at an improper temperature can result in gold being REMOVED from the wafer.

Put wafer on holder and insert into base.
The two gold spring clips should make good electrical contact to the cleared gold areas on the wafer. The wafer should be flat in the 5mil recess in the holder.

Hook ground to wafer contact wire, plus to anode wire.

Plate, agitating vigorously
The specified current density is 4 amps per square foot. (4.3 mA/cm2). However, you must account for the fact that you are plating a good deal of wire also. The current will most likely be experimentally determined. 50mA for a 2" wafer is a good place to start.
Plating too fast will result in dark, ugly deposits.

Turn stir bar speed up until just before a vortex is formed (about 7 on Lances hot plate).

Remove wafer holder. DI rinse, N2 dry wafer.

Filter plating solution as it is poured back into container.
Rinse the plating apparatus

AZ5903 (Under Development)
Surface Preparation
This section assumes that nothing has been done previously to the wafer. If processing has already occured then it may be necessary to skip some cleaning steps so that the wafer is not damaged Solvent Clean (see above)
Dehydration bake 120 °C 30 minutes
Let wafer cool 5-10 minutes

Photoresist application
Spin on adhesion promoter 40 sec 3000 rpm
adhesion promoter should be filtered
approx .75 cc per 2" wafer
Apply and Spread AZ5903 for 20 seconds at 100 rpm
This resist is too thick to use the usual in line filter.
approx 4cc per 2" wafer
Spin at 6000 rpm for 100 sec for 8um thickness
Edge bead removal?

Soft Bake
If you bake pieces in a closed petri dish, or in an open dish with large thermal mass, then bake times will have to be increased. Best to use open vessels.
Times given are for baking small pieces on an open petri dish on the top shelf of a Blue-M oven.
Thick resists will crack during exposure if not well baked Bake in convection oven for 40 minutes at 90°C
Turn on Aligner so source can warm up
Let wafers cool (approx. 5 minutes)

Hold for >10 min but < 2hrs

Exposure
Log into logbook and follow directions for aligner
Expose 660 mJ with uv400 optics (40 sec at 16.5mW/cm2)

Development
Develop 120 seconds in 1:1 solution AZ developer:H2O (watch)
use 2-beaker development with last 15 seconds in "clean" developer
Rinse in DI for 2 minutes
Nitrogen dry
Pour developer down the drain

Postbake
Postbake should be within 5 to 10C of the softbake temp or the resist will flow significantly (at higher temperatures).

40min at 90C
Gentle Plasma Descum, if necessary
   2 min or less on full power in O2 plasma using the plasmod
Inspect wafers under optical microscope

Image Reversal (Under Development)
Surface Preparation
   This section assumes that nothing has been done previously to the wafer. If processing has already occured then it may be necessary to skip some cleaning steps so that the wafer is not damaged
   Solvent Clean (see above)
   Dehydration bake 120 °C 30 minutes
   Let wafer cool 5-10 minutes
Photoresist application
   Spin AZ 5214e for 40 seconds at 3000 rpm
Soft Bake
   Think about thermal inertia ! If you bake pieces in a closed petri dish, or in an open dish with large thermal mass, then bake times will have to be increased. Best to use open vessels.
   Times given are for baking small pieces on an open petri dish on the top shelf of a Blue-M oven.
   Bake in convection oven for 25 minutes at 90°C
   Turn on Aligner so source can warm up
   Let wafers cool (approx. 10 minutes)
Exposure
   Log into logbook and follow directions for aligner
   Expose 17 sec @ 10.0 mW/cm2 power
Post Exposure Bake
   Bake in Third oven at 115-125°C for desired time
Flood Exposure
   Remove 365nm interference filter
   Place 5 in. glass plate in mask chuck slides as a 300nm filter
   Expose in aligner for desired time without a mask chuck
Develop
   Use Shipley 351 developer for desired time
Inspect
Strip in Solvents to remove all but stubborn resist
   Use Plasmod for removing hard baked areas

---

APPENDIX B

MMIC Process August 5, 1988 RM

This process is for fabrication of the millimeter-wave transmission lines and schottky varactor diodes of a nonlinear transmission line pulse compressor; similar millimeter-wave circuits can be made with small process variations. Etch times and ion implant energies given are for the standard material for the nonlinear transmission line, ie a 0.6 μm N- layer (3X10^16) above a a 0.8 μm N + layer (6X10^18) on a [100] semi-insulating GaAs substrate.

Process steps have subsequently been added to fabricate capacitors and air-bridges. These processes are still under development.

Self-Aligned Ohmic Contacts
MASK LEVEL 1     DARK FIELD

In this step the N- layer is first etched to expose the N+ layer. Ohmic metal is then evaporated and lifted off using the same photoresist which served as an etch mask. The alignment marks are also on this mask layer.

Photoresist
    Use AZ 5214 and follow standard photoresist procedure
    but postbake 120°C, 20 min, and USE HMDS
        HMDS is not essential on GaAs but can be useful when adhesion is critical
    After postbake, Alpha Step to find starting resist thickness
    The resist thickness was found to be 1.55-1.65 microns
    Verify resist thickness before etching!

Wet Etch
    Use NH4OH:H2O2:H2O (14 : 2.4 : 200)
        A 1:1 H2O:H2O2 adjusted to PH 7.1 with NH4OH has been shown to have less lateral etching.
        Etch in H2O bath for stable temperature.
            Etch rate estimated at 0.44um/min
    Etch first piece for 1 min to establish etch rate
    Stop etch with 2 min DI H2O rinse, Nitrogen dry
    Alpha Step to find the estimated etch depth
        measure in two places
        Don't forget to subtract the resist thickness
    Perform additional wet etchs to get 0.75 μm etch depth
        Estimate needed time conservatively to avoid overetching
        Alpha Step after each etch to monitor progress Evaporate Metal
    Etch wafer for 60 seconds in 6:1 BOE immediatly prior to evap.
    Evaporate
        108 A Ge
        102 A Au
        63 A Ge
        236 A Au
        100 A Ni
        6000 A Au Standard Liftoff
    make sure periphery lifts off, otherwise it burn in the RTA
3-solvent clean, DI rinse...
    Alloy metal at 450°C for 25 seconds in RTA
    Measure Contact resistance

Proton Implant
MASK LEVEL 2      DARKFIELD MASK    CRITICAL ALIGNMENT

Proton Implantion is used to electrically Isolate N+ regions and to eliminate conductive layers under transmission lines. Protons are implanted into the wafer at high energies, generating ~3 defect per proton & making the substrate semi-insulating. A thick Au layer defined by liftoff above a polyimide removal layer forms the implant mask.

Proton implant energies and doses depend on the particular layer structure and application.

Hot Solvent Clean
Apply Ciba-Geigy polyimide
Spin adhesion promoter at 5000 rpm for 30 sec
Spin Probimide 286 at 5000 rpm for 30 sec
Bake polyimide
- Bake at 100°C for 30 min
- Ramp to 180°C, Hold for 15 min at 180 +/- 5°C
- Ramp to 240°C, Hold for 15 min at 240+/- 5°C
- Let oven cool down to 150°C before removing wafers

Photoresist
Thick Metal liftoff with AZ 5214e
- Spin at 2500 rpm for 30 sec to achieve approx 1.95um
- Increase exposure time by about 15%
  - This compensates for low reflectivity of the polyimide and the additional resist thickness. At 16.5mW/cm2 with UV400 optics, the exposure time is 3.5 sec (58mJ/cm2).

Evaporate Metal
100A Ti
1.8um Au
Leave at least 1000A between the top of the Au and the top of the photoresist for safety.

Liftoff Metal
Soak in acetone for at least 30 min
> One method that has worked is to give Lance or Tom (whoever is doing the depositon) a beaker and instruct him to put the wafer in a covered beaker of acetone when he is finished. You can then go in at your leasure, or even the next day to do the liftoff.

Swirl the acetone around to lift the metal.
If the metal refuses to lift, blast it with the acetone bottle.
Tom's spray gun can blast off unrelenting metal pieces
> Since acetone attacks the seals of the spray gun, use water in the resevoir and periodically soak the wafer in acetone.

If absolutely necessary, Ultrasonic clean
- Ultrasonic for as little time as possible
  - excess use can crack GaAs wafers and "unstick" deposited metals
  - Watch for liftoff of particular feature(s), then remove
- Attenuate power by:
  - using large amounts of H2O in Ultrasonic unit using Teflon beaker to reduce chatter
dipping beaker only partially in the bath Etch Polyimide
Etch in polyimide Etcher, QZ 3296, for 70 sec
Rinse in Etch Rinse, QZ 3297, for 30 sec
Rinse in DI H2O for at least 30 sec
N2 dry and inspect Proton Implant
Send to IICO for Proton Implantation
> IICO spectral services
> 3050 Oakmead Village drive
> Santa Clara, CA 95051
> 408-727-2547
>
> Small pieces to be implanted should be mounted on a 3" silicon wafer, using 3M brand Kapton tape Implant Hydrogen
> 1e15 at 110keV and 2e15 at 190keV has been used for compensation of a 0.6um 3e16 N- layer on top of a 6e18 N+ layer.

Strip polyimide
Soak in hot (<=100C) polyimide thinner to remove gold
> This takes at least 20min. One method that has worked is to soak 10min, ultrasonic 10 sec, soak 10 min, ultrasonic 10 sec, DI rinse immediately.
>
> Ethylene diamine and ethanolamine are also available for use in stubborn cases. These are highly reactive solutions, and manufacturer's literature should be checked for instructions and safety precautions.

Use ultrasonic bath as necessary to aid in liftoff
see notes in "liftoff lithography" re use of ultrasonic DI rinse, N2 dry
> After removing wafer from the thinner, rinse immediately before the thinner has a chance to dry. This helps to prevent the lifted off gold from readhearing to the wafer.

Ash polyimide residue
Some edge residue may remain after mask removal
Ash at full power for 3 to 5 minutes to remove residue

Schottky and Interconnect Metal
MASK LEVEL 3   DARKFIELD MASK   CRITICAL ALIGNMENT This mask step replaces both the Schottky and interconnect metal steps. We put down thick (Ti/Pt/Au) metal on the transmission line pattern. Only where the substrate has been masked from proton isolation will a Schottky be formed- at all other points we get metal on insulating dielectric. Alignment is easier as we can misalign in the horizontal plane without making the metal miss the unimplanted regions, and a mask step is eliminated Photoresist
Thick Metal Liftoff with AZ 5214 resist but:

...increase exposure ≈20% to fully expose ohmic etch holes
... and develop in dark Evaporate
Etch wafer in BOE for 60 secs prior to evaporation
Evaporate
1000 A Ti
750 A Pt
1.2μm Au Liftoff

Silicon Nitride
Mask Level 4     DARKFIELD MASK

This dielectric layer serves two purposes. It is the capacitor dielectric, and it also protects the circuits from the atmosphere.

Surface Preparation
Solvent Clean (see above)
Trichlorethane
Acetone
Isopropyl
Rinse in cool DI water
Nitrogen blow dry
Dehydration bake 120 °C for 30 minutes
Let wafer cool 5-10 minutes PECVD Si3N4

Typical capacitor dielectric thicknesses range from 0.10um to 0.25um. The very thin layers suffer yield problems on large area capacitors due to pin holes in the film. Thick layers tend to crack due to thermal expansion missmatch.

0.2um is probably a good place to start, but it would be nice to get down to 0.1um Deposition temperature must be less than 290C. 250C is probably best.

Photoresist
Standard S1400-33 process
use adesion promoter
hardbake 120C for 20 min RIE
These instructions are for the Harris group machine.

The buttons on the machine have two states: in and out. The button should light when the button is depressed, unfortunately, most of the bulbs are burnt out, so you must look at the position of the switch to see if it is in or out.

PECVD/RIE switch
The same electronics are used to control both the PECVD and RIE machines, so be sure neither is in use before proceding. If the PECVD/RIE key switch is on PECVD and no one is using it, turn the switch after disengaging the pump as described below.

Mains switch out
PECVD/RIE key switch to RIE

Mains switch in
Turn on gas bottles
    Open valve on C2F6 bottle (normally open)
        Pressure should be about 10psi
Put wafers in chamber
    When not being used, the RIE chamber should be pumped down, therefore, it is necessary to purge and vent before hoisting the lid.
    set purge timer to 1 min
    purge 2 switch should be in
    turn on both timers
    vent switch in
      after purge and vent, hoist up lid
        Press both hoist up buttons simultaneously
    vent switch out
    arrange wafers
    hoist lid down
        Lower lid until it makes contact with the chamber all the way around. If the lid is hoisted down to far, it will lift in the front. Once the lid is down, it may be necessary to align the lid with the chamber.
Switch to MPB pump for pump down
    valve switch out
    timers off
    pump switch out
    MPB switch in
    pump switch in
    valve switch in
    wait for pressure to stop changing
Start gas flow
    set pressure to zero with screwdriver
    GAS2 switch in (C2F6)
        Mode switch should be on open
    flow on, adjust flow to 20
        The flow is turned on with the toggle switch near the LED flow display for C2F6
        The flow is adjusted with the 10 turn pot next to the toggle switch
    log in to log book
        The delay allows the gas to run at low pressure for a while to purge the chamber.
    adjust pressure to 40mT
        Pressure is adjusted with the 10 turn pot and multipler switch near the LED pressure gauge.
        mult switch set at 0.1
        set mode to auto
            The exit valve on the chamber will gradually close until the pressure is brought up to that specified.
        slightly low reading on guage ok
ETCH
    set process time
        Etch rate is approx. 70A/min for sputtered nitride, 300A/min for PECVD nitride.

set purge time to 2.5 min
set RF power to 0W
RF power switch in
increase RF power to 200W in approx 2W out
> The chamber can be matched either manually or automatically. Try auto mode first. Observe the reflected power as the input power is increased. If the reflected power is a significant fraction of the input power (>2%) the load needs to be matched. This is a two variable optimiztion process of 'tuning' and 'load'. If the load is set to auto, this should happen automatically, but rumor has it that the auto match doesn't allways do the best job.
>
> If there is extreme difficulty in matching the load (>30% reflected power), there is probably somothing wrong (like a conductive wafer bridging the anode to the cathode).

self bias should be 380V

When Process is Complete . . .
- RF power shuts off automatically
- Purge begins automatically
- Set Mode switch to open
- Turn off flow
- Set RF power pot to 0
- Wait for purge to finish
- Vent switch in
  - When vent is completed the lid will raise slightly
- Hoist lid, remove wafers
- Vent switch out
- Pump down
  - valve switch out
  - timers off
  - pump switch out
  - MPB
  - pump switch in
  - valve switch in 30 sec 6:1 BHF etch to clean up Strip photoresist
- Soak in acetone
- Plasmod at full power for 5 min
  > RIE of Si3N4 tends to leave a thin polymer film that must be removed before subsequent processing steps. The plasmod will help ensure complete removal of this film.

Airbridge Posts

Mask Level 5      DARKFIELD MASK

There are two mask levels involved in making an airbridge. This mask level covers the area that is to be spanned by the bridge, but has holes where the bridge comes down to first level metal. Also, a hole is left where an MIM capacitor top-plate will be.

The airbridge process described here is adapted from a Texas Instruments process and a Hughes process. Chris Storment (723-1209 in AEL 132) gave me the information from Hughes, while John Owens of Santa Clara University explained the Texas Instruments process.

Photoresist

Use S1400-33 process for 3um thick film

AZ 5903 and AZ4330 are also being investigated

AZ5903 could provide taller bridges (up to 1.2mils!) and better aspect rations (3:1), AZ4330 avertizes better aspect ratios (2:1) at similar thicknesses.

For best resolution use standard AZ5214 process
and hardbake 120C for 20min

Evaporate flash layer

This layer shorts all the airbridges together to provide a plating current path and also serves as a good surface on which to initiate plating. The layer must be thick enough to safely carry the plating current even over steps in the photoresist.

100A   Ti   sticking layer
2000A  Au   conductive layer
300A   Ti   sticking layer for subsequent photoresist.

The last layer also keeps the underlying gold surface clean until immediately prior to plating.

Procede to next level photoresist

Since it is impossible to do a solvent clean at this point, and any kind of an acid clean would be difficult (since the thin Ti layer etches in almost anything), it is advisable to put down the next layer of photoresist immediately after the wafer is removed from the vacuum chamber.

Airbridge Interconnects
Mask Level 6        DARKFIELD MASK

This is the second mask of the airbridge fabrication sequence. This mask defines the areas that will be up-plated with gold. Gold is plated to form airbridges and the top plates of MIM capacitors. This mask is a superset of the airbridge post mask. Anything feature defined by this mask but not on the previous mask will be suspended on top of the previous layer of photoresist.

Photoresist

Adhesion is critical in this step so be sure to use adhesion promoter

Be certain that there is no scum left. Scum can devestate this whole process.

Use AZ4330 process except . . .

softbake for 60min at 75C expose for 16 sec at 16.5mW/cm2 (265mJ/cm2)

develop in 1:1 H2O:AZ concentrate. watch!

DUV expose?

It would be desirable at this point to do a 2min DUV expose instead of a hardbake which makes the lower lever more difficult to remove. Unfortunately, we do not currently have this capability.

Open areas for electrical contact to flash layer

Apply one drop of acetone to the lower left and upper right corners of the wafer. Let each drop stand until it has dissolved some photoresist then DI rinse and N2 dry. Repeat until there is a nice clean clear area.

This is really not a good way to accomplish electrical contact. Putting these areas on the airbridge crossover mask would make more sense.

post-bake 30 min at 90C

AZ5903 and S1400-33 are also being investigated

Etch 300A Ti layer

Use 20:1 H2O:HF solution

Etch until 10sec after wafer turns gold (approx 1min)

DI rinse N2dry

Inspect under optical microscope.

The Au will not plate significantly on Ti and not at all on dirty Ti. Be sure Ti is completely cleared in regions to be plated.

Plate 1.8um Au or as much as you dare.

Due to the two layer photoresist structure it is difficult to resolve narrow spaces (think of the aspect ratio of the complete 2 layer feature). So beware. Currently, plating for 8min at 50mA is working well and yields about 1.8um in the finished structure.

2.3 um has been done with this process but 2.5um spaces are marginal.

Rinse off top layer of photoresist with acetone spray

Spraying instead of soaking prevents attacking the lower level resist. If things start lifting off now, it could get messy.

Rinse with isopropal and DI spray

Etch 2000A Au layer

Use KI2:I2:H2O gold etch in lab diluted in 10 parts H2O

RIE or Ion Milling would be superior ways to go if and when available.

Etch until 10 sec after Au clears.

This is very difficult to tell in this murky brown solution so check every 15 seconds by DI rinsing. It should take approximately 30 seconds.

DI rinse, N2 dry.

Etch 100A Ti layer

This is certainly not necessary, however, it makes removal of the lower level photoresist easier.

Use 20:1 H2O:HF solution

Etch approx 30 seconds

DI rinse N2 dry

Strip lower level resist

This is difficult using acetone alone. The warm stripper hasn't been tried but should work better.

Soak in acetone

Soak in warm photoresist stripper

Do not ultrasonic

APPENDIX SECTIONS

Wafer Cleaning

Be careful about boiling solvents. TCA and acetone both tend to boil in an unstable fashion, occasionally superheating and then expelling solvent all over the place at once. Use some source of nucleation for bubbles, like tweezers, stirring rod, etc.

In transferring the wafer between solvents, make sure that the surface remains wet at all times. In the final step, DI water rinse & nitrogen dry, the water should be blown off as a sheet, leaving no drops to dry, leaving a residue.

2 minutes in boiling TCA
2 minutes in Acetone at room temperature, or slightly warmed
> Acetone is suspected to be weakly carcinogenic, so DON'T boil the stuff. If you do boil it, keep it under the hood.

2 minutes in boiling Isopropyl
DI water rinse
N2 dry
dehydration bake if photoresist or polyimide follows
    120°C for 30min.

Mask Cleaning
...is essential for high-resolution, high-yield lithography if you plan to use your mask more than once!

Soak in Shipley photoresist remover
    very gentle wet scrubbing with Q-tip
DI rinse
Nitrogen dry
    use air knife and be very careful not to drop the mask
Store waste in gallon jug for later disposal
> Remover 150 is an organic acid and needs to be stored for proper disposal.
> Remover 1165 is a mixture of solvents that can be disposed of down the solven drain.

Standard AZ5214e Photoresist (etch masks, etc.)

Surface Preparation
> This section assumes that nothing has been done previously to the wafer. If processing has already occured then it may be necessary to skip some cleaning steps so that the wafer is not damaged Solvent Clean (see above)
    Dehydration bake 120 °C 30 minutes
    Let wafer cool 5-10 minutes
Photoresist application
    Spin on adhesion promoter 40 sec 3000 rpm
        adhesion promoter should be filtered
        approx .75 cc per 2" wafer
    Spin AZ 5214e for 40 seconds at 3000 rpm
        approx 1.5 cc per 2" wafer
Soft Bake
> Think about thermal inertia ! If you bake pieces in a closed petri dish, or in an open dish with large thermal mass, then bake times will have to be increased. Best to use open vessels.
> Times given are for baking small pieces on an open petri dish on the top shelf of a Blue-M oven.

Bake in convection oven for 25 minutes at 90°C
    Turn on Aligner so source can warm up
    Let wafers cool (approx. 5 minutes)
Exposure
    Log into logbook and follow directions for aligner Expose 50 mJ with uv400 optics (3 sec at 16.5mW/cm2)
or expose 192 mJ with uv300 optics
> Most properties of AZ5214e are better with uv400 optics. The one advantage of 300nm optics is the possibility of submicron resolution.

Development
  Develop 90 seconds in 1:1 solution AZ developer:H2O (watch)
  use 2-beaker development with last 15 seconds in "clean" developer
  Rinse in DI for 2 minutes
  Nitrogen dry
  Pour developer down the drain Postbake
  30min at 140C is necessary for the harshest applications
  20min at 120C is recommended for most applications
  20min at 90C is adequate if edge rounding is unacceptable Gentle Plasma Descum, if necessary Inspect wafers under optical microscope

S1400-33
> This resist spins on in teh neighborhood of 2.8um. Aspect ratios are no better than 1:1. Stability in PH 9.5 is reasonable with only a 30min 90C bake.

Surface Preparation
> This section assumes that nothing has been done previously to the wafer. If processing has already occured then it may be necessary to skip some cleaning steps so that the wafer is not damaged Solvent Clean (see above)
  Dehydration bake 120 °C 30 minutes
  Let wafer cool 5-10 minutes Photoresist application
  Spin on adhesion promoter 40 sec 3000 rpm
    adhesion promoter should be filtered
    approx .75 cc per 2" wafer
  Spin S1400-33 for 40 seconds at 3000 rpm
    approx 1.5 cc per 2" wafer Soft Bake
> If you bake pieces in a closed petri dish, or in an open dish with large thermal mass, then bake times will have to be increased. Best to use open vessels.
> Times given are for baking small pieces on an open petri dish on the top shelf of a Blue-M oven.

Bake in convection oven for 25 minutes at 90°C
  Turn on Aligner so source can warm up
  Let wafers cool (approx. 5 minutes)

Exposure
  Log into logbook and follow directions for aligner
  Expose 230 mJ with uv400 optics (14 sec at 16.5mW/cm2)

Development
  Develop 50 seconds in 1:1 solution AZ developer:H2O (watch)

use 2-beaker development with last 15 seconds in "clean" developer

Rinse in DI for 2 minutes

Nitrogen dry

Pour developer down the drain

Postbake

30min at 140C is necessary for the harshest applications

20min at 120C is recommended for most applications

20min at 90C is adequate if edge rounding is unacceptable.

Gentle Plasma Descum, if necessary 2 min or less on full power in O2 plasma using the plasmod Inspect wafers under optical microscope

AZ4330

AZ4330 is a highly transparent photoresist with advertised aspect ratios of better than 2:1. It spins on in the neighborhood of 3.8um. This resist is one used bu Hughes in their airbridge process. It is advertised to be stable in alkaline plating baths.

Surface Preparation

This section assumes that nothing has been done previously to the wafer. If processing has already occured then it may be necessary to skip some cleaning steps so that the wafer is not damaged Solvent Clean (see above)

Dehydration bake 120 °C 30 minutes

Let wafer cool 5-10 minutes

Photoresist application

Spin on adhesion promoter 40 sec 3000 rpm adhesion promoter should be filtered approx 0.75 cc per 2" wafer Spin AZ4330 for 40 seconds at 3000 rpm approx 1.5 cc per 2" wafer Soft Bake If you bake pieces in a closed petri dish, or in an open dish with large thermal mass, then bake times will have to be increased. Best to use open vessels.

Times given are for baking small pieces on an open petri dish on the top shelf of a Blue-M oven.

Bake in convection oven for 60 minutes at 90°C

There is a trade off here between soft bake time and contrast. The 60 min bake is supposed to give the best contrast. A shorter bake time would be acceptable but would reduce contrast.

Turn on Aligner so source can warm up

Let wafers cool (approx. 5 minutes)

Exposure

Log into logbook and follow directions for aligner

Expose 260 mJ/cm2 with uv400 optics (16 sec at 16.5mW/cm2)

Development

Develop 130 seconds in 1:1 solution AZ developer:H2O (watch)

develop time not yet established use 2-beaker development with last 15 seconds in "clean"

developer
Rinse in DI for 2 minutes
Nitrogen dry
Pour developer down the drain
Postbake
30min at 140C is necessary for the harshest applications
20min at 120C is recommended for most applications
20min at 90C is adequate if edge rounding is unacceptable
Gentle Plasma Descum, if necessary
2 min or less on full power in O2 plasma using the plasmod
Inspect wafers under optical microscope

AZ5903 (Under Development)
Surface Preparation
This section assumes that nothing has been done previously to the wafer. If processing has already occured then it may be necessary to skip some cleaning steps so that the wafer is not damaged
Solvent Clean (see above)
Dehydration bake 120 °C 30 minutes
Let wafer cool 5-10 minutes
Photoresist application
Spin on adhesion promoter 40 sec 3000 rpm
adhesion promoter should be filtered
approx .75 cc per 2" wafer
Apply and Spread AZ5903 for 20 seconds at 100 rpm
This resist is too thick to use the usual in line filter.
approx 4cc per 2" wafer
Spin at 6000 rpm for 100 sec for 8um thickness
Edge bead removal?
Soft Bake
If you bake pieces in a closed petri dish, or in an open dish with large thermal mass, then bake times will have to be increased. Best to use open vessels.
Times given are for baking small pieces on an open petri dish on the top shelf of a Blue-M oven.
Thick resists will crack during exposure if not well baked
Bake in convection oven for 40 minutes at 90°C
Turn on Aligner so source can warm up
Let wafers cool (approx. 5 minutes)
Hold for >10 min but < 2hrs
Exposure
Log into logbook and follow directions for aligner
Expose 660 mJ with uv400 optics (40 sec at 16.5mW/cm2)
Development
Develop 120 seconds in 1:1 solution AZ developer:H2O (watch)
use 2-beaker development with last 15 seconds in "clean" developer
Rinse in DI for 2 minutes Nitrogen dry
Pour developer down the drain
Postbake
> Postbake should be within 5 to 10C of the softbake temp or the resist will flow significantly (at higher temperatures).
>
> 40min at 90C Gentle Plasma Descum, if necessary
> 2 min or less on full power in O2 plasma using the plasmod Inspect wafers under optical microscope

Liftoff Photoresist (Metallization)

Let's talk a little about liftoff lithography and lithography in general. A number of difficulties arose in making a Chlorobenzene liftoff process for the Suss alligner, and we learned a number of things in the process.

The idea in liftoff lithography is to generate resist with overhanging edges. Metal deposition from some point source (e.g. an electron-beam evaporator) will then result in a film which is discontinuous over resist edges. Dissolution of the resist in Acetone or resist thinner will then remove all metal over the resist, leaving only metal that was deposited on the semiconductor substrate. Overhanging edges are critical!!!

To attain such edges we do two things: we harden the surface of the resist with Chlorobenzene and we SOFTEN the underlying resist by incomplete softbaking. Ideally, resist will not develop in areas where it has not been exposed; all practical resists have some small development rate even if unexposed. By under-baking the resist during softbake, significant dissolved solvents and water will remain in the resist, increasing the unexposed development rate. Underbaking introduces problems, as development times are reduced and become sensitive to the exact bake conditions. In combination with a resist surface which has been in some way hardened, development will occur more rapidly in the depth of the resist than on the surface, generating an undercut edge profile. The edges of the resist then will have an overhanging lip, plus some recessed sidewall, whose slope may be vertical or either inward or outward.

The lip is generated by surface hardening with a Chlorobenzene soak. This process is neither high-resolution nor terribly reproducible; we simply are using it until a more sophisticated 2-resist process is developed. Chlorobenzene selectively removes lighter (low molecular weight) polymers from the resist, leaving a resist surface which then dissolves more slowly in developer. As longer soaks permit progressively deeper penetration of the Chlorobenzene solvent, the vertical thickness of the resist is a function of the soak time. Fifteen minutes gives a good thick lip (≈0.2 um) which doesn't seem to wilt under exposure to high temperatures during metal evaporation. Process reproducibility is also most likely improved with longer chlorobenzene soak times.

The slope of the recessed sidewall can be important. The ideal profile is a slight outward slope, so that the overhanging lip of the resist is directly above the bottom edge of the resist where it meets the substrate. This permits most accurate dimensional control and allows for accurate registration of recess etch and deposited metal in self-aligned gate processes. If the edge slope is severe, so that the bottom edge of the resist projects beyond the lip, then control of metallization feature size is lost. In severe cases, the slope can be so poor that a continuous metal film is deposited during evaporation, preventing liftoff.

Edge slope is well corellated to resist actinic absorbance and to exposure time. To understand this better, we really need to look at the contrast curves of the resist; these are much like the contrast curves of photographic film. Ideal photoresist would dissolve away (develop) at zero rate at all exposure energies below some threshold energy Eth, and etch away at a high rate for exposures above Eth. Practical resist shows fast development at exposures above Eth, but the exposure rate then decreases at some finite rate for exposures below this- the faster the decrease in exposure rate the higher the resist's CONTRAST (gamma). Now, photoresist is not perfectly transparent. The transparency increases as the resist is exposed, and the difference between the unexposed and exposed absorbtion coefficients is called the actinic absorbance. If the attenuation is significant, the exposure at the bottom of the photoresist will be lower than at the top. If the exposure at the top of the resist is near Eth, then the exposure at the bottom of the resist will be below Eth, decreasing the development rate at the bottom and thus generating sloping edges. The solution is then to increase the exposure slightly. Clearly, resists with lower attenuation show less of an edgewall slope problem.

For this reason, lithography with 1400 or 1300 series resists (Shipley or Hoescht) is not advisable on the Karl Suss aligner operating at 300 nm. The attenuation coefficient of these resists at 300 nm is about 1.5 nepers/micron, and the resulting sidewalls are sloped at about 45 degrees! Hoescht resist AZ 5200-series has much better transparency at 300 nm, and permits near-vertical sidewalls at 300 nm exposure. Sidewall slope is adjusted by varying the exposure time. AZ-5200 resists are generally just more modern than the 1400 and 1300 series, and have a number of other improved properties, including improved dimensional control during hardbake.

Surface Preparation
    Solvent Clean (see above)
        Trichlorethane
        Acetone
        Isopropyl
        Rinse in cool DI water
        Nitrogen blow dry
    Dehydration bake 120 °C for 30 minutes
    Let wafer cool 5-10 minutes Photoresist application
    Spin adhesion promoter for 40 seconds at 3000 rpm
    Spin AZ 5214e photoresist for 40 seconds at 3000 rpm
    spin at less than 3000 rpm for thickest metals
    Clean and turn off Spinner Soft Bake
    Think about thermal inertia ! If you bake pieces in a closed petri dish, or in an open dish with large thermal mass, then bake times will have to be increased. Best to use open vessels.
    Times given are for baking small pieces on an open petri dish on the top shelf of a Blue-M oven.
    Bake in convection oven for 25 minutes at 75 °C
    Turn on Aligner so source can warm up
    Let wafers cool (approx. 10 minutes)

Exposure
    Log into and follow direction on the aligner
    align if necessary ( possible?)

Expose for 50 mJ (3 sec at 16.5mW/cm2)

Chlorobenzene
- Soak the wafer for 15 minutes in undiluted chlorobenzene
  - Chlorobenzene should be used in a covered beaker at the rear of the laminar flow hood to prevent fumes from entering the room.
- Nitrogen dry the wafers
- Pour chlorobenzene in special container
  - When full, the waste chlorobenzene can be disposed of in the solvent disposal drum in the Ginzton Lab north courtyard.

Development
- Develop 1.5 to 1.75 minutes in 1:1 AZ solution developer:H2O (watch)
  - We (MR & CM) have decided that the best method here is to watch the development. When large (visible) areas on the wafer have cleared, transfer to the "clean" beaker for the final 15 seconds.
- two-beaker method: last 15-30 seconds in "clean" beaker of developer
- Rinse in DI water for 2 minutes
- Nitrogen dry
- Pour developer down the drain Pre-evaporation clean
- Just before placing wafers in evaporator do a 60 second buffered oxide etch in a teflon beaker. BOE contains HF, so be sure to dispose of it in the waste HF mixtures container.

Evaporate desired metal(s)

Liftoff Metal
- Resist temptation to attack the metal. The best lift off tool is time and patience. Let the wafer sit at the bottom of the beaker for an hour or so.
- Soak in acetone for at least 60 min
  - One method that has worked is to give Lance or Tom (whoever is doing the depositon) a beaker and instruct him to put the wafer in a covered beaker of acetone when he is finished. You can then go in at your leasure, or even the next day to do the liftoff.
- Swirl the acetone around to lift the metal.
- If the metal refuses to lift, blast it with the acetone bottle.
- Tom's spray gun can blast off unrelenting metal pieces
  - Since acetone attacks the seals of the spray gun, use water in the resevoir and periodically soak the wafer in acetone.
- If absolutely necessary, Ultrasonic clean
  - Ultrasonic for as little time as possible
    - excess use can crack GaAs wafers and "unstick" deposited metals
    - Watch for liftoff of particular feature(s), then remove
  - Attenuate power by:
    - using large amounts of H2O in Ultrasonic unit
    - using Teflon beaker to reduce chatter
    - dipping beaker only partially in the bath
- Acetone, isopropyl, and DI water rinse
- N2 dry wafers
- Inspect in optical microscope

Gold Plating

Since plating is a selective, additive procedure, it is potentially much more economical than subtractive methods such as sputtering and evaporation which coat the entire inside of the vacuum chamber.

However, plating tends to be a lower resolution process than other methods because it follow the contours of the resist which is defining the region to be plated. This means the line width is determined not by the width of the resist space at the bottom near the substrate, but by the width of the space at whatever level the gold is plated.

Put teflon base in the 3 liter beaker.

Use 1/2 gallon of Sel-Rex Neutronix 309 gold plating solution.

The solution can be reused until the gold is depleted unless it is contaminated. Unused solution is clear.

Insert anode into base.

Heat solution to 50C

Use Lance's hot plate with the stir-bar moter. Put heat on 7 until the solution reaches 40C then reduce to 3.5 to maintain temperature at 50C. Watch to make sure the solution does not boil. It may be necessary to back off on the heat a little during the initial warm-up.

Plating at an improper temperature can result in gold being REMOVED from the wafer.

Put wafer on holder and insert into base.

The two gold spring clips should make good electrical contact to the cleared gold areas on the wafer. The wafer should be flat in the 5mil recess in the holder.

Hook ground to wafer contact wire, plus to anode wire.

Plate, agitating vigorously

The specified current density is 4 amps per square foot. (4.3 mA/cm2). However, you must account for the fact that you are plating a good deal of wire also. The current will most likely be experimentally determined. 50mA for a 2" wafer is a good place to start.

Plating too fast will result in dark, ugly deposits.

Turn stir bar speed up until just before a vortex is formed (about 7 on Lances hot plate).

Remove wafer holder. DI rinse, N2 dry wafer.

Filter plating solution as it is poured back into container.

Rinse the plating apparatus

APPENDIX C

[1]
$$Z_0(V) = \sqrt{L/C_T(V)}$$

Various parameters of interest:

$Z_0(V)$ = the small-signal characteristic impedance of the transmission line as a function of voltage, V, $L = Z_1 \tau$ = inductance of the interconnecting transmission lines, per section, $C_T(V)$ = the total capacitance per section as a function of voltage, $V$ = the instantaneous voltage at any particular point on the line, $\tau = (P/c_0)\sqrt{(1+\epsilon_r)/2}$ = the electrical spacing of the Schottky varactor diodes in time units, $P$ = the electrical spacing of the Schottky varactor diodes in distance units, $\epsilon_r$ = dielectric constant of gallium arsenide $\approx 12.5$, $c_0$ = speed of light in vacuum, $Z_1$ = characteristic impedance of the interconnecting transmission line.

[2] $$C_T(V) = [C_j(V) + C_L] = \text{total capacitance per section,}$$

where,

[3] $C_L = \tau/Z_1$ = the capacitance of the interconnecting transmission lines, per section, and,

[4] $C_j(V) = C_{j0}/\sqrt{1-V/\phi}$ = the transition capacitance of a step junction diode with a junction potential $\phi$, where in the preferred embodiment, $C_{j0} = 50\text{fF}$ at $160\mu\text{m}$ spacings along a $90\Omega$ coplanar waveguide transmission line, and $\phi \simeq 0.8$ volts.

[5] $$T(V) = \sqrt{LC_T(V)}$$

where, $T(V)$ = the group delay of the transmission line.

[6] $$\omega_{per} \simeq 2/\sqrt{L(C_{ls} + C_L)} = 2/[Z_{ls}(C_{ls} + C_l)],$$

where $C_{ls}$ is defined by equation (10) and $Z_{ls}$ is defined by equation (12).

[7] $$\omega_{rc} = 1/r_s C_j(V) \approx 1/r_s C_{ls},$$

where, $r_s$ = the varactor series resistance $\approx 10\Omega$.

[8] $$T_{f,out} \simeq \max \begin{cases} T_{f,min}, \\ T_{f,in} - n[T(V_h) - T(V_l)]. \end{cases}$$

where, $n$ = the number of sections in the transmission line, and $V_h$ and $V_l$ are the high-level voltage and low-level voltage of the input signal.

[9] $$Z_1 C_{ls} \omega_{per} \sin(\omega_{per}\tau)/2 = \cos(\omega_{per}\tau) + 1,$$

where,

[10]
$$C_{l_s} = \frac{[Q(V_h) - Q(V_l)]}{(V_h - V_l)},$$

where in the preferred embodiment, $C_{l_s} \gg C_l$.

[11]
$$V_{out}(t) = V_{in}[t - nT(V)],$$

where $T(V)$ is given by equation (5) above.

[12]
$$Z_{l_s} = \sqrt{\frac{L}{C_{l_s} + C_l}}$$

$Z_{l_s} \simeq 50\Omega$ for a 0 to -2 volt step-function input with the structure of Figures 2 and 4 on a 90$\Omega$ coplanar waveguide loaded by 45 diodes with $10\mu m \times 10\mu m$ junction area on an N- layer doped to $3 \times 10^{16}/cm^3$ at $160\mu m$ spacings.

APPENDIX D

Process for Fabrication of Nonlinear Transmission Lines

This process is for fabrication a nonlinear transmission line pulse compressor; starting material for the nonlinear transmission line is a .6 μm N- layer (3X10^16) above a a .8 μm N + layer (3X10^18) on a [100] semi-insulating GaAs substrate.

Self-Aligned Ohmic Contacts

In this step the N- layer is first etched to expose the N+ layer. Ohmic metal is then evaporated and lifted off using the same photoresist which served as an etch mask. The alignment marks are also on this mask layer.

Photoresist

Use AZ 5214 and follow standard photoresist procedure (attached)

resist thickness: 1.55-1.65 μm

Wet Etch

Use NH40H:H2O2:H2O (14 : 2.4 : 200) in room-temperature H2O bath

Etch to 0.75 μm depth

Evaporate Metal

Etch wafer for 60 seconds in 6:1 BOE immediatly prior to evap.

Evaporate

500 Angstroms Eutectic (88%-12%)Au-Ge
100 Angstroms Ni
2000 Angstroms Au

Lift Off

Soak wafers 30 minin cool acetone spray with acetone to remove metal

·If necessary, Ultrasonic clean to remove metal residue

Acetone, isopropyl, and DI water rinse
N2 dry wafers
Alloy metal at 450°C for 12 seconds in Rapid Thermal Annealer

Proton Implant

Proton implantion is used to electrically isolate N+ regions and to eliminate conductive layers under transmission lines. Protons are implanted into the wafer at high energies, generating ≈3 defect per proton & making the substrate semi-insulating. A thick Au layer defined by liftoff above a polyimide removal layer forms the implant mask.

Wafer clean as per below
Apply Ciba-Geigy polyimide
    Spin polyimide adhesion promoter at 5000 rpm for 30 sec
    Spin Probimide® 286 at 5000 rpm for 30 sec
    Bake polyimide
        Bake at 100°C for 30 min
        Ramp to 180°C, Hold for 15 min at 180 +/- 5°C
        Ramp to 240°C, Hold for 15 min at 240+/- 5°C
        Let oven cool down to 150°C before removing wafers
Photoresist
    Follow the "Liftoff photoresist" proceedures
        Increase exposure time by about 10% to compensate
        for the low reflectivity of polyimide.
Evaporate Metal
    100A Ti
    1.6um Au
Lift Off Metal
    Soak wafers 30 min in cool acetone
    spray with acetone to remove metal
    If necessary, ultrasonic clean to remove metal residue
    Acetone, isopropyl, and DI water rinse
    N2 dry wafers
Etch Polyimide
    Etch in polyimide Etcher, Ciba-Geigy QZ 3296, for 150 sec
    Rinse in Etch Rinse, Ciba-Geigy QZ 3297, for 30 sec
    Rinse in DI H2O for at least 30 sec
    N2 dry
Implant Hydrogen, 7E14/cm^2 at both 110 and 160 keV
Strip polyimide and gold
    Soak in hot polyimide thinner (Ciba-Geigy) to remove gold and polyimide
    Use ultrasonic bath as necessary to aid in removal
Ash polyimide residue in oxygen plasma asher
    Ash at low - medium power

Schottky and Interconnect Metal

This mask step replaces both the Schottky and interconnect metal steps. We put down thick (Ti/Pt/Au) metal on the transmission line pattern. Only where the substrate has been masked from proton isolation will a Schottky be formed- at all other points we get metal on insulating dielectric.

Photoresist
    Follow "Liftoff Photolithography directions but:
    ...increase exposure ~20% to fully expose ohmic etch holes
    ... and develop in dark Evaporate
    Etch wafer in BOE for 60 secs immediately prior to evaporation
    Evaporate
        1000 A Ti
        750 A Pt
        1.4 µm Au Lift Off
    Soak wafers 30 min in cool acetone
    spray with acetone to remove metal
    If necessary, ultrasonic clean to remove metal residue
    Acetone, isopropyl, and DI water rinse
    N2 dry wafers Processing: Appendix Sections Wafer Cleaning
    2 minutes in boiling Trichloroethane
    2 minutes in hot Acetone
    2 minutes in boiling Isopropyl
    DI water rinse
    Nitrogen dry
    dehydration bake 120°C 30 minutes Standard Photoresist
    Surface Preparation
        Solvent Clean (see above)
        Dehydration bake 120 °C 30 minutes
        Let wafer cool 5-10 minutes
    Photoresist application
        Spin AZ 5214e for 40 seconds at 3000 rpm
    Soft bake in convection oven for 25 minutes at 90°C
        Times given are for baking small pieces on an open petri dish on the top shelf of a Blue-M oven.
    Expose 13 sec @14.8 mW/cm^2 on the Suss aligner for AZ 5214e
        This formulation is for 300 nm exposure on the Suss through a BOROSILICATE mask.
    Development
        Develop 50 seconds in 1:1 solution AZ developer: H2O
            Development may have to be done in the dark if two distinct metallizations are on the substrate (battery effect).
        use 2-beaker development with last 15 seconds in "clean" developer
        Rinse in DI for 2 minutes
        Nitrogen dry Postbake 90°C, 30 minutes

Liftoff Photoresist (Metallization)

Clean Wafer (see above)

Spin AZ 5214e photoresist for 40 seconds at 3000 rpm

Soft bake in convection oven for 25 minutes at 75 °C
> Time given is for baking small pieces on an open petri dish on the top shelf of a Blue-M oven.

Align and expose
> For Suss at 310 nm exposure: 13 Seconds @ 14.8 mW/cm^2 through borosilicate mask.

Chlorobenzene
- Soak for 15 minutes in undiluted chlorobenzene
- Nitrogen dry

Development
- Develop 1.5 to 1.75 minutes in 1:1 AZ solution developer: H2O (watch)
  > We (MR & CM) have decided that the best method here is to watch the development. When large (visible) areas on the wafer have cleared, transfer to the "clean" beaker for the final 15 seconds.
- two-beaker method: last 15-30 seconds in "clean" beaker of developer
- Rinse in DI water for 2 minutes
- Nitrogen dry Pre-evaporation clean
> Just before placing wafers in evaporator, do a 60 second buffered oxide etch in a teflon beaker.

Evaporate desired metal(s)

Lift Off
- Soak wafers 30 min in cool acetone
- spray with acetone to remove metal
- If necessary, ultrasonic clean to remove metal residue
- Acetone, isopropyl, and DI water rinse
- N2 dry wafers

What is claimed is:

1. A directional sampler for generating first and second intermediate frequency output signals indicative, respectively, of the magnitude for each of an incident wave travelling toward a device under test and a reflected wave travelling away from said device under test, comprising:

first sampling means for sampling a periodic incident wave having a frequency and propagating toward said device under test, said sampling being performed at a sampling rate which is different from but close enough to the frequency of said periodic incident wave such that said sampling occurs at a different phase in each cycle in which sampling occurs but, with each sampling point being close enough in phase to the phase of the last sampling point such that an entire cycle of the incident wave is sampled and the shape of each cycle of said periodic incident wave can be reproduced at a lower frequency than the frequency of said incident wave, and for generating a first intermediate frequency output signal proportional to the voltage of said periodic incident wave being sampled; and directional floating sampling bridge means for sampling any periodic reflected wave propagating away from said device under test, and including a resistive directional bridge having at least two nodes neither of which is connected to ground potential and between which the periodic reflected wave appears for sampling by said directional floating sampling bridge means, said sampling of said periodic reflected wave comprising sampling of the voltage difference between said at least two nodes and occurring at a sampling rate which is different from the frequency of said periodic reflected wave but which is close enough to the frequency of said periodic reflected wave so as to create a plurality of samples of the voltages at said at least two nodes as to be able to reproduce the shape of said periodic reflected wave appearing between said at least two nodes, and for generating from said samples said second intermediate frequency output signal of lower frequency than the frequency of said periodic reflected wave, and having a voltage proportional to the voltage of said reflected wave.

2. The apparatus of claim 1 wherein said first sampling means comprises:

a signal input port having first and second input terminals between which appears said periodic incident wave to be sampled;

a local oscillator strobe pulse input port having third and fourth input terminals, for receiving local oscillator strobe pulses;

a first series diode capacitor means for selectively storing charge having an anode of said diode coupled to said second input terminal so as to be coupled to said periodic incident wave and having a cathode of said diode coupled to a first terminal of said capacitor, a second terminal of said capacitor being coupled to said third input terminal of said local oscillator strobe pulse input port; and a second series diode capacitor means for selectively storing charge having a cathode of a second diode coupled to said second input terminal of said signal input port and to the anode of said diode in said first series diode/capacitor combination and having an anode coupled to a first terminal of a second capacitor, a second terminal of said second capacitor being coupled to said fourth input terminal of said local oscillator strobe pulse input port.

3. The apparatus of claim 2 wherein said series connected diode/capacitor means define nodes at the connections between the diode and capacitor of the means and further comprising first and second resistors coupled, respectively, to the nodes between the diodes and capacitors of said first and second series diode/capacitor means.

4. The apparatus of claim 1 wherein said directional floating sampling bridge means comprises:

a local oscillator strobe pulse generator input port having first and second input terminals;

first, second, third and fourth resistors connected in series between said first and second input terminals and having resistances defined by a predetermined relationship, the junctions between said resistors defining two sampling nodes between said first and second resistors and between said thrid and fourth resistors, respectively, and a center node beween said second and third resistors, said first and fourth resistors coupled to a ground plane, said ground plane and said center node together comprising an input port for said periodic incident wave;

a first series connected diode/capacitor means for selectively storing charge having said capacitor coupled to the sampling node between said first and second resistors and having a cathode of said diode coupled to said device under test and to said center node between said second and third resistor through a fifth resistor having a value which is selected according to a predetermined relationship with the values of said first, second, third and fourth resistors;

a second series connected diode/capacitor means for selectively storing charge having an anode of said diode coupled to a cathode of said diode in siad first series connected diode/capacitgor combination and to said device under test, and having said capacitor coupled to sampling node between said third and fourth resistors.

5. The apparatus of claim 4 wherein said series connected diode/capacitor means define nodes at the connections between the diode and capacitor of the means, and further comprising sixth and seventh resistors coupled, respectively, to said nodes between said diodes and capacitors of said first and second diode/capacitor means.

6. The apparatus of claim 4 wherein the values of said first and fourth resistors are equal and the values of said second and thrid resistors are equal, and wherein the product of said fourth resistor times the value of said fifth resistor equals the product of said second resistor times the input impedance of said device under test when and only when the input impedance of the device under test matches the output impedance of whatever source supplied said periodic incident wave propagating toward said device under test.

7. A directional sampling bridge for coupling a periodic incident wave to a device under test and for generating a first IF output signal indicative of the voltage of said incident wave and a second IF output signal indicative of any reflected wave from the device under test, comprising:

a sampling signal input port for receiving said periodic incident wave;

a strobe pulse input port for receiving local oscillators strobe pulses at a frequency which is near but less than the frequency of said periodic incident wave;

means coupled to said strobe pulse input port and to said sampled signal input port for charging first and second circuit nodes to a voltage at the time of occurrence of each strobe pulse which is proportional to respectively, half the peak voltage of said strobe pulses plus the voltage of said periodic incident wave at the time of occurrence of said strobe pulses, and the voltage of said periodic incident wave at the time of occurrence of said strobe pulse minus half the peak voltage of said strobe pulses, and for summing the voltages at said first and second nodes to generate said first IF output signal;

means coupled to said strobe pulse input port, said device under test and said sampled signal input port for charging third and fourth circuit nodes to voltages which are proportional to, respectively, $$\frac{V_{sp}}{2} + V1 - V2$$

and $$\frac{-V_{sp}}{2} + V1 - V2$$

where $V_{sp}$ = the peak amplitude of each strobe pulse;

V1−V2 = the voltage between two nodes of a resistive directional bridge, neither of said nodes being connected to ground potential, which is proportional to or related to the amplitude of any periodic reflected wave from the device under test as exists at each of the times of occurrence of the strobe pulses.

8. A floating sampling apparatus for sampling a repetitive signal using the voltage difference between first and second nodes in a circuit, neitehr of which is grounded and for generating an output signal proportional thereto at a lower frequency than the frequency of said repetitive signal, comprising:

a local oscillator input port for receiving local oscillator strobe pulses having a frequency near but lss than the frequency of said repetitive signal being sampled;

a resistive directional bridge comprised of first, second and third resistors and a fourth impedance equal to the input impedance of a device under test, said input impedance and said resistors arranged into a Wheatstone bridge defining said first and second nodes, neither of which is connected to ground and third and fourth nodes defining an input port for receiving said repetivive signal being sampled, said third node eefined by the junction between said first and second resistors, said fourth node defined by the junction of said third resistor and said input impedance and connected to ground potential and coupled to said local oscillator input port through a local oscillator termination impedance, said first node being defined by the junction of said first resistor and said input impedance, and second second node defined by the junction of said third and second resistors;

charge storage means coupled to said second node and coupled to be influenced by said strobe pulses through said third resistor, and having first and second output nodes, for storing charge so as to raise the voltage of said first and second output nodes, respectively, to two different voltage levels which are related to the peak voltage level of each strobe pulse and the instantaneous voltage level of said repetitive signal being sampled at the time of occurrence of said said strobe pulse, said different voltage levesl, when summed, give a voltage which is proportional to the voltage difference between said first and second nodes of said Wheatstone bridge at the time of occurrence of each said strobe pulse; and diode mans selectively coupling said first and second output nodes of said charge storage means to said first node of said Wheatstone bridge, for gating current selectively into said charge storage means during said strobe pulses, the amplitude of said current being related to the instantaneous amplitude of said repetitive signal being sampled at the time of occurrence of each said strobe pulse so as to cause predetermined charge buildup at said first and second output nodes of said charge storage means so as to cause said two different voltages at said first and second output nodes of said charge storage means.

9. The apparatus of claim 8 wherein the values of the resistors of said Wheatstone bridge are selected such that the product of the values of said first and fourth resistors is equal to the product of the values of the third resistor and the input impedance of said device under test.

10. A method of measuring a voltage difference between two nodes in a circuit neither of which is ground by equivalent time sampling without the use of a balun, comprising:

applying a repetitive signal to be sampled to a device under test through said circuit;

applying local oscillator strobe pulses through first and second selective gating devices to first and second capacitors which are coupled to said circuit such that the voltage to which said capacitors charge is influenced by said repetitive signal to be sampled, and selectively gating the charging current into said capacitors in a manner so as to cause said first capacitor to charge to a voltage $$\frac{V_{sp}}{2} + V1 - V2$$

and to cause said second capacitor to charge to a voltage $$\frac{-V_{sp}}{2} + V1 - V2$$

where $V_{sp}$ = the peak amplitude of each strobe pulse;

V1−V2 = the voltage between said two nodes neither of which is ground as exists at each of the times of occurrence of the strobe pulses; and summing the voltages to which said first and second capacitors have charged to generate an output signal proportional to V1−V2.

* * * * *